United States Patent
Ausserlechner et al.

(10) Patent No.: US 6,795,347 B2
(45) Date of Patent: Sep. 21, 2004

(54) MEMORY CIRCUIT

(75) Inventors: Udo Ausserlechner, Villach (AT); Dirk Hammerschmidt, Fuernitz (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/407,736

(22) Filed: Apr. 4, 2003

(65) Prior Publication Data

US 2003/0189865 A1 Oct. 9, 2003

(30) Foreign Application Priority Data

Apr. 4, 2002 (DE) .......................................... 102 14 898

(51) Int. Cl.[7] .............................................. G11C 16/04
(52) U.S. Cl. ............................. 365/185.28; 365/185.29; 365/185.18
(58) Field of Search ....................... 365/185.28, 185.29, 365/185.18, 149, 185.01

(56) References Cited

U.S. PATENT DOCUMENTS 4,596,938 A     6/1986  Cartwright, Jr.
6,611,463 B1  * 8/2003  Mehta et al. ............ 365/185.28

OTHER PUBLICATIONS

Lubin Gee et al.: "An Enhanced 16K E²PROM", *IEEE Journal of Solid–State Circuits*. vol. SC–17, No. 5, Oct. 1982, pp. 828–832.

Mike McConnell et al.: "An Experimental 4–Mb Flash EEPROM with Sensor Erase", *IEEE Journal of Solid–State Circuits*, vol. 26, No. 4, Apr. 1991, pp. 484–491.

Giebel, B.: "An 8K EEPROM Using the SIMOS Storage Cell", IEEE Journal of Solid–State Circuits, vol. SC–15, No. 3, Jun. 1980, p. 311.

* cited by examiner

*Primary Examiner*—David Lam
(74) *Attorney, Agent, or Firm*—Laurence A. Greenberg; Werner H. Stemer; Ralph E. Locher

(57) ABSTRACT

The non-volatile memory cell of a memory circuit includes at least one enhancement pMOS transistor having a floating gate. It further includes an enhancement nMOS transistor having a floating gate insulated from the floating gate of the pMOS transistor. A control input is capacitively coupled to the floating gate of the pMOS transistor and to the floating gate of the nMOS transistor. The pMOS transistor and the nMOS transistor are connected by a connection point, the connection point being connected to an output of the memory cell. The pMOS transistor is additionally connected to a first terminal of the memory cell, while the nMOS transistor is additionally connected to a second terminal of the memory cell. A supply voltage is appliable to the memory cell via the first and second terminals.

39 Claims, 26 Drawing Sheets

|    | Write     | Erase       | Read        |
|----|-----------|-------------|-------------|
| HI | 0V        | Vpc         | Vsp         |
| LO | 0V        | Vpc         | Vsn         |
| LW | Vnc       | Vpc         | Ur+Vsn      |
| LR | 0V        | 0V          | Ur+Vsn      |
| LP | LW-Vgs,p  | LW-Vgs,p    | LW-Vgs,p    |
| LN | Vgs,n     | Vgs,n       | Vgs,n       |
| LI | 0V        | HI-V'gs,p   | HI-V'gs,p   |

FIG. 8

FIG. 23A
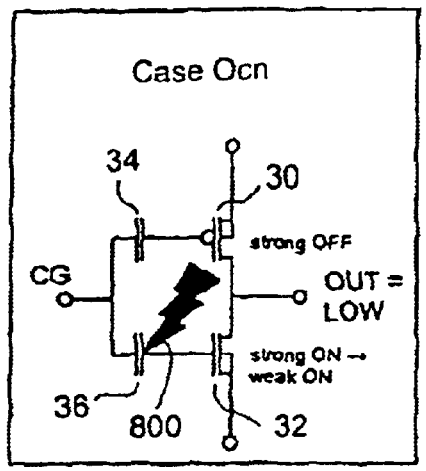
FIG. 23B
FIG. 23C
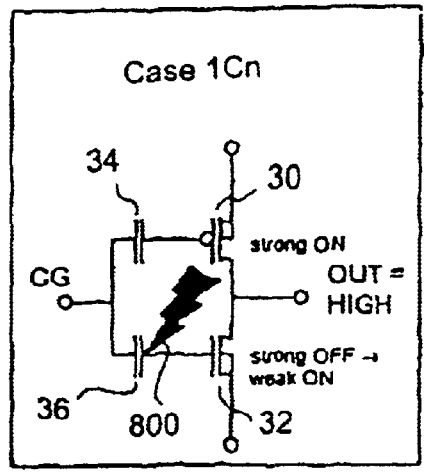
FIG. 23D
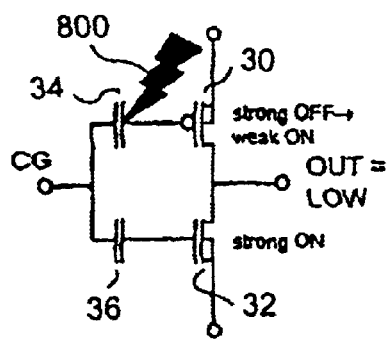
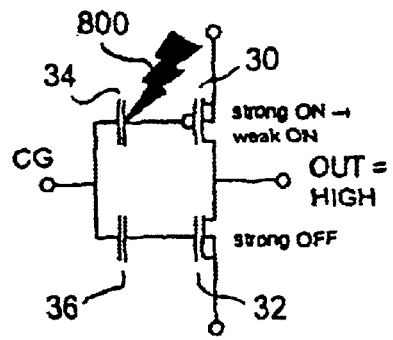

FIG. 24A
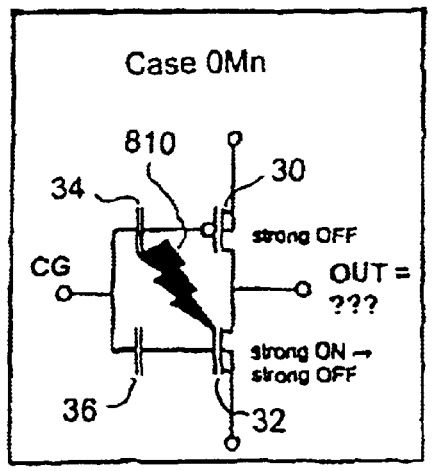
FIG. 24B
FIG. 24C
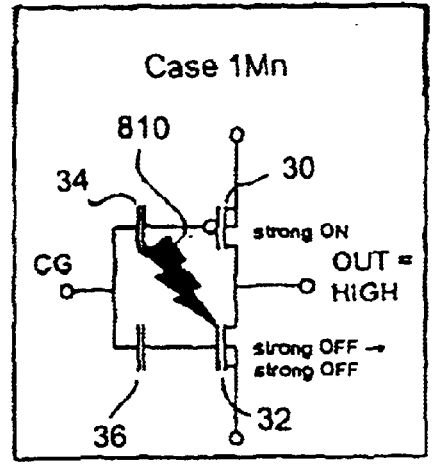
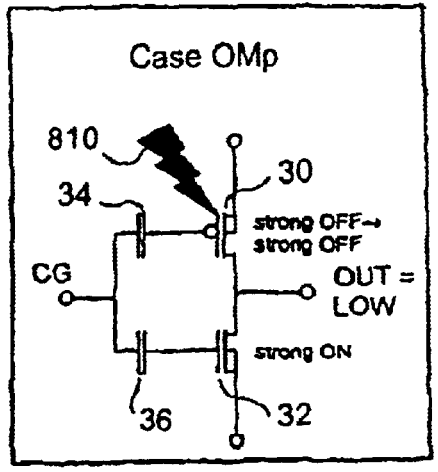
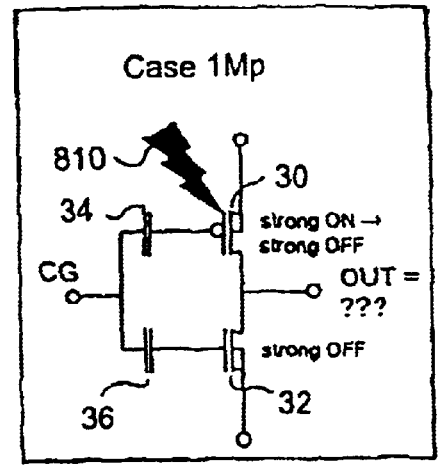
FIG. 24D

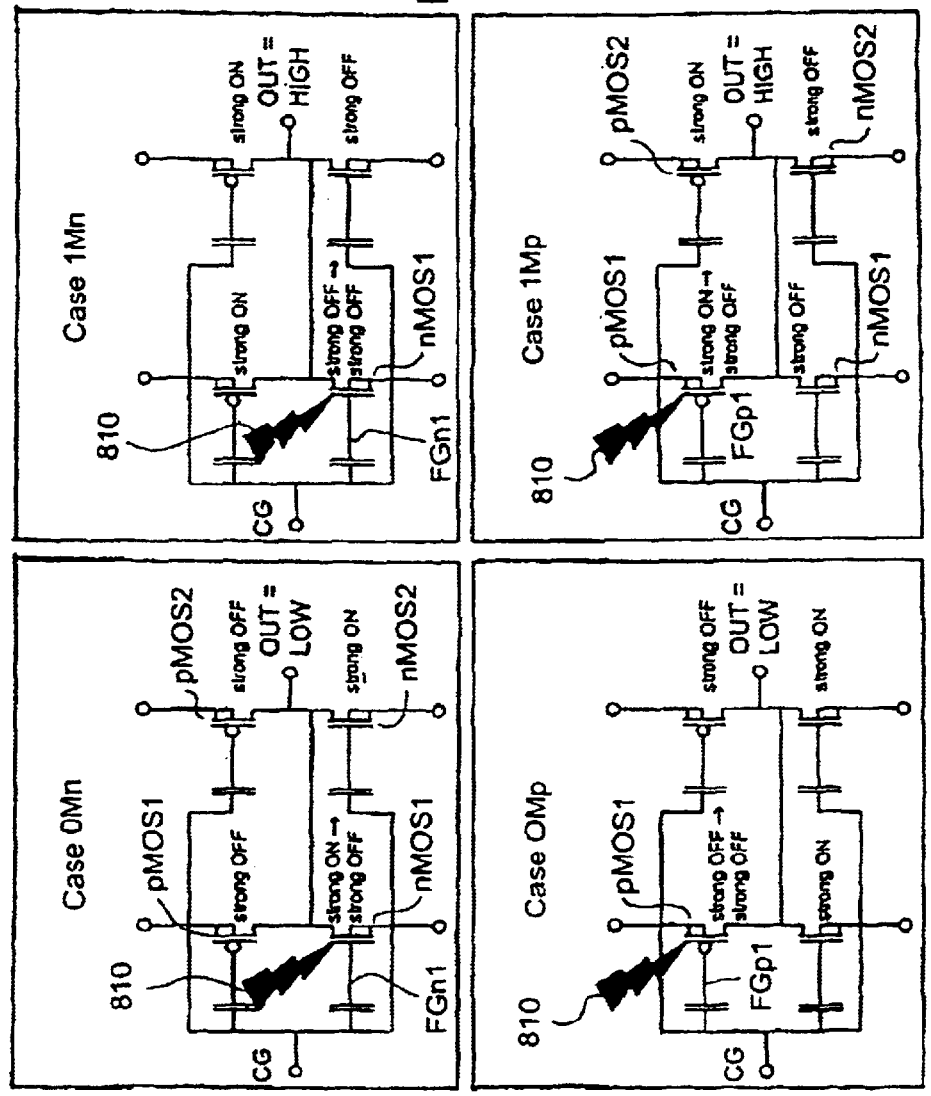

MEMORY CIRCUIT

BACKGROUND OF THE INVENTION

1. Field of the Invention

The present invention relates to a memory circuit and in particular to a memory circuit having at least one non-volatile memory cell and usually a plurality of non-volatile memory cells. In addition, the present invention particularly relates to memory circuits having EEPROM memory cells (EEPROM=electrically erasable and programmable read only memories) and to the set-up of a modified redundant EEPROM memory cell. Additionally, the invention relates to how the logic state (HIGH or LOW) of a memory cell can be read out so that it can be fed to another signal processing.

2. Description of Prior Art

EEPROM memory cells for very large-scale integration applications, as are, for example, to be found in portable computers, are, for example, known from "An enhanced 16K EEPROM", Lubin Gee, Pearl Cheng, Yogendra Bobra and Rustam Mehta, IEEE J. Sol. Stat. Circ., volume SC-17, no. 5, October 1982, pages 828 to 832 and from "An Experimental 4-Mb Flash EEPROM with Sector Erase", Mike McConnell and others, IEEE J. Sol. Stat. Circ., volume 26, no.4, April 1991, pages 484–491.

The set-up of memory cells is shown in FIGS. 1a and 1b. The memory cell shown in FIG. 1a includes an nMOS transistor 10 comprising a floating gate FG and a control gate CG. The control gate CG is connected to an input 12 of the memory cell. The drain of the nMOS transistor 10 is connected to an output 14 of the memory cell and to the drain of a pMOS transistor 16 serving for impressing a small reading voltage to the drain of the nMOS transistor 10. The source of the nMOS transistor 10 is connected to a reference potential of, for example, 0 V, i.e. ground. The source of the pMOS transistor 16 is connected to a supply voltage Vsup so that a supply voltage of the EEPROM memory cell shown in FIG. 1a is applied between the source of the pMOS transistor 16 and the source of the nMOS transistor 10.

The nMOS-EEPROM cell illustrated in FIG. 1a is such a cell as is typically used in VLSI technology (VLSI=very large-scale integration). Thus, above the channel of the nMOS transistor, there is a gate stack of a gate dielectric, a floating gate FG which is insulated from all the other parts of the circuit, another dielectric and the control gate CG. The gate dielectric directly above the channel is mostly formed as thin as possible while that between the floating gate FG and the control gate CG is thicker.

In FIG. 1b, an alternative EEPROM memory cell is shown in which a standard nMOS transistor 18 is used, the gate of which is connected to the input 12 of the memory cell via a capacitor 20. The gate electrode of the standard nMOS transistor 18 is thus insulated from all the other parts of the circuit by the capacitor 20 so that it represents a floating gate FG.

The fundamental functioning of a conventional EEPROM memory cell, as has been described above referring to FIGS. 1a and 1b, will be discussed subsequently. As has been explained, the gate of the nMOS transistor, directly above the channel, is insulated from all the other parts of the circuit, wherein the gate oxide, i.e. the dielectric between the floating gate FG and the channel, is, at least partly, formed thinner than usual. The floating gate is connected to a control gate via either a thicker dielectric (FIG. 1a) or via a capacitor (FIG. 1b), this set-up being electrically equivalent to an nMOS transistor, the gate FG of which is controlled via a capacity.

When the control gate CG is switched to a high voltage, usually between 10 V and 20 V, for a duration of about 10 ms, depending on the thickness of the gate oxide used, there is a voltage division according to the capacitive voltage divider by the capacities between CG and FG as well as between FG and the channel of the nMOS transistor. Since the gate oxide is thinner than the oxide between CG and FG, the capacity between FG and the channel of the nMOS transistor is larger than the capacity between CG and FG so that the bulk of the voltage difference applied between CG and the channel drops at the section CG-FG. The entire voltage must be large enough in order for the field strength in the gate oxide to be sufficient to let charge carriers tunnel from the channel through the gate oxide to the floating gate FG. This process is called Fowler-Nordheim tunneling. Thus a very small current flows. When the high voltage is finally switched off, the charge carriers are trapped at the floating gate FG since it is electrically insulated from its surroundings.

The charge carriers are thus at the floating gate and produce a voltage $\Delta U$ at the coupling-in capacitor CG-FG so that the nMOS transistor is controlled by a gate voltage $U(CG)-\Delta U$, $U(CG)$ being the voltage applied across the input 12 to the control gate of the memory cell.

When $U(CG)$ is, for example, selected while reading out the memory cell such that an unprogrammed cell with $\Delta U=0$ V is just operated at the limit between conducting and blocking, the sign of $\Delta U$ decides whether the nMOS transistor blocks or conducts. Depending on the definition used, $\Delta U>0$ V is, for example, true for a programmed cell, while $\Delta U<0$ V is true for an erased cell. In order to read out the respective state from the memory cell, a small reading current is impressed via the pMOS transistor 16 into the drain of the nMOS transistor 10 and 18, respectively. A programmed nMOS transistor blocks so that its drain takes the logic state HIGH corresponding to the voltage Vsup. An erased nMOS transistor conducts so that its drain is pulled to LOW, about 0 V.

For reading out the cells of FIG. 1a or 1b, a reading current in the order of magnitude of 1 $\mu$A is fed via the pMOS transistor 16 into the drain of the nMOS transistor 10 and 18, respectively, while a threshold voltage of the nMOS transistor is applied to the control gate CG. If the nMOS transistor is conductive, it will pull the output 14 to LOW. If the nMOS transistor blocks, the output will be HIGH. This reading process consumes power when the nMOS transistor 10 and 18, respectively, is conductive.

The capacitor 20 of the memory cell illustrated in FIG. 1b can, for example, be formed by a small poly-poly capacity with a capacitance of about 20 fF.

The reliability of well-known EEPROM memories, as are, for example, described above, can be increased by special coding methods. A simple possibility, for example, is to double-store each bit using two cells and to check in normal operation whether the two variations stored match. When they differ, an error must have occurred. For this method, the control gates of the two bits can be controlled by a common control circuit, which saves area, the two bits must, however, be read out separately and compared to each other, whereby the area consumption for the reading out circuit doubles.

In reality, it often occurs that a programmed "1" can become a "0" but the probability of a "0" becoming a "1" may be significantly lower. Thus, it is better to store a bit as a "1" and a "0". The bit is recognized as being correct when the two pertaining memory cells are precisely programmed opposite to each other. Such an arrangement, however, requires even more chip area since, in this case, even the control circuit for the control gates of the two memory cells has to be formed separately. Thus also the area demand for storing a bit doubles compared to a simple storage with one cell per bit. Thus the increased reliability is only achieved by a serious chip area consumption.

In case a memory cell loses charge, it is at first not possible to reconstruct the original memory contents. In order to achieve this complicated methods have to be applied, as are developed in the theory for "forward error coding". In this case, however, in addition to the information to be stored, redundant information from which an error case can be recognized and partly also corrected independently is stored as well. Thus these methods also require additional chip area since they need additional memory cells plus a control circuit for them.

Alternative non-volatile memory cells in which a common floating gate for a pMOS transistor and an nMOS transistor, which can be set up using a conventional CMOS technology, is used, are described in EP 0756328 A2 and in U.S. Pat. No. 6,028,789. In these non-volatile memory cells having a common floating gate, during reading operations, at least one of the two transistors will always block so that the power consumption is reduced.

The inventive memory circuit having a non-volatile memory cell, in contrast to the most often discussed very large scale integration variations, is to aim at those applications in which only about 100 bits are to be stored on an application-specific integrated circuit (ASIC). An exemplary application of this kind can, for example, apply to the adjustment or calibration of intelligent sensors in the module or in the element in which they are used. For such applications there are a number of specific features which are listed in the following enumeration:

1. A relatively small number of bits per ASIC is required, i.e. in the order of magnitude of 100.

2. The EEPROM memory cell is to be set up with possibly no changes in the process flow, i.e. without additional processing steps and masks, only with the standard elements available.

3. If a memory cell looses charge due to a defect, this may not lead to an incorrect memory contents, i.e. simple defects must be corrected automatically.

4. In the case of an emerging charge loss, the circuit should recognize this reliably and as early as possible in order to be able to react to this for example by notifying the user of the necessity of an urgent service.

5. The area demand of a memory cell is determined by the actual memory element only to a minor degree. The area demand of the control circuit which has to switch the high programming and erasing voltages to the respective cell is predominant.

6. When switching on the supply voltage to the ASIC, the entire memory contents must be readable at once. The matrix structure used in very large-scale integration EEPROMs is especially unsuitable for this for, in this case, the memory has to be read out per line, column or page.

7. In normal operation the memory should consume as little static power as possible.

8. The memory cell should be as reliable as possible, especially when the ASIC is employed in automobile technology or other high-security applications. What follows is, for example, that only a static, but no dynamic, logic is allowed to be used. As another consequence this leads to the concept that an EEPROM cell is, for example, read out by a continuous reading signal. This is in contrast to dynamic methods in which a pulsed reading signal is used. In the continuous case, the EEPROM cell does not need to be as fast as possible so that the inventive usage of slower pMOS transistors can be justified.

9. The circuit-technological overhead must be kept as low as possible, in particular in ASICs having a small chip area.

SUMMARY OF THE INVENTION

It is the object of the present invention to provide a memory circuit having a non-volatile memory cell allowing setting up a high-reliability memory.

This object is achieved by a memory circuit having a non-volatile memory cell, the non-volatile memory cell comprising:

an enhancement pMOS transistor having a floating gate;

an enhancement nMOS transistor having a floating gate insulated from the floating gate of the pMOS transistor;

a control input capacitively coupled to the floating gate of the pMOS transistor and to the floating gate of the nMOS transistor, the pMOS transistor and the nMOS transistor being connected by a connection point and the connection point being connected to an output of the memory cell, the pMOS transistor additionally being connected to a first terminal of the memory cell and the nMOS transistor being further connected to a second terminal of the memory cell, wherein a supply voltage can be applied to the memory cell via the first and second terminals.

The pMOS transistor and the nMOS transistor are preferably formed in CMOS technology, the drains of the pMOS transistor and of the nMOS transistor being connected to each other and to an output of the memory cell, the source of the pMOS transistor being connected to the first terminal and the source of the nMOS transistor being connected to the second terminal. In general, in the non-volatile memory cell of the inventive memory circuit, one source/drain region of each of the pMOS transistor and the nMOS transistor are connected to each other in order to implement a series connection of the two transistors, the connecting point being connected to the output of the memory cell, while the respective non-connected source/drain region of the nMOS transistor and the pMOS transistor is connected to a respective supply voltage terminal.

The inventive non-volatile memory cell thus, apart from a conventional nMOS memory cell, comprises an additional pMOS memory cell having, like the nMOS memory cell, its own floating gate. When, due to a local defect, the charge at the floating gate of the nMOS memory cell is lost, the charge at the floating gate of the pMOS memory cell remains. Thus the inventive non-volatile memory cell can be referred to as redundant since a bit in the form of charges is stored at two different nodes of the network. Since the pMOS transistor and the nMOS transistor are connected to each other similarly to what is the case in a CMOS inverter, the inventive non-volatile memory cell can be referred to as a CMOS-EEPROM.

The inventive memory circuit can further comprise control means for applying suitable writing voltages, erasing voltages and reading voltages to the input of the memory cell. In addition, means can be provided in preferred embodiments in order to detect a cross current between the first and second terminals of the non-volatile memory chip or to judge the charge state of the floating gates of the transistors.

Developments of the inventive memory circuit include advantageous embodiments for an MOS transistor arrangement for applying and removing charges to the floating gates of the non-volatile memory cell. In addition, developments of the inventive memory cell include a current watch circuit for monitoring a current between the first and second terminals when the supply voltage is applied between them, while at the same time the readiness for operation of the memory cell is maintained.

In a development of the inventive memory cell, it is coupled to a CMOS inverter in such a way that the output of the memory cell is connected to the input of the CMOS inverter, while the input of the memory cell is connected to the output of the CMOS inverter. In such a connection the memory cell can be read out without applying a reading voltage to the control input.

Further redundancy can be added to the inventive memory circuit by providing the non-volatile memory cell with a second enhancement pMOS transistor having a floating gate and being connected in parallel to the other enhancement pMOS transistor having a floating gate and by providing the non-volatile memory cell with a second enhancement nMOS transistor having a floating gate and being connected in parallel to the other self-blockage nMOS transistor.

Such and further developments of the present invention are stated in the dependent claims.

BRIEF DESCRIPTION OF THE DRAWINGS

Preferred embodiments of the present invention will be detailed subsequently referring to the appended drawings, in which:

FIG. 8 is a table showing the signals applying during different modes of operation;

FIG. 18 is a circuit diagram of an embodiment of the memory cell shown in FIG. 17a;

FIGS. 23a to 23d and 24a to 24d are circuit diagrams for illustrating error mechanisms in a non-volatile memory cell of FIG. 2a; and FIGS. 25a to 25d and FIGS. 26a to 26d are circuit diagrams for illustrating error mechanisms in a non-volatile memory cell as shown in FIG. 22.

DESCRIPTION OF PREFERRED EMBODIMENTS OF THE INVENTION

Figure 2A:
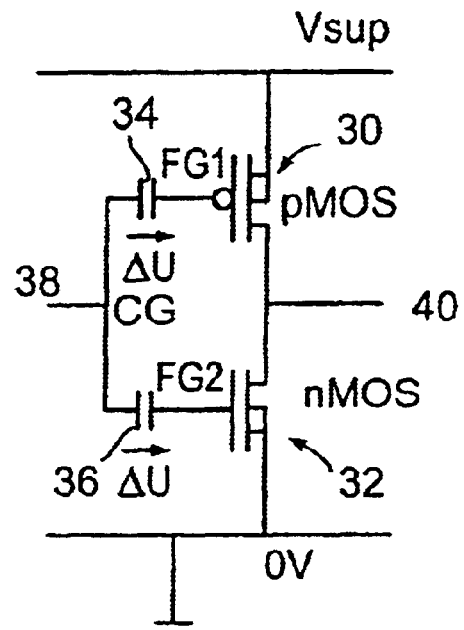
FIG. 2a is a circuit diagram of an inventive memory cell.

An embodiment of an inventive memory circuit is shown in FIG. 2a in the form of a non-volatile memory cell.

The memory cell includes a pMOS transistor 30 and an nMOS transistor 32. The pMOS transistor 30 includes a floating gate FG1 and the nMOS transistor includes a floating gate FG2 insulated electrically from FG1. The floating gates FG1 and FG2 are capacitively connected to a control terminal CG which can be referred to as a control gate. This is shown in FIG. 2a by capacitors 34 and 36. The control terminal CG is an input 38 of the memory cell.

The pMOS transistor 30 and the nMOS transistor 32 are connected to each other at their drains and to an output 40 of the memory cell. The source of the pMOS transistor is connected to a voltage supply potential Vsup, while the source of the nMOS transistor 32 is at a reference potential, usually 0 V.

It is to be explained at this point that, for this disclosure, enhancement field effect transistors (field effect transistors which are Off if the control voltage at the gate, i.e. the control voltage between gate and bulk, is zero, i.e. enhancement field effect transistors) are meant whenever pMOS transistors and nMOS transistors are mentioned, except when the opposite is explicitly mentioned.

The pMOS transistor 30 and the nMOS transistor 32, in one inventive memory cell each comprising a floating gate, can be set up technologically in different ways. On the one hand, they can each comprise a gate stack as is used in conventional EEPROM memory cells in which the gate oxide of the nMOS transistor and of the pMOS transistor is formed as thin as possible, about 5 to 10 nm, a floating gate being applied above the gate oxide, above which a further dielectric and above that the control gate are provided. On the other hand, the inventive memory cells can be realized without an additional process step in a standard CMOS process or a standard BiCMOS process by using standard nMOS transistors and standard pMOS transistors. As is shown in FIG. 2a, the gate electrodes of such standard nMOS transistors are connected to an electrode of a coupling-in capacitor (34 and 36, respectively, in FIG. 2a). The remaining electrodes of the coupling-in capacitors are connected to one another and are referred to as the control gate CG. This serves as an input of the memory cell.

Figure 20A:
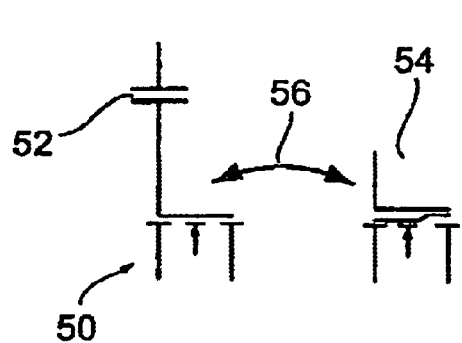
FIGS. 20a and 20b are illustrations for explaining inventively usable nMOS transistors and pMOS transistors, respectively, having floating gates.

For illustrating the replaceability of the two technologies mentioned above, reference is made to FIGS. 20a and 20b. FIG. 20a, on the one hand, shows a standard nMOS transistor 50, the gate of which is connected to a coupling-in capacitor 52, and, on the other hand, an nMOS transistor 54 having an integrated floating gate, as is used in conventional EEPROM memory cells. The replaceability of the technologies is illustrated by the arrow 56.

Figure 20B:
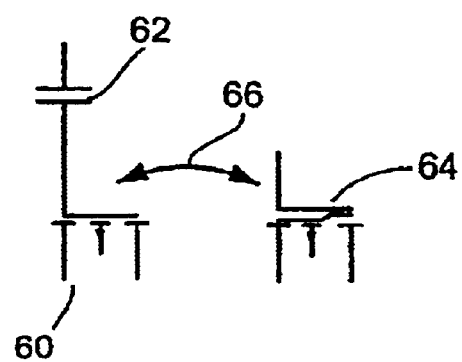

In the same way FIG. 20b shows a standard pMOS transistor 60, the gate of which is connected to a coupling-in capacitor 62 in the way described. In addition, FIG. 20b shows a pMOS transistor 64 having an integrated floating gate. The replaceability of the two technologies is again indicated by an arrow 66.

Back to FIG. 2a, the functioning of the inventive memory cell will now be discussed. As has been explained above, the drain of the nMOS transistor 32 is connected to the drain of the pMOS transistor 30 and at the same time to the output 40 of the memory cell. In addition, the control gates of the nMOS transistor and the pMOS transistor are connected to each other, i.e., in the capacitor version shown in FIG. 2a, the respective capacitor electrodes, on the sides of the control input, of the capacitors 34 and 36, and form the control gate CG representing the input 38 of the memory cell. The entire memory cell thus only has one input to which in the case of programming or writing a high positive programming voltage, in the case of erasing a high negative erasing voltage and in the case of normal operation a reading voltage is applied. Thus, by the pMOS transistor, the expenditure in controlling does not increase compared to an individual nMOS transistor. By a high positive programming voltage, a voltage is meant, which is positive compared to drain, source and bulk of the two MOS transistors. By a negative erasing voltage, a voltage is meant, which is negative compared to drain, source and bulk of the two MOS transistors. It is thus to be noted that an erasing can also be performed by applying a voltage of 0 V to the input 38, while a positive voltage of for example +20 V is applied to drain, source and bulk of the MOS transistors. In this case, no negative voltage would be applied compared to the substrate, while nevertheless the input of the memory cell would be biased negatively compared to drain, source and bulk.

It is to be noted at this point that the terms "programmed" and "erased" are selected arbitrarily and can be replaced by each other, i.e. alternatively a memory cell could be referred to as being erased after having applied a high positive voltage to its control gate and could also refer to it as being programmed after a high negative voltage has been applied to its control gate. Put differently, the decision which state of a memory cell is referred as programmed and erased, respectively, only depends on the definition.

When the inventive memory cell is programmed according to the above definition, the floating gates FG1 and FG2 take a potential lower by ΔU than the control gate CG. For reading out the memory cell, a voltage Uinv is applied to its input 38, the voltage being defined as follows. When the charges at the two floating gates FG1 and FG2 have disappeared, the memory cell acts like an inverter.

Figure 2B:
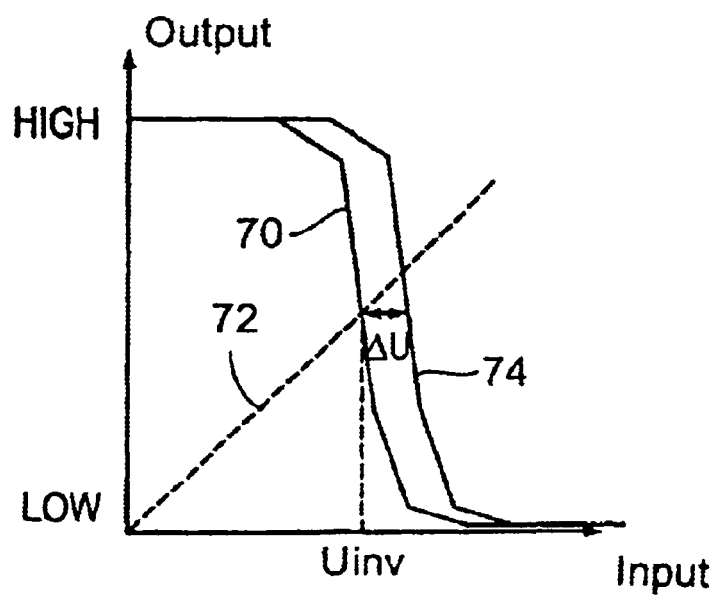
FIG. 2b is a voltage diagram for illustrating the inventive memory cells.

The pertaining transfer characteristic curve 70 is shown in FIG. 2b, the voltage at the output 40 being plotted on the y-axis, while the voltage at the input 38 is plotted on the x-axis. The intersection point of this transfer characteristic curve with the straight line 72 being defined by the input voltage equaling the output voltage defines the ideal reading voltage Uinv. When this reading voltage Uinv is applied to the control gate CG of the inverter without a charge on the floating gates, the output of it cannot decide between the high logic state HIGH and the low logic state LOW, but gets stuck in the middle. As soon as a voltage ΔU is, however, stored on both floating gates FG1 and FG2, the characteristic curve is displaced. In FIG. 2b a transfer characteristic curve 74 displaced to the right by ΔU is shown resulting when the memory cell is programmed, i.e. after a high positive voltage has been applied to the input. In such a case, electrons tunnel through the gate oxide of the nMOS transistor and of the pMOS transistor to the floating gates FG1 and FG2 and are stored there as a negative net charge. As a consequence, the floating gates FG1 and FG2 are at a lower potential than the control gate CG. When, for reading out the cell, the reading voltage Uinv is applied to the control gate CG, the nMOS transistor blocks while the pMOS transistor is conductive. At the output there is thus a positive voltage, i.e. it takes the high logic state HIGH. As can be seen, a relatively small voltage difference ΔU is sufficient to displace the operating point from the steeply dropping part of the transfer characteristic line to the digitally desired levels HIGH or LOW.

When, on the other hand, positive charges are stored on the floating gates by applying a corresponding erasing voltage, the floating gates FG1 and FG2 take a potential which is higher by ΔU than the control gate CG. Thus the transfer characteristic curve of the inverter is displaced to the left. In this case, the pMOS transistor 30 blocks, while the nMOS transistor 32 conducts. The output 40 of the memory cell is thus pulled to LOW.

It is obvious from the above explanation that it is always only one of the two transistors to conduct, while one of them blocks in any case, so that no cross current is flowing from the source of the pMOS transistor to the source of the nMOS transistor, between which the supply voltage Vsup is applied. Thus the inventive memory cell provides a defined output signal without consuming static power.

Figure 3:
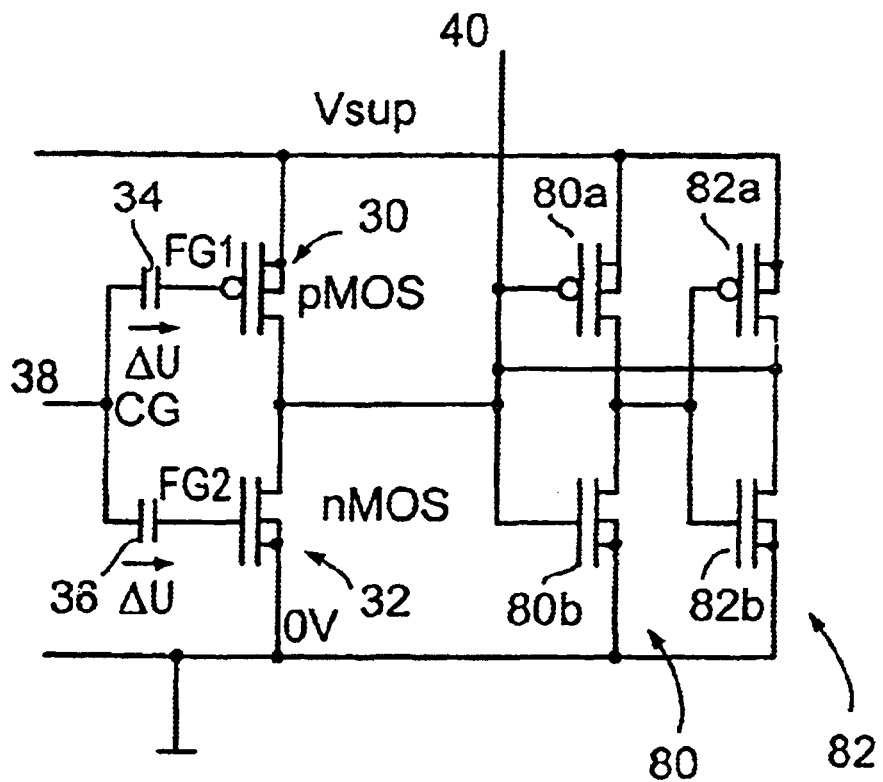
FIG. 3 is a circuit diagram of an alternative embodiment of an inventive memory cell.

As has already been explained, the transfer characteristic curve 70 is very steep in the vicinity of the input voltage Uinv so that small voltage differences ΔU are sufficient to set a well-defined level, LOW or HIGH, at the output 40. If the steepness of the characteristic curve in this region is to be increased, this can be obtained by means of a positive feedback. An embodiment for such a positive feedback using two CMOS inverters 80 and 82 having respective pMOS transistors 80a and 82a and nMOS transistors 80b and 82b, which are connected according to the illustration, is shown in FIG. 3. A hysteresis can be set by suitably dimensioning the two inverters 80 and 82 at the output.

It is an essential advantage of the inventive memory cell that the voltage Uinv can be defined precisely and thus the value at which a discharged memory cell is undefined between logically "0" and logically "1" is known. When this voltage, for reading out the memory, is applied to the control gates of all the cells of a line or an array from a plurality of cells, a very small programming or erasing charge quantity at the floating gate of the cell is sufficient in order to provoke a well-defined original state of the cell.

If the floating gate of that transistor which, due to the memory state of the memory cell, should block has lost charge, the associated transistor starts to conduct so that the cell draws a cross current from the source of the pMOS transistor 30 to the source of the nMOS transistor 32. A charge loss at one of the floating gates FG1, FG2 can thus be recognized by measuring this cross current. Preferred embodiments of a current relay for detecting such a cross current with the smallest possible charge loss will be explained later referring to FIGS. 10 to 16.

At first, it is only to be noted that a charge loss at a floating gate can be recognized most easily by measuring the cross current through all the memory cells, wherein the cross current has to disappear when all the memory cells work perfectly.

Regarding the effects of a charge loss, the case in which charges are lost from the floating gate of the transistor which is to conduct in the desired memory state and the case in which charges are lost from the floating gate of the transistor which is to block in the desired memory state are to be distinguished.

When charge is lost at the floating gate of that transistor which is to conduct, it will still conduct sufficiently since Uinv is sufficient to switch through either the pMOS transistor 30 or the nMOS transistor 32 in a well-conducting way, provided ΔU=0 V. In this error case, the memory cell will still provide the correct output value.

If charge is lost at the floating gate of that transistor which is to block, it starts to conduct. Thus both transistors, the pMOS transistor 30 and the nMOS transistor 32, conduct so that a cross current IDD>0 is flowing. When this cross current is monitored, this error case can be recognized, although even in this case a correct output signal is provided because the originally conductive transistor conducts considerably better than that transistor which has lost charge.

When either all the nMOS transistors of an inventive memory circuit having a row or an array of a plurality of memory cells are connected to a common ground line or when all the pMOS transistors are connected to a common supply line (Vsup), the current flow of this line can be detected and, without great expenditure, an indication is obtained whether one or several memory cells lose charge. In a defect-free case no static current may flow over this line since always either the nMOS transistor or the pMOS transistor blocks. Controlling means of an inventive memory circuit which can, for example, be integrated into a memory control is thus preferably designed to detect a current flow between the supply line and the ground line. Alternatively, the controlling means can be designed to detect a current flow between the sources of the two transistors of individual memory cells.

A further advantage of the inventive arrangement of a memory cell as a CMOS-EEPROM memory cell is that the ideal reading voltage Uinv is at roughly half the supply voltage Vsup of the CMOS part, i.e. of the digital part of the ASIC in which the memory circuit is realized. By suitably dimensioning the ratio $(W/L)_{pMOS}/(W/L)_{nMOS}$, Uinv can nominally even be set to exactly Vsup/2. Thus W indicates the channel width of a respective transistor, while L indicates the channel length of the respective transistor. If Uinv is exactly at Vsup/2, it is possible to apply, apart from Uinv, also Uinv±Vsup/2, i.e. 0 V or Vsup, to the control gates of all the memory cells. As long as the memory cells still have a sufficient charge at their floating gates, the logic level at the output will not change when such a voltage of 0 V or Vsup, respectively, is at the input. When, however, the charge at one or both floating gates of an inventive memory cell has almost entirely disappeared, it has another output value when 0 V or Vsup is applied to its control gate than is the case when Uinv is applied.

The control means of the inventive memory circuit is thus preferably also designed to apply a voltage of 0 V at the input and to detect the output level in a fist test mode and to apply a voltage of Vsup to the input and to detect the output level in a second test mode in order to judge, the charge state of the floating gates and thus of the memory cell based on the output levels detected and the level present at the output, when Uinv is present at the input.

Figure 1A:
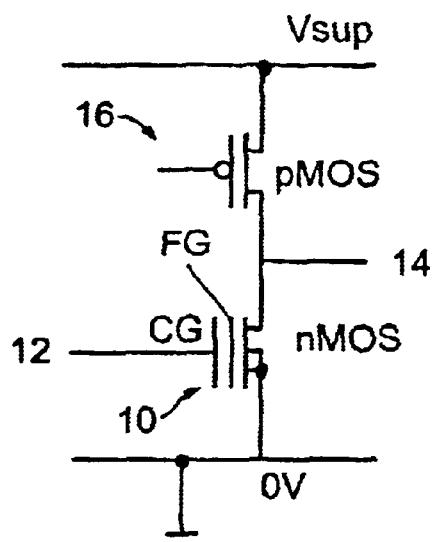
FIGS. 1a and 1b show circuit diagrams of well-known EEPROM memory cells.
Figure 1B:
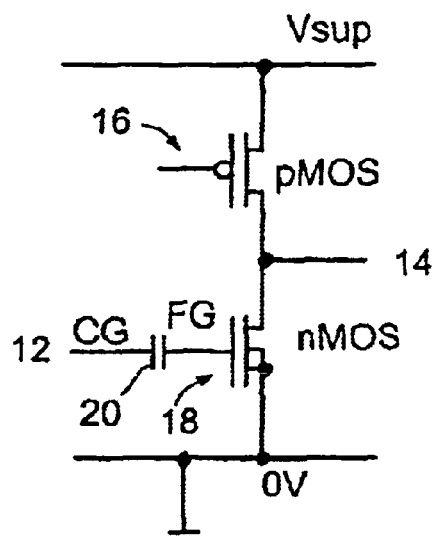

A change detected by the above test modes of the output level of the memory cell can be communicated to the ASIC so that it can detect an error in the memory cell which is just about to develop early. The error can be recognized especially early because a reading voltage which is maximally different from the ideal reading voltage Uinv and nevertheless symmetric can be applied. If the nominal reading voltage was, for example, at 0.3 Vsup, 0 V or Vsup, respectively, could be used for testing for a starting charge loss on the floating gate of a conventional EEPROM memory cell according to FIG. 1. Thus the distance between 0 V and 0.3×Vsup is smaller so that an error will only be recognized later.

In the above test modes, the charge state of both floating gates is all right when Ua(Ulow)=Ua(Uinv)=Ua(Uhigh) and at the same time the cross current IDD equals 0. Thus Ua(Ulow) is the voltage at the output when in a first test mode a voltage Ulow<Uinv is present at the input of the memory cell. Ua(Uinv) is the voltage present at the output of the cell when in the reading mode the voltage Uinv is present at the input. Finally Ua(Uhigh) is the voltage present at the output when in a second test mode a voltage Uhigh>Uinv is present at the input of the memory cell.

If the above-mentioned condition between the voltages at the output of the memory cell is not met, a charge loss has occurred at one or both floating gates of a memory cell. When the cross current is checked additionally, a charge loss at one of the two floating gates may be recognized even earlier. When, for example, the cell has been programmed, the nMOS transistor 32 blocks when Uinv is applied at the input 38, the pMOS transistor 30 is then a good conductor. When the floating gate FG2 loses charge, the nMOS transistor 32 will only start to conduct when the voltage Uhigh is applied to the input 38 and thus to the control gate CG. Nevertheless the nMOS transistor 32 may still block very well when Uinv is applied to the control gate CG. When the floating gate FG1 is still charged completely, the pMOS transistor 30, even with Uhigh at the control gate CG, conducts better than the nMOS transistor 32 so that the output voltage Ua(Uhigh)=HIGH. In this case the onsetting charge loss cannot be recognized by Ua. The beginning charge loss can, in such a case, be recognized by the fact that a cross current IDD starts to flow when Uhigh is applied to the control gate. If, however, the floating gate FG1 has also lost some of its charge, the pMOS transistor may block when Uhigh is present at the control gate CG so that there is no cross current but Ua(Uhigh)≠Ua(Uinv) applies.

More generally, the following cases must be distinguished when a charge from both floating gates of a CMOS memory cell is lost to an unequal degree.

Case 1: The transistor which is to block loses as high a charge that it becomes conductive in one of the two test modes. When the second transistor has lost as small a charge that it is still conductive in this test mode, the charge loss is recognized by IDD>0. When the second transistor, however, loses higher a charge, it becomes blocking in this test mode so that the output voltage changes and the charge loss can be recognized by this.

Case 2: the transistor which is to conduct loses as high a charge that it blocks in one of the two test modes. When the second transistor has only lost a small charge, it still blocks in this test mode. Neither in an increase in the cross current nor in a change in the output voltage, this charge loss is detected reliably. It is, however, not very disturbing for the operation since, even in a complete charge loss at the transistor which is to conduct, it is still sufficiently conductive with Uinv at the control gate CG. When, in this second case, the second transistor, however, loses more of its charge, it becomes conductive in this test mode so that the charge loss leads to a change in the output voltage in this test mode and is detected.

A further advantage of the inventive memory cell is that no pulsed signal has to be used for reading out but rather a continuous reading signal can usually be used.

Pulsed reading signals, voltages or currents are of special advantage when the resulting power consumption is to be reduced by switching on the reading current only for short periods, by sampling out the output voltage of the memory cell and by buffering the logic level in a volatile memory until the next sampling.

In order to keep the access times to the EEPROM memory cell small in a pulsed operation, nMOS transistors are preferably used instead of pMOS transistors. Since the inventive memory circuit, however, does not require a pulsed reading process, the speed requirement for the MOS transistors used can be dropped and it is thus possible to use even slow pMOS transistors.

It is also to be pointed out that, in contrast to the matrix structure used in VLSI circuits, in the preferred field of application of the inventive memory circuit, there is only a small capacitive load at the output. In contrast, the outputs of all the cells of a memory cell are parallel in matrix structures so that a large capacitive load results. Thus the inventive design in which the outputs of all the memory cells are coupled out from one another, are comparably fast, in spite of the usage of a pMOS transistor.

Diverging from the usage mentioned above of a continuous reading signal, it is to be noted that it may be of advantage in certain circumstances to implement a pulsed reading process nevertheless. It is, for example, conceivable to apply the potentials Uinv, Vsup and 0 V to the inventive memory cell only during short reading pulses. During the rest of the time all three terminals, i.e. the input and the two supply terminals (first and second terminals) of the memory cell can be set to the same potential, preferably 0 V, or these terminals are left floating. The advantage of this is that during this rest of the time, the gate oxide of the pMOS transistor and of the nMOS transistor is not loaded by the reading voltage, which is in fact relatively small, so that a longer lifetime as well as a higher reliability especially during a longer operation at an increased temperature, for example longer than 500 h at a temperature higher than 180° C., can be guaranteed.

The problem just mentioned of the gate oxide loading by the reading process can also be reduced in such a way that Vsup is made as small as possible. Thus, it has to be considered that the following must apply: Vsup≧|Vthp|+Vthn when a possible charge loss is to be recognized by means of detecting an increased cross current. Thus Vthp is the threshold voltage of the pMOS transistor, which is negative in depletion MOSFETs, while Vthn is the threshold voltage of the nMOS transistor. For Vsup=|Vthp|+Vthn, Uinv=Vthn has to be selected so that Uinv cannot be larger than Vsup/2, if |Vthp|~Vthn. When a programming charge is lost, that transistor which has been blocking at first, i.e. is to block, starts to conduct so that a cross current across the two transistors flows from Vsup towards 0 V. In practice it is, however, better to select Vsup to be sufficiently larger than |Vthp|+Vthn so that in disturbances on the Vsup line the value |Vthp|+Vthn is not exceeded.

The space requirement of an inventive CMOS-EEPROM memory cell is only a little larger than that of a conventional nMOS memory cell (see FIGS. 1a and 1b), especially in applications which are considered for the inventive memory cells, in which each individual memory cell requires its own controlling transistors and each individual of these controlling transistors requires more space than the nMOS-EEPROM transistor or the pMOS-EEPROM transistor, respectively.

It is important for high-security systems that the memory content is available immediately after switching on the supply voltage. It is also necessary that the entire memory contents regenerates as fast as possible after a strong disturbing impulse. Such a disturbing impulse can be coupled in on one of the supply lines or output lines of the integrated circuit or can have an effect on the integrated circuit in the form of disturbing radiation. For this reason it is not allowed in such high-security applications that such a memory is taken over into a volatile memory, such as, for example, a register bank, line by line, column by column or page by page, as is usual in VLSI elements. If this register bank is set back for a short period by a supply voltage collapse, for example by a micro-break, it takes several reading cycles until the important data, such as, for example, calibration data, of the integrated circuit is available again. For this reason it is essential in the high-security systems that each bit receives individual controlling transistors for programming/erasing and for reading. In VLSI systems, this expenditure can be minimized essentially by providing individual controlling electronics for an entire line, column or page of an EEPROM memory.

According to the invention, at least the redundancy introduced for increasing the reliability of the EEPROM does not require its own controlling transistors. In the inventive CMOS-EEPROM memory cell this redundancy lies in using a pMOS memory transistor and an nMOS memory transistor per bit, wherein both can be operated by a common controlling electronics since an identical voltage is applied to them when both programming and erasing.

The inventive memory circuit preferably includes additional means for monitoring the collective power consumption of all the memory cells of a memory cell line or a memory cell array, respectively. As long as the power consumption is very small, the memory is programmed in a permissible way.

A function-impeding charge loss on the floating gate of the originally blocking transistor leads to a cross current through the respectively cell, the means for monitoring the power consumption of all the memory cells detecting this illegally high cross current and outputting a warning signal. In addition to the leakage power consumption detection, two test modes are preferably implemented, in which two further voltages different from the reading voltage are applied to the control gates of the memory cells, namely Ulow and Uhigh. The output signals obtained when applying the voltages Uinv, Ulow and Uhigh are compared to one another wherein only in the case that all three output voltages are identical and the power consumption of the memory cells during the two test modes is sufficiently small, the memory is programmed reliably. Thus a perfect programming can be checked and a relevant charge loss in a cell can be recognized during operation as early as possible.

Control Circuit

In the following, preferred embodiments of control circuits for a memory cell described above will be described. Apart from the application for the memory cells described above, the control circuits described can also be used for other memory cells, for example conventional nMOS-EEPROM cells. In particular, such a control circuit will be dealt with in the following, which connects a high programming voltage through to an EEPROM memory cell, the peculiarity of the control circuit described being that it can do with CMOS transistors for the production of which, compared to the production of standard low voltage MOS transistors (NV-MOS transistors), no additional process steps or masks are required. The inventive control circuit rather requires only such MOS transistors which, regarding conventional low voltage MOS transistors, have such modifications which can be obtained by layout measures. The inventive control circuit can thus be produced economically and is careful regarding the chip area consumed.

The control circuit is to aim at especially such applications in which only a limited number of memory cells, such as, for example, 100 bits, are realized on an ASIC or an integrated circuit, respectively. Thus the peculiarities for such memory cells mentioned in the beginning also apply in this case. In addition, it is to be established that the circuit-technological overhead must be kept as low as possible, especially when using the memory circuit in ASICs having a small chip area. In sensor ASICs the chip area is not only to be limited for reasons of costs but often also due to extremely small package forms in which only small chips can be housed, for example with an area of 5.5 mm$^2$ in P-SSO packages.

The fundamental functioning of a conventional nMOS-EEPROM memory cell and an inventive CMOS-EEPROM memory cell has been explained above. Thus it has been shown that for programming or erasing an EEPROM memory cell a high positive or negative potential difference between the control gate and drain/source of the cell must be applied in any case. This voltage is, as far as the absolute value is concerned, considerably larger than the voltage for which standard CMOS transistors are usually designed. For programming an EEPROM in a 0.6 $\mu$m technology with a gate oxide thickness of 16 nm, for example, a voltage of 17 V is required, whereas the maximum allowed supply voltage for standard CMOS transistors in this technology is about 5 V.

Thus the problem arises with the help of which transistors the high programming voltage can be switched through for example from a programming pin to the EEPROM cell concerned. Usually special high voltage transistors (HV-MOS transistors) are used for this. For their production, however, they require additional masks and processing steps compared to the production of standard NV-MOS transistors. In particular, the gate oxide of HV-MOS transistors is formed to be thicker than is the case in NV-MOS transistors. Often special channel implantation doses are set.

The production expenditure for HV-MOS transistors described above and the increase in costs incurred are justified when the integrated circuit is produced in an extremely high number of pieces and its price is determined by other factors, such as, for example, a comparatively large chip area.

Regarding the applications mentioned above in integrated sensors, this is, however, only justified partly. In addition, it is to be noted that the HV-MOS transistors consume more chip area than NV-MOS transistors in any case. The reason for this is that the high voltages are reduced over longer drift distances. When the memory is arranged as a matrix, as is usual in VSLI applications, only relatively few HV-MOS transistors are required in order to control any cell via its line and column decoder. With N$^2$ cells, N line and N column decoders are required.

In the applications preferred for the present invention, such as, for example, automotive applications, it is, however, most often required to read out the entire memory after a power-up in a single reading cycle. Thus each memory cell has to be controlled individually and thus HV-MOS transistors must be associated to each memory cell. Thus, in the respective fields of application mentioned above, such as, for example, sensor applications or security applications, N$^2$ control circuits instead of 2N control circuits for the usual N columns and N lines of a matrix memory are required so that the expenditure increases drastically.

It is thus the object of the inventive control circuit to provide a control circuit for EEPROM memory cells, which can do with MOS transistors for the production of which no further process steps and masks are required in addition to the process steps and masks required for conventional NV-MOS transistors.

An inventive memory circuit thus includes a control circuit in the form of an MOS transistor arrangement for applying charges to the floating gates of the non-volatile memory cell which is connected to the control input, the output and first and second terminals of the memory cell in such a way that the voltage required for applying charges of a first and a second polarity to the floating gates does not drop at any of the transistors of the MOS transistor arrangement between source and gate.

If the high voltage required for programming or erasing the memory cell does not drop at any of the transistors of the control circuit between source and gate, it is not necessary to use HV-MOS transistors with a gate oxide thickness which is increased compared to standard NV-MOS transistors and thus to use additional process steps and masks. Instead it is possible according to the invention to modify conventional standard NV-MOS transistors, as far as the layout is concerned, in such a way that between drain and gate and between drain and source, respectively, a high voltage, i.e. the programming voltage or erasing voltage, respectively, may arise without having to change the process, i.e. without requiring additional masks and processing steps in order to realize thicker gate oxides. Such an electrical strength between drain and gate and drain and source can be obtained by means of layout, while such an electrical strength (voltage endurance) between source and gate cannot be obtained by means of the layout alone. Layout measures for increasing the drain-source strength, the drain-bulk strength, the bulk-substrate strength and the drain-gate strength of well-known NV-MOS transistors are known to those skilled in the art and need not be explained any further.

Standard MOS transistors having a high voltage strength by layout measures are, in contrast to standard MOS transistors, no longer symmetrical, i.e. source and drain are not exchangeable. An exact description of the layout would go too far, wherein it is only to be noted that the thin gate oxide (GOX) changes into the considerably thicker field oxide (FOX) on the drain side. The FOX is usually used in the standard process in order to avoid parasitic MOS transistors. When there is any metal trace as a line above the IC, it can cause a charge carrier inversion below in the substrate and thus short-circuit to adjacent areas. This is avoided by a thicker oxide, i.e. the FOX. In the HV-MOS transistors, the FOX is used on the drain side and not on the source side so that a high breakdown voltage between gate and drain is obtained. By a high-impedance distance under the FOX, the so-called drift distance, a high breakdown voltage is also obtained between drain and source as well as between drain and bulk. Further details concerning this are described in "High voltage devices and circuits in standard CMOS technologies" by Hussein Ballan and Michel Declerq, published by Kluwer Academic Publishers, October 1998.

Thus according to the invention the same GOX can be used for both the EEPROM transistors and the HV-MOS transistors so that only one GOX thickness is required, but neither an extra-thin tunnel oxide for the EEPROM transistors nor an extra-thick HV-GOX for the HV-MOS transistors.

The inventive control circuit, in preferred embodiments, includes an nMOS switching transistor, the drain of which is connected to the control input of a memory cell and the source of which is at a reference potential. The gate of the MOS switching transistor is at a data input so that the MOS switching transistor can be switched to a conducting or a blocking state by a data input signal. When the MOS switching transistor blocks, a high programming voltage or erasing voltage, respectively, can be applied to the control gate of the memory cell, while when the MOS switching transistor conducts, the control input is switched to the reference potential. Thus, by the MOS switching transistor, a high programming or erasing voltage, respectively, can be applied to the control input without dropping between the source and the gate of the MOS switching transistor. In order to avoid an excessive power consumption when the MOS switching transistor is switched through, current limiting means for limiting a current through it is provided, preferably in the form of a current mirror impressing a small current, such as, for example, 1 $\mu$A.

The inventive control circuit functions for both the CMOS-EEPROM memory cell described above and for conventional nMOS-EEPROM cells.

In the following, an embodiment of an inventive control circuit for a CMOS-EEPROM cell will be described referring to FIGS. 4 and 5 and an embodiment of the inventive control circuit for an nMOS-EEPROM cell will be described referring to FIGS. 6 and 7.

Figure 4:
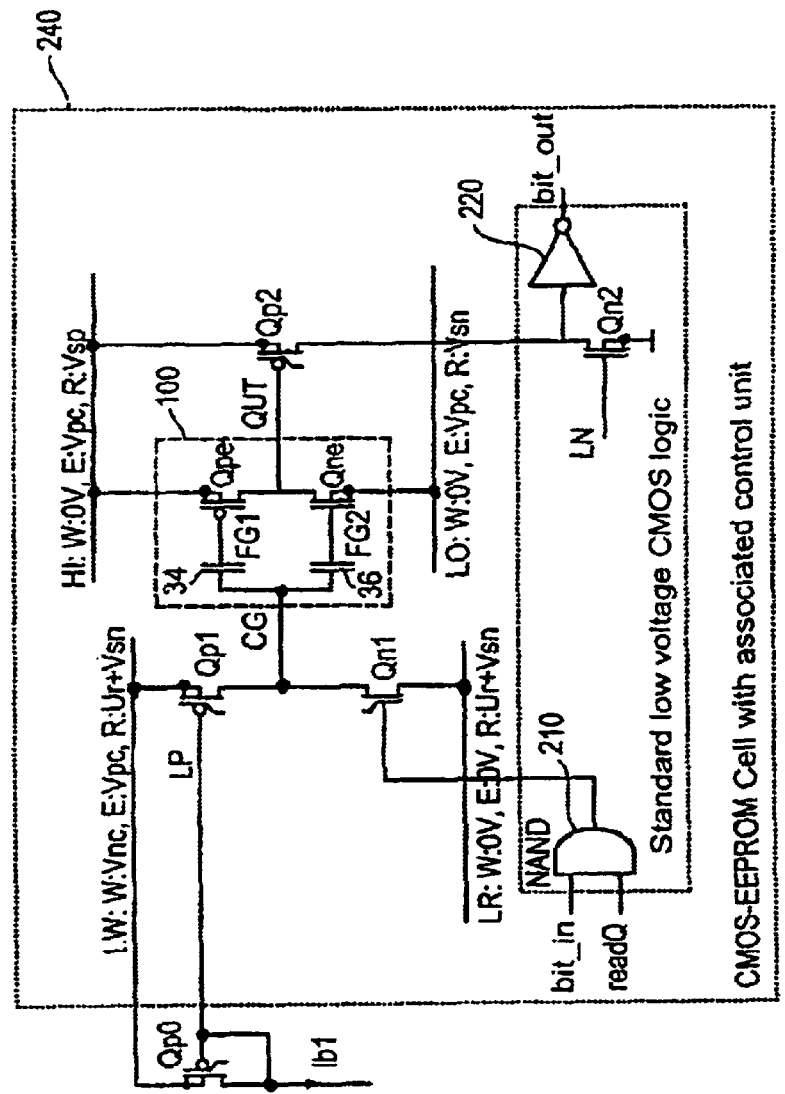
FIGS. 4 and 4a are circuit diagrams of an inventive control circuit.
Figure 6:
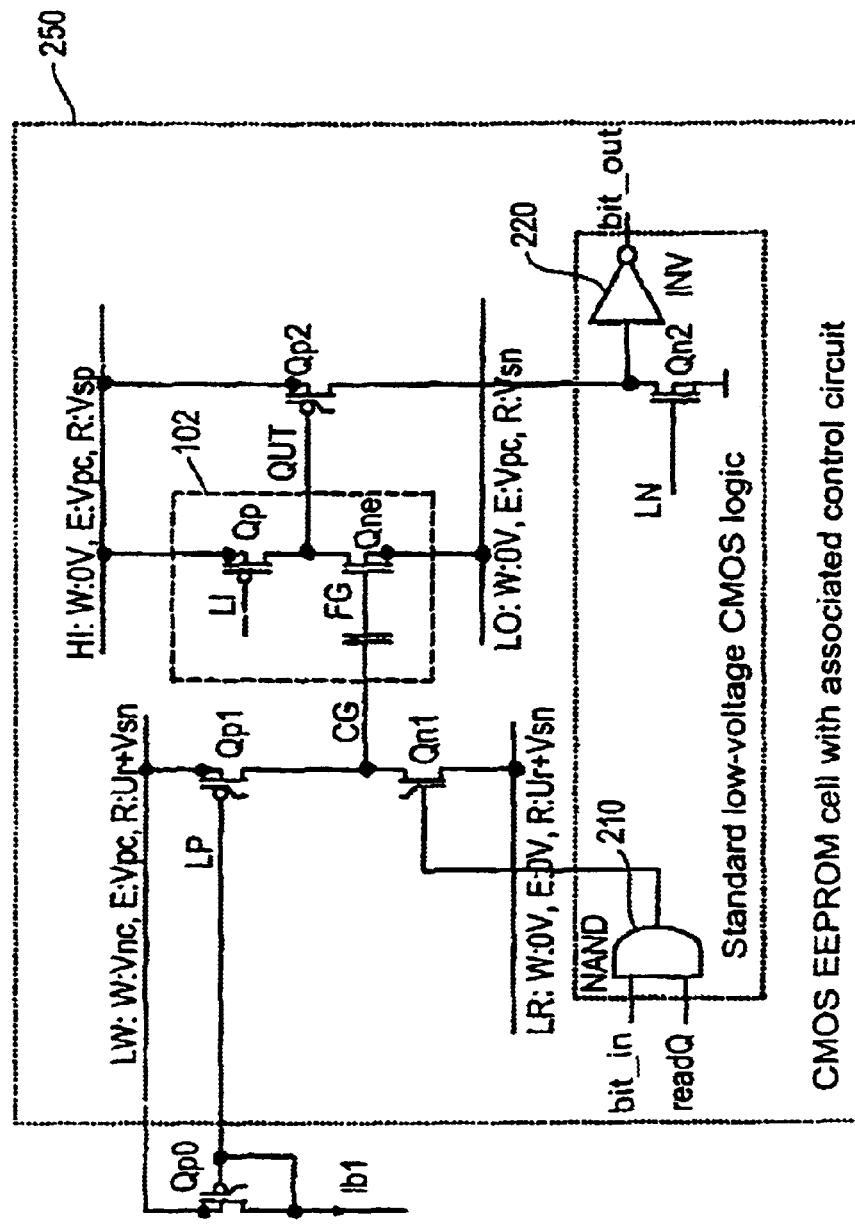
FIG. 6 is a circuit diagram of an alternative embodiment of an inventive control circuit for an alternative memory cell.

A CMOS-EEPROM cell is referred to by the reference numeral 100 in FIG. 4, while an nMOS-EEPROM cell in FIG. 6 is referred to by the reference numeral 102. The CMOS-EEPROM cell 100 has the set-up described above referring to FIG. 2a, the pMOS transistor in FIG. 4 being referred to by Qpe, while the nMOS transistor in FIG. 4 is referred to by Qne. The nMOS-EEPROM memory cell 102 has the set-up described above referring to FIG. 1b, wherein, in FIG. 6, the nMOS memory transistor is designated by Qne, while the pMOS reading transistor is designated by Qp.

Common to the CMOS-EEPROM memory cell and the nMOS-EEPROM memory cell are the input CG designated as the control gate, the output OUT and two supply voltage terminals HI and LO (corresponding to the first and the second terminal of the memory cell described referring to FIG. 2a). The nMOS-EEPROM memory cell 102 has another terminal LI, the potential of which is a gate source voltage V'gs,p under the potential of HI, so that LI=max (HI−V'gs,p; 0 V). The CMOS-EEPROM cell 100 has two floating gates FG1, FG2, while the nMOS cell 102 has only one floating gate FG.

Apart from the memory cells described above, the inventive control circuit is, however, also applicable to other conventional EEPROM cells, as are, for example, described in the publications mentioned in the introduction of the description.

According to the embodiments of inventive control circuits described below, a negative storage charge is applied to the floating gates FG1 and FG2 and to the floating gate FG, respectively, by switching the control gate CG to a high positive voltage Vnc, while the terminals HI and LO are at a potential of roughly 0 V. A positive storage charge is applied to the floating gates FG1 and FG2 and to the floating gate FG, respectively, by switching the control gate to roughly 0 V, while the terminals and lines HI and LO, respectively, are switched to a high positive voltage Vpc. Vnc and Vpc may have the same absolute value, but are generally different. The procedure used in preferred embodiments of the inventive control circuit for applying positive storage charges differs from many systems already existing, which apply a strongly negative voltage to the control gate for applying a positive storage charge to the floating gate.

For the following description, the definition that a bit is programmed when a negative charge is stored on the floating gate or the floating gate, respectively, of the associated EEPROM memory cells still applies, such a programmed bit being also referred to as "1" or HIGH. In addition, the definition that a bit is erased when a positive charge is stored on the floating gate or the floating gates, respectively, of the associated EEPROM memory cell still applies, an erased bit being also referred to as "0" or LOW. An alternative expression for erasing a bit is that the bit is programmed with a "0".

The set-up of the inventive control circuit will be described subsequently.

As is shown in FIG. 4, the control circuit for programming/erasing the memory cell 100 includes three HV-MOS transistors QP1, QP2 and Qn1. For the description of the invention, such transistors are meant by HV-MOS transistors which are modified NV-MOS transistors which can sustain large drain-source voltages, drain-bulk voltages and bulk-substrate voltages, but only have to sustain small gate-source voltages and source-bulk voltages. Thus the modifications of the HV-MOS transistors, compared to standard NV-MOS transistors, can be obtained by layout measures so that no additional masks and no additional processing steps are required so that the modifications can be justified economically. In addition, an advantage of the inventive control circuit is that only three HV-MOS transistors are required, which in turn only have to switch very small currents in the order of magnitude of 1 $\mu$A so that their channel width can be selected to be minimal. Thus area can be saved.

The CMOS-EEPROM memory cell 100, including the control circuit, as is shown in FIG. 4, is controlled using seven lines HI, LW, LP, LN, LR, LO and readQ as well as a line bit__in on which a logic input signal is received. The nMOS-EEPROM memory cell 102, including the control circuit, as is shown in FIG. 6, is additionally controlled via an eighth line, LI. The control signals on these lines are provided by a control circuit, a control circuit 200 for CMOS-EEPROM cells being shown in FIG. 5, while a control circuit 202 for nMOS-EEPROM memory cells is shown in FIG. 7. The control circuits 200 and 202 receive the usual memory control signals write (program), erase and read. Controlled by these three logic input signals write, erase and read, the control circuit 200 or 202, respectively, containing the switching means required for this produces the voltages required for the respective modes of operation of the memory cell on the lines HI, LW, LP, LN, readQ, LR, LO and LI. The respective voltages on these lines are shown in FIG. 8 for the individual states of operation. The signal readQ is the inverse logic signal to the control signal read.

It is to be pointed out here that the voltages present on the different lines in the different modes of operation are also shown in FIGS. 4 and 6, the write mode being abbreviated by W, the erase mode being abbreviated by E and the read mode being abbreviated by R. The voltage present on a respective line associated to the respective mode follows behind the abbreviation mentioned above.

Figure 5:
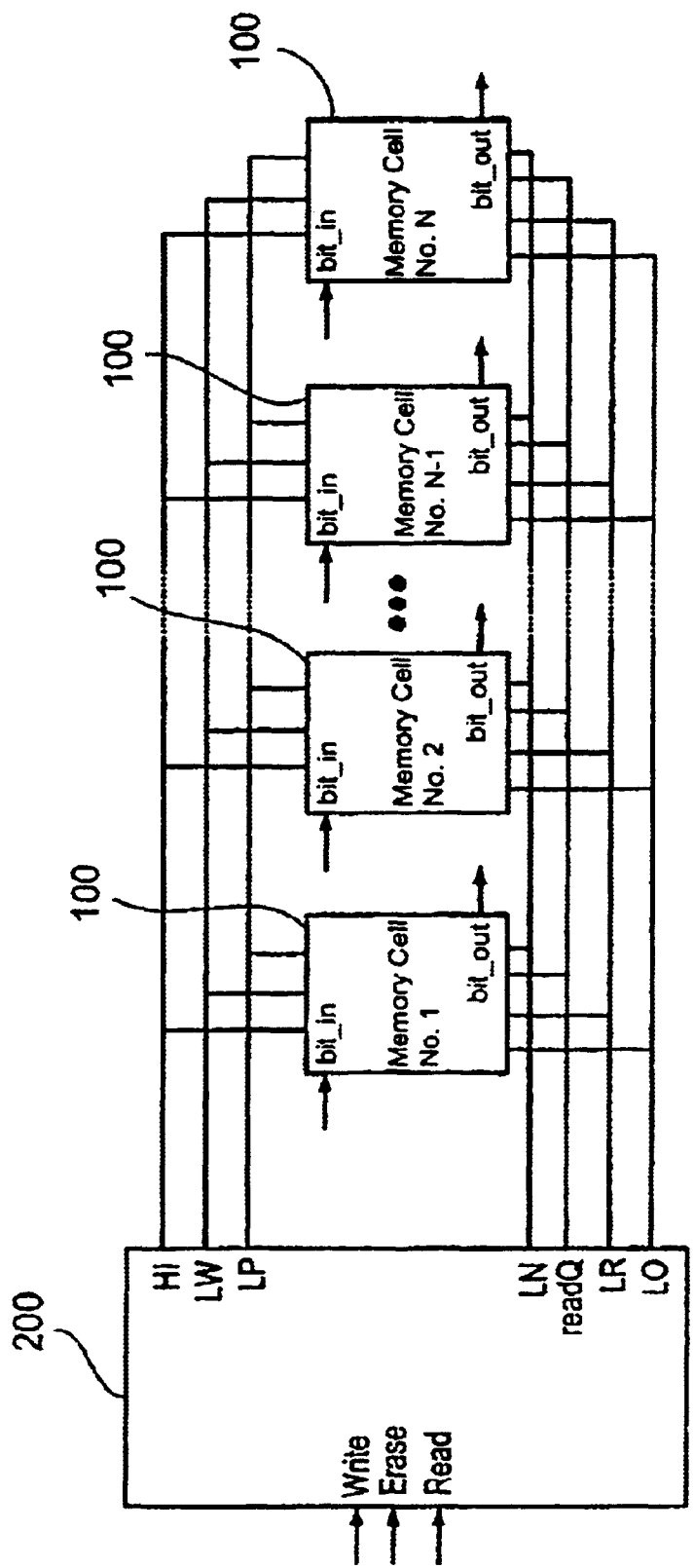
FIG. 5 is a schematic illustration of an inventive memory circuit having a plurality of memory cells.
Figure 7:
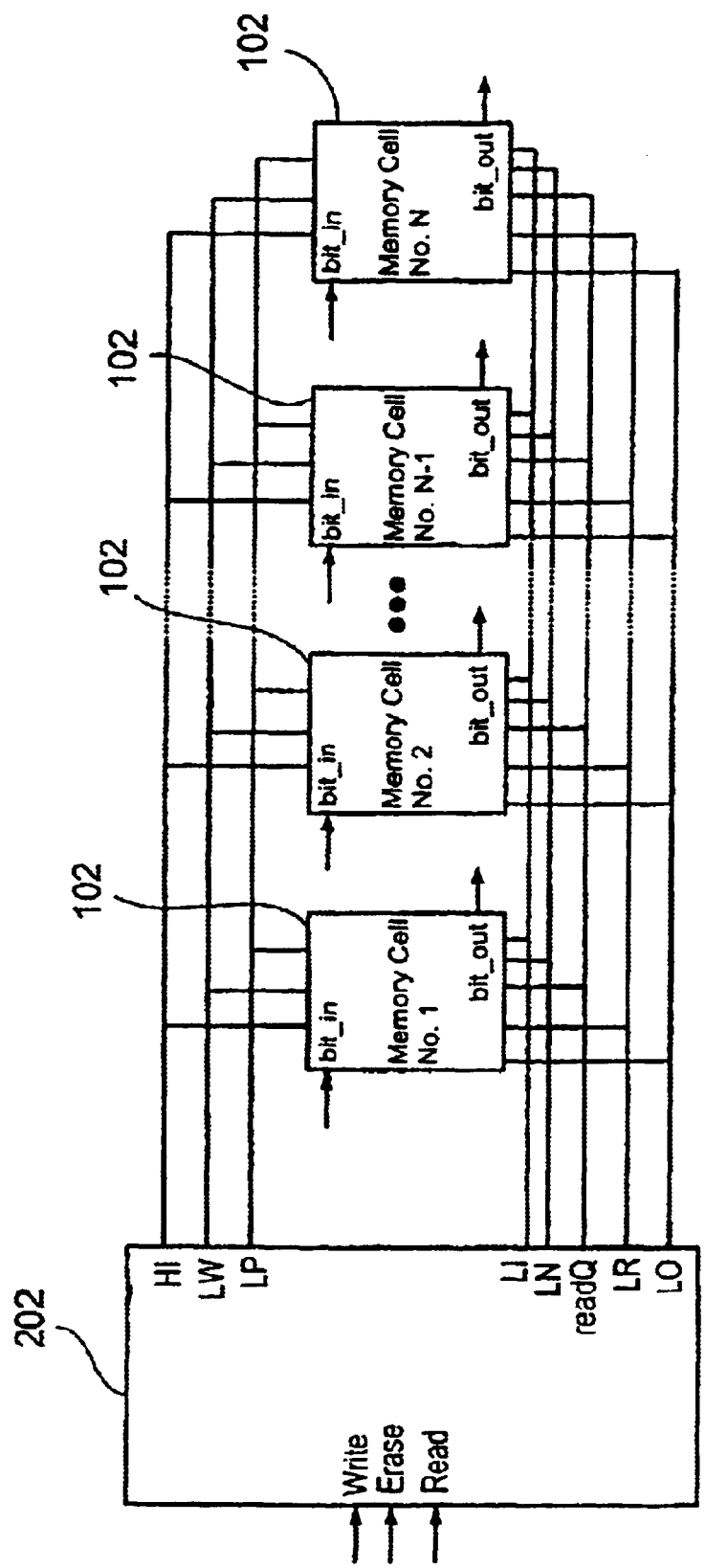
FIG. 7 is a schematic illustration of a memory circuit having a plurality of alternative memory cells.

A respective memory circuit with a number of N memory cells 100 and 102 is illustrated in FIGS. 5 and 7, respectively. All the N cells are each supplied by the common lines HI, LW, LP, LN, readQ, LR, LO and LI (FIG. 7). The N memory cells 100 in FIG. 5 are thus electrically parallel compared to the seven lines, while the N memory cells in FIG. 7 are electrically parallel regarding the eight lines. In addition, each memory cell receives a data input signal bit_in and a data output signal bit_out.

It is to be mentioned at this point that in the following description, respective reference numerals are used exchangeably for lines and signals present on a line.

As is shown in FIG. 4, the drain of the HV-nMOS transistor Qn1 is connected to the drain of the first HV-pMOS transistor Qp1 and the control gate CG of the memory cell 100. The source of Qn1 is connected to the line LR. The gate of Qn1 is connected to the output of a NAND gate 210 having two inputs of which one is connected to the data input bit_in, while the other is connected to the line readQ.

The source of the first HV-pMOS transistor Qp1 is connected to the line LW, while the gate of Qp1 is connected to the line LP. The first HV-pMOS transistor Qp1 is the output transistor of a current mirror further comprising an input transistor Qp0 representing a second HV-pMOS transistor. The source of Qp0 is connected to the line LW, the gate of Qp0 is connected to the gate of Qp1 via the line LP and is additionally connected to the drain of Qp0 for producing the current mirror.

The gate of the third HV-pMOS transistor Qp2 is connected to the output OUT of the CMOS-EEPROM memory cell 100. The source of Qp2 is connected to the line HI. The drain of Qp2 is connected to a reading out circuit formed by a standard nMOS transistor Qn2 and an inverter 220. Put more explicitly, the drain of Qp2 is connected to the drain of the transistor Qn2 and to the input of the inverter 220. The output of the inverter 220 provides the data output signal on the output line bit_out. The gate of the transistor Qn2 is connected to the line LN, while the source of the transistor Qn2 is at a reference potential, such as, for example, ground.

In addition, the source of the memory transistor Qpe is connected to the line HI and the source of the memory transistor Qne is connected to the line LO in the above circuit, as has already been mentioned.

The NAND gate 210 and the reading out circuit consisting of the transistor Qn2 and the inverter 220 can be implemented by a conventional standard low-voltage CMOS logic. In addition, in FIG. 4 the CMOS-EEPROM cell with a control circuit is represented by a broken line 240, wherein it is to be noted that the transistor Qp0 is realized preferably as a part of the control circuit 200 and thus forms a current mirror with the respective first HV-pMOS transistors Qp1 of the plurality of N memory cells (FIG. 5).

The set-up of the control circuit shown in FIG. 6 for the nMOS-EEPROM cell corresponds basically to the set-up shown in FIG. 4, wherein, as a difference, the only thing to be mentioned is that the gate of the reading transistor Qp is connected to the line LI. The nMOS-EEPROM cell 102 with a control circuit is referred to by the reference numeral 250 in FIG. 6, wherein it is to be recognized that the HV-pMOS transistor Qp0 in turn forms a part of the control circuit 202.

The functioning of the memory circuits shown in FIGS. 4 and 6 will be discussed subsequently referring to the different modes, the read mode, the write mode and the erase mode.

As an introduction, the EEPROM is first set to the read mode which will be discussed in greater detail below, by setting the input signals of the control circuits 200 and 202, respectively, the following way: write=0, erase=0, read=1. In this mode of operation, there are low voltages at the EEPROM cell, as can be deducted from the table in FIG. 8 and the pertaining waveforms illustrated in FIGS. 9a) to 9f). Thus the charges on the floating gates FG1 and FG2 and the floating gate FG, respectively, do not change. Then the inputs of all the memory cells which are to be programmed to "1" are switched to HIGH, i.e. bit_in=1, while for all the other memory cells bit_in=0 is set.

Write Mode

Then the EEPROM, i.e. the cell 110 and the cell 102, respectively, is set to the write mode by setting the input signals of the control circuits 200 and 202, respectively, the following way: write=1, erase=0, read=0. By this, the control circuit switches its output lines to those potentials which are specified in the table of FIG. 8. Put in words, the lines HI, LO and LR are set to 0 V and the line LW is set to a high positive voltage Vnc. The gate of the first HV-pMOS transistor Qp1 is switched to a potential Vnc−Vgs,p via the line LP, wherein Vgs,p is the gate source voltage of the transistor Qp1. Thus Qp1 impresses a small but well-defined current, such as, for example, in the order of magnitude of 1 μA, to the control gate CG. In the embodiment described, this current impressing is realized by the transistors Qp0 and Qp1 forming a current mirror, the transistor Qp0 being associated to the control circuits 200 and 202, respectively, while Qp1 can be found in each individual memory cell of the ASIC. Thus an input current Ib1 flows through the second HV-pMOS transistor Qp0.

The line LN, independently of the mode of operation of the EEPROM, is always at a potential Vgs,n such that the transistor Qn2 pulls a small but well-defined current, such as, again, in the order of magnitude of 1 μA, from its drain towards ground. The line NI in the case of the nMOS-EEPROM cell 102 is at 0 V. Since the signal readQ is the inverse logic signal to read, readQ=1 applies in the write mode.

bit_in=0 (write mode)

In those memory cells at the data input of which, i.e. on the line bit_in, there is a "0", Qn1 is conductive and thus Qn1 pulls the potential at its drain towards the potential on the line LR, i.e. 0 V. As a consequence, there is also a voltage difference of 0 V between the control gate CG and the line LO as well as between the control gate CG and the line HI so that the charge at the floating gates FG1, FG2 and the floating gate FG, respectively, does not change. The potential of the output OUT of the memory cell is not defined clearly in this case. Depending on the quantity of the charge stored on the floating gates and the floating gate, respectively, the nMOS transistor Qne or the pMOS transistor Qpe can conduct or not. In the case of the nMOS-EEPROM 102, the reading transistor Qp even blocks definitely. If the charge stored is sufficient in order to switch Qne or Qpe to be conductive, OUT=0 V applies. If, however, too small a charge is stored on the floating gates and the floating gate, respectively, which can, for example, be the case after the production process of the integrated circuit and before the first programming, both transistors Qne and Qpe or Qp, respectively, may block. In this case, the potential at the output node OUT is definitely not higher than the highest potential at the lines HI and LO, respectively, in the past.

Since the integrated circuit has not yet been programmed, there has not been a voltage sufficient for programming at the lines HI and LO in the past. Since the EEPROM in the past has only been in the read mode, the voltage Vsp was present on the line HI, while the voltage Vsn was present on the line LO, as can be seen from the table in FIG. 8. Both voltages Vsp and Vsn are smaller than the nominal electrical strength of standard CMOS transistors. Thus it is ensured that the potential stored at the output OUT is not sufficient to change the charges at the floating gates FG1, FG2 and the floating gate FG, respectively. In addition, it is ensured that the transistor Qp2 blocks, since its gate source voltage can only be 0 V or slightly negative. The absolute value of this voltage is, in addition, sufficiently small so that the gate oxide of Qp2 is not damaged. Its drain is pulled to 0 V by the standard nMOS transistor Qn2 in a defined manner. At the output "bit_out" there is consequently a "1" during the write mode.

As far as the dimensioning of the HV-nMOS transistor Qn1 is concerned, the only thing to mention is that the channel width of it has to be sufficiently large in the embodiment described in order to pull the potential at the control gate CG sufficiently close to 0 V in the case described above of a level of "0" on the line bit_in. In practice, this is always the case when the current is selected to be as small as possible by Qp1. Thus a minimal channel width of Qn1 is sufficient in order to pull the control gate CG to 0 V.

bit_in=1 (write mode)

Further in the write mode, the HV-nMOS transistor Qn1 blocks at those memory cells at the input bit_in of which there is a "1" so that the first HV-pMOS transistor Qp1 pulls the potential at its drain towards the potential Vnc present on the line LW. By the fact that Qp1 pulls the potential at its drain towards the high programming voltage Vnc, the high programming voltage Vnc is present between the control gate CG and the line HI as well as between the control gate CG and the line LO, whereby negative charge carriers gather at the floating gates FG1 and FG2 and the floating gate FG, respectively, by a Fowler-Nordheim tunneling through the gate oxide of Qne and Qpe. Thus the memory cells, at the input "bit_in" of which there is a "1" are programmed to "1" in the write mode since a negative net charge is stored at the floating gates and the floating gate, respectively. The output OUT of the memory cells 100 and 102, respectively, in this case is at 0 V, since the nMOS transistor Qne conducts due to the high positive voltage at its floating gate and thus its drain is short-circuited with the line LO being at 0 V. The transistor Qp2 blocks since its gate-source voltage is 0 V. Its drain is pulled to 0 V as defined by the standard nMOS transistor Qn2. At the output "bit_out" there is consequently a "1" during the write mode.

It is to be pointed out at this stage that the high programming voltage Vnc in practice has comparably slow rise and fall times of about 1 ms, as can be deducted in FIG. 9e) from the waveform of this voltage on the line LW, in order not to damage the oxide layers of the EEPROM unduly.

After finishing the write mode thus all the memory cells at the input bit_in of which there was a "1" have been programmed to "1", wherein a high operating voltage in the range of Vnc, which can, for example, be 17 V, has only dropped between drain and gate and drain and source, respectively, of the HV transistor Qn1, but not between gate and source of it. In the same way, a high voltage in the range of the programming voltage Vnc has not dropped between gate and source of the HV-pMOS transistors Qp1 and Qp2.

After the write mode described above, there is a short read mode in which the inputs bit_in of all the memory cells which are to be erased to "0" in a subsequent erase mode are switched to "0" (LOW), while the inputs bit_in of all the other memory cells receive a "1".

Erase Mode

Then the EEPROM is switched to the erase mode in which the following input signals are applied to the control circuits 200, 202: write=0, erase=1, read=0. Thus the control circuits 200 and 202, respectively, switch the output lines to those potentials which are again specified in the table of FIG. 8. Thus the lines HI, LO and LW are set to a high positive erasing voltage Vpc which can, for example, again be 17 V. The line LR is at 0 V. The gate of the first HV-CMOS transistor Qp1 is switched to a potential Vpc−Vgs,p via the line LP so that Qp1 again impresses a small but well-defined current, such as, for example, in the order of magnitude of 1 $\mu$A, to the control input CG. The line LN, as has been described above, independently of the mode of operation of the EEPROM, is always at a potential Vgs,n so that the standard CMOS transistor Qn2 pulls a small but well-defined current, such as, for example, in the order of magnitude of 1 $\mu$A, from its drain towards ground. In the case of the nMOS-EEPROM cell 102, the line LI is at the potential Vpc−V'gs,p. V'gs,p designates the gate source voltage of the NV-pMOS transistor Qp. The signal readQ is 1.

bit_in=0 (erase mode)

In those memory cells at the data input of which there is a "0" on the line bit_in, Qn1 is conductive. Thus Qn1 pulls the potential at its drain towards the potential of 0 V present on the line LR. As a consequence, a high voltage difference of Vpc occurs between the control input CG and the line LO as well as between the control input CG and the line HI, whereby negative charge carriers leave the floating gates FG1 and FG2 and the floating gate, respectively, in the direction of the lines HI and LO, again by a Fowler-Nordheim tunneling through the gate oxide of the memory transistors Qne and Qpe. Thus the memory cell is erased or programmed to "0", respectively, because a positive net charge is stored at the floating gates-and at the floating gate, respectively. The output OUT of the CMOS-EEPROM memory cell 100 in this case is at the potential Vpc since the pMOS transistor Qpe, due to the negative charge on its floating gate, conducts and thus short-circuits its drain to the line HI on which there is the voltage Vpc. The output OUT of the nMOS-EEPROM memory cell 102 is also at Vpc since the potential on the line LI is selected such that Qp is conductive, while Qne blocks in any case. The transistor Qp2 blocks because its gate-source voltage is 0 V. The drain of the HV-pMOS transistor Qp2 is pulled to 0 V as defined by Qn2. At the output bit_out there is consequently a "1" during the erase mode.

As can be deducted from the waveforms on the lines HI, LO and LW in FIGS. 9c), 9d) and 9e), the high erasing voltage Vpc in practice has a comparably slow rise time and fall time of about 1 ms in order not to damage the oxide layers of the memory transistors Qpe and Qne unduly.

In the erase mode, drain, source and bulk of the lower voltage standard MOS transistors Qne and Qpe and Qp, respectively, of the memory cells at the input bit_in of which there is a "0" are at a high voltage Vpc compared to the substrate. It is thus clear that in the embodiment of a control circuit shown these transistors must be formed in order to withstand such voltages. This can, for example, be realized relatively easily in BiCMOS technology since the wells of the MOS transistors are in the weakly doped epitaxy layer. This epitaxy ensures a high electrical strength towards the substrate. In addition, the lateral distances between the MOS transistors and the substrate contacts can be increased in order to rule out lateral breakdown paths. Such measures for increasing the electrical strength towards the substrate are well known in technology and need not be explained in greater detail at this point. The voltages of the MOS transistors Qne, Qpe and Qp between drainsource, drain-bulk and source-bulk are, however, small, about 0 V, so that the NV-MOS transistors do not have to be modified for this.

In the erase mode, the gate, the source and the bulk of the third HV-pMOS transistor Qp2 are at the high erase voltage Vpc, its drain, however, is at 0 V. Even in this case an MOS transistor which only has to have the high electrical strength between drain and source and between drain and bulk and between drain and gate is sufficient. In the embodiment illustrated, the standard nMOS transistor Qn2 has to be dimensioned in such a way that even at higher temperatures, despite a possible leakage current of Qp2, it holds its drain at 0 V, which is the case when the leakage current is smaller than the current drawn by the transistor Qn2, i.e., for example, 1 μA. In addition, the drain current of Qn2 should not be dimensioned any greater since this leads to an increased power loss in the read mode of operation.

bit_in=1 (erase mode)

In those memory cells at the data input of which there is a "1" on the line bit_in, the HV-nMOS transistor Qn1 blocks and thus the first HV-pMOS transistor Qp1 pulls the potential to its drain towards the potential Vpc present on the line LW. Consequently there is also a voltage difference of 0 V between the control gate CG and the gate LO and between the control gate CG and the line HI, respectively, which is why the charge on the floating gates FG1 and FG2 and the floating gate FG, respectively, does not change. The potential of the output OUT of the CMOS-EEPROM memory cell is, in this case, Vpc since a negative charge is stored at the floating gate of the nMOS transistor Qne due to the previous write process and this transistor thus blocks while Qpe is conductive. In the case of the nMOS-EEPROM memory cell 102, the nMOS transistor Qne blocks as well, while the reading transistor Qp conducts a small reading current into the drain of Qne, whereby the potential at the output OUT is pulled to the potential on the line HI, i.e. Vpc. The transistor Qp2 consequently blocks since its gate-source voltage is 0 V. Its drain in turn is pulled to 0 V by Qn2 in a defined manner. At the output bit_out there is consequently a "1" during the erase mode.

It can now also be seen why in the embodiment of the inventive control circuit described, in the case of the CMOS-EEPROM memory cell 100, the write mode is begun with before the erase mode. The previous write mode, during the erase mode in the case of a "1" at the data input of the line bit_in ensures that the pMOS memory transistor Qpe conducts and the potential at the output OUT is thus defined. If in contrast an erase mode was to take place before a write mode, the case could arise that depending on how much charge is stored on the floating gates FG1 and FG2, both transistors Qne and Qpe block, when bit_in is "1". Thus the output OUT is no longer coupled to the line HI or LO and it could, for example, get stuck by stray capacities towards ground at 0 V, while the lines HI and LO are switched to the high erase voltage Vpc. This would lead to an immediate destruction of gate oxide of the third HV-pMOS transistor Qp2 since the entire erase voltage Vpc would drop between the gate and the source of it.

In the case of the nMOS-EEPROM memory cell 102, the order of write mode and erase mode is not important since the reading transistor Qp conduct sufficiently in order to bring the output OUT to the potential Vpc, irrespective of whether Qne conducts or blocks.

Figure 9:
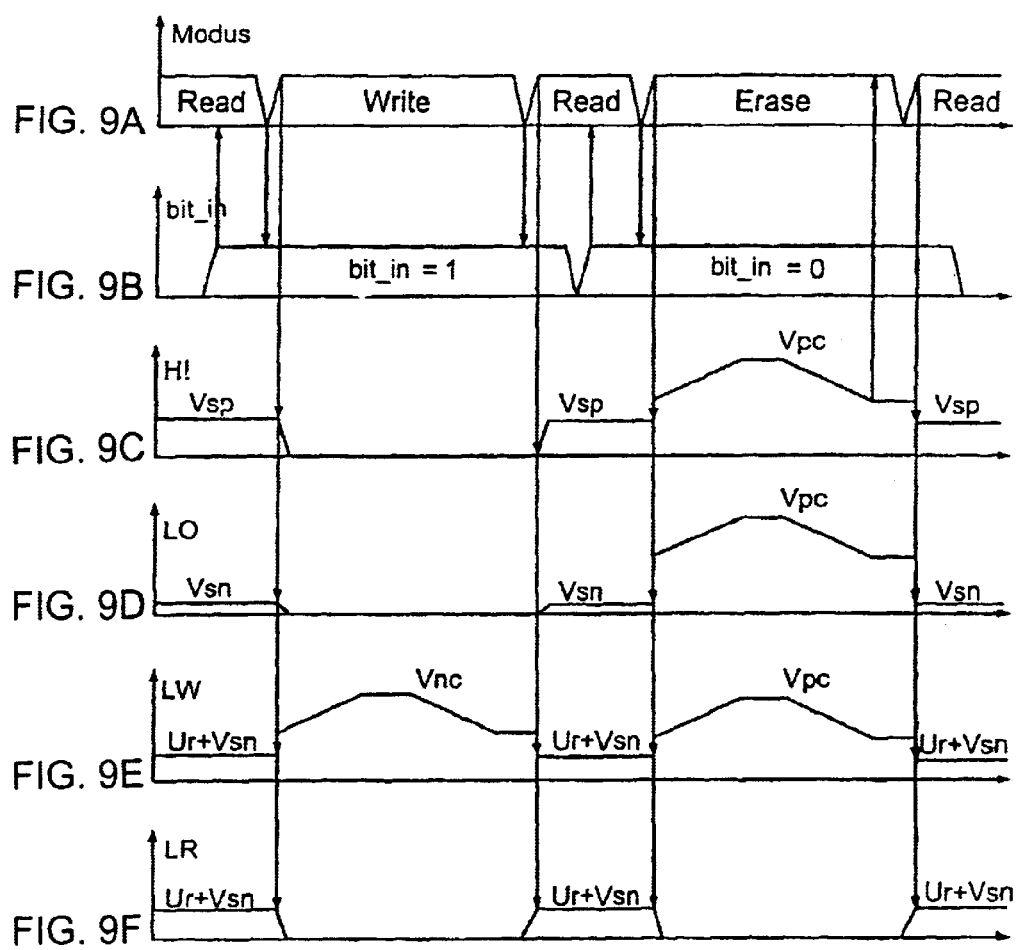
FIGS. 9a) to 9f) are diagrams showing waveforms during the different modes of operation.

In FIG. 9a) the sequence of the control signals write, erase and read during an entire programming sequence, i.e. a write mode and an erase mode, is illustrated, while, the FIGS. 9b) to 9f) show the voltages on the lines bit_in, HI, LO, LW and LR. Thus it is also to be mentioned that, during a programming sequence according to FIG. 9, some bits may remain unchanged by setting the input signal bit_in to "0" during the write mode, while it is set to "1" during the erase mode. In such a case, the charge at the floating gates and the floating gate, respectively, of the EEPROM memory cell concerned does not change. This procedure can be recommended especially when the memory cells are to be loaded as little as possible in order to obtain a maximum reliability and lifetime.

Read Mode

In the read mode of the EEPROM memory, depending on the size of the reading voltage, which hereinafter is referred to as Ur+Vsn, either only one of the lines LR and LW or both are switched to a potential Ur+Vsn in the embodiment illustrated. By the corresponding applying of a reading voltage it is effected that the reading voltage Uinv described above is present at the control gate CG. With smaller values of Ur+Vsn it is sufficient to only switch the line LR to this potential since the HV-nMOS transistor Qn1 can switch through small voltages from the line LR to the control gate CG. With higher values of the reading voltage Ur+Vsn it is sufficient to switch them to the line LW since Qp1 can switch through large voltages from the line LW to the control gate CG. If, however, the reading voltage Ur+Vsn is in a medium range so that neither Qn1 nor Qp1 alone is in a position to suitably switch through this voltage to the control gate CG, it is advantageous to provide both lines LR and LW with the potential Ur+Vsn so that both transistors Qn1 and Qp2 contribute to switching through the reading potential from the lines LR and LW to the control gate CG.

In case the line LW is not used in order to apply the potential just mentioned to the control gate CG, the transistor Qp1 has to be switched off by, for example, switching off the current through Qp0. In the same manner the transistor Qn1 must be switched off in case the line LR is not used in order to apply the reading voltage to the control gate CG. This can, for example, be obtained by substituting the NAND gate 210 shown in FIGS. 4 and 6 by an NOR gate and by substituting the signal readQ by the read signal.

Depending on which transistor in the EEPROM memory cell conducts better, Qne or Qpe in the memory cell 100 and Qne or Qp in the memory cell 102, respectively, the output OUT either takes the potential Vsn present on the line LO or Vsp present on the line HI. In the second mentioned case Qp2 is switched off so that the transistor Qn2 pulls the drain of Qp2 to ground, whereby a 1 is present at the output bit_out. If the memory transistor Qne conducts better, the gate of the HV-pMOS transistor Qp2 will be at the potential Vsn so that, for the case that Qp2 conducts better than Qn2, the drain of Qp2 is judged as a logic "1" by the inverter 220 so that a 0 is output as an output signal on the line bit_out. For this purpose the gate source voltage of Qp2 must become sufficiently large, which in turn means that Vsp–Vsn is to be selected to be sufficiently large.

Instead of the reading out circuit consisting of the transistor Qn2 and the inverter 220, any alternative circuit is conceivable, which may serve to read out the bit. Of importance in the embodiment shown is the HV-pMOS transistor Qp2 at the output of the EEPROM memory cell 110 or 102, respectively, the gate of which is at the output OUT, the source of which is at the line HI and the drain of which, during the erase mode, is switched to a potential safe for standard CMOS transistors by Qn2 or an alternative circuit.

An important aspect of the control circuits described for EEPROM memory cells is the power consumption. In both the write and the erase mode, the line LW is at a high potential. When a logic "1" is present at the gate of the HV-nMOS transistor Qn1 (bit_in=0), this transistor conducts and pulls the control gate CG to 0 V. Thus a current towards ground from the line LW over Qp1 and Qn1 flows. The size of this current is determined by the current mirror formed by the two transistors Qp0 and Qp1 and the input current Ib1. This current is especially annoying when the high voltage on the line LW is produced by an on-chip charge pump since the smaller the effective internal resistance of a charge pump, the larger the pump capacities used must be. Thus charge pumps need the more bit chip area, the larger the currents they are to provide are. For this reason it is tried to select Ib1, i.e. the current drawn from the control circuit 200 and 202, respectively, to a plurality of memory cells, to be as small as possible. Since currents far below 1 $\mu$A having transistors of minimal channel widths, cannot be handled well, wherein for reasons of area only those are desired to be used in EEPROM memory cells, it can assumed that in the worst case about as many micro-amperes flow over the line LW as bits, i.e. memory cells, are provided in the entire EEPROM memory. For the 100 bits mentioned at the beginning, thus a current load of the charge pump of about 100 $\mu$A results. This current is so large that, in the applications mentioned, it is, from an economical point of view, not justified to integrate sufficiently large charge pumps onto the ASIC.

As a remedy for the problem just mentioned, the voltage pulses for programming and erasing at a pin of the ASIC could be made available from outside. It may, however, not be possible to apply voltage pulses of about 17 V to a pin of the ASIC having its application circuitry connected thereto so that it would be desirable to produce the high voltage on the chip by means of a charge pump. The reason why it is not possible to apply voltage pulses of the size mentioned above to the ASIC from outside, can, for example, be a security wiring. It can be envisaged, for example, that the ASIC is already soldered to a small board and that this board is located in a waterproof package surrounded by cast plastic. In addition, discrete Zener diodes having dropping resistors may, for example, be soldered to the pins in order to keep away unduly high voltage pulses from the ASIC. When these Zener diodes have Zener voltages below 17V, it is not possible to program the EEPROM memory of the ASIC with an externally applied voltage pulse.

By the following variation for programming the EEPROM memory, the maximum power consumption of the EEPROM memory during the programming process can be reduced considerably so that the voltages required can be generated by a comparably small charge pump at the ASIC. With this variation, the programming process is one write cycle and several erase cycles. In the write cycle, all the inputs bit_in are set to a logic "1". Thus all the bits of the memory, i.e. all the EEPROM memory cells 100 and 102, respectively, are programmed to a "1". Thus the transistors Qn1 block in all the EEPROM cells so that no appreciable current flows from the line LW to the line LR. All those bits which are to be programmed to "0" are erased by subsequent individual erase cycles. When, for example, 7 bits of the memory are to be set to "0", 7 individual erase cycles are required, i.e. the erase cycle as is illustrated in FIG. 4, is executed 7 times in a row, each time for another memory cell. In each of these erase cycles all the inputs bit_in are set to "1" except for the bit which is to be erased. Thus, in each erase cycle, precisely one individual transistor Qn1 in a single EEPROM cell conducts. Thus only a current of 1 $\mu$A flows from the line LW to the line LR. This current is sufficiently small so that the erasing voltage Vpc can be produced by a sufficiently small charge pump at the chip.

In summary, it can be stated that in the embodiment shown of the inventive control circuit, the control gate of the EEPROM memory cell is at the drain of an HV-pMOS transistor Qp1 and the drain of an HV-nMOS transistor Qn1, Qp1 being the output transistor of a current mirror through the input transistor Qp0 of which a current Ib1 flows. Qn1 takes the function of a switch which is switched on during the read mode. In addition, it is switched on during the write and erase modes, when there is a "0" at the input bit_in of the cell. In the switched on state, Qn1 must conduct better than Qp1 in the embodiment shown. The coupling out at the output of the EEPROM memory cells 100 and 102, respectively, is effected via the gate of an HV-pMOS transistor Qp2, the source of which is at the line HI, while the drain of which, during the erase mode, is placed at a potential harmless for standard CMOS transistors via a circuit connected thereto.

The individual cells of an EEPROM memory from a plurality of memory cells are parallel relative to lines LW, LR, HI, LO, LP, LN, LI and readQ. A positive charge is selectively applied to the floating gates FG1 and FG2 and the floating gate FG, respectively, by applying a high positive voltage to the line LW. A negative charge is selectively applied to the floating gates and the floating gate, respectively, by applying a high positive voltage to the lines LW, HI and LO. In the case of the CMOS-EEPROM memory cell, an erase mode is only activated after a write mode having taken place. In the read mode, a reading voltage Vsn+Ur is applies to the lines LR and/or LP, the reading voltage being between Vsn and Vsp. At the line HI there is Vsp, while Vsn is at the line LO. These voltages are smaller than the nominal electrical strength of the NV standard CMOS transistors of the technology used. On the other hand, the difference Vsp–Vsn is sufficiently large in order to make the HV-pMOS transistor more conducting than Qn2 for the case that Vsn is present at the output OUT.

In the control circuit according to the present invention such transistors having a standard gate oxide can be used for the HV-MOS transistors Qp1, Qp2 and Qn1 (as well as for the HV-MOS transistor Qp0 of the control circuit). According to the invention, programming voltages and erasing voltages having a slow rise time which is preferably in the order of magnitude of 0.1 ms to 1 ms, are preferably used. The respective values for the voltages depend on the respective technology used, exemplary values being the following: Vpc=Vnc=17 V, Vsp=3 V, Vsn=0 V, Ur=1.1 V. Alternatively, it can also be preferred to dimension the transistors Qpe and Qne in such a way that Ur is 1.5V and thus Vsp/2. In the control circuit according to the invention, the voltages, which are partially high, are switched by means of the two HV-MOS transistors Qp1 and Qn1 to the control gate CG of the EEPROM cell 100 and 102, respectively. The output OUT is coupled out via the HV-pMOS transistor Qp2 in order to block high voltages present during the erase mode from the low voltage CMOS logic.

Figure 4A:
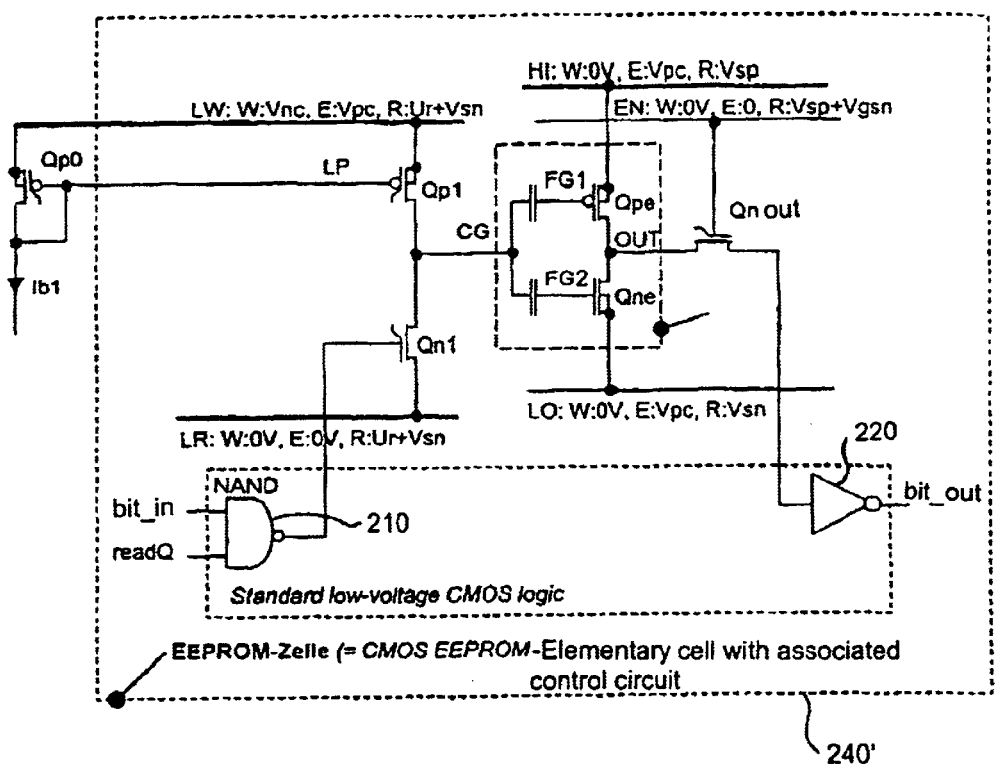

An alternative embodiment of a circuitry connected to the output OUT is shown in FIG. 4a. In this embodiment, the drain of a HV nMOS transistor Qnout is connected to the output OUT, the source of the transistor Qnout is connected to the input of the inverter 220 and the gate of the transistor Qnout is connected to a control line EN. The control line EN supplies a voltage of 0 V during the modes "write" and "erase" and supplies a voltage of Vsp+Vgsn during the mode "read", in order to switch through the HV nMOS transistor during the read mode. Vgsn is a gate-source-voltage which is sufficient to bring the HV nMOS transistor Qnout in a conductive state even if the output OUT is at a high logic level, i.e. is at a voltage of Vsp. For the rest, the EEPROM cell 40' shown in FIG. 4a is identical to that shown in FIG. 4.

Current Watch Circuit

After having described embodiments of inventive control circuits, embodiments of an inventive current watch circuit will now be discussed in greater detail referring to FIGS. 10 to 16. Such a current watch circuit is configured to monitor the power consumption of a circuit block between two terminals of same, via which a supply voltage for the circuit block is applied. Such a current watch circuit is advantageously suitable for monitoring the power consumption of an inventive CMOS-EEPROM memory cell. Such a current watch circuit can, however, also be used for monitoring the power consumption of any circuit block.

In order to monitor the power consumption of a circuit block, that part of the circuit has to be interfered in in general, which electrically feeds the circuit block concerned, i.e. the power supply. Usually a voltage supply, only very rarely a current supply, is used as the power supply. Regarding the inventive current watch circuit, only voltage supplies are to be considered. A voltage supply is defined as a circuit providing an electrical voltage at two output ports, the voltage being mostly independent of the current flowing into and from the ports, respectively.

A simple way of monitoring the power consumption of a circuit block of, for example, an EEPROM memory cell is to fit the voltage supply with a current limitation. The output voltage is only made available at the output port of the voltage supply when the circuit block draws a sufficiently small current. When the current, however, wants to exceed the limit of the current limitation, the output voltage of the current supply collapses. This collapsing can be detected easily by applying for example the supply voltage of the current block to the input of an inverting Schmitt trigger and to operating the Schmitt trigger by a second independent supply voltage. In normal operation, the output of the Schmitt trigger is at a logic "0", i.e. LOW, in the case of an error, however, it is at a logic "1", i.e. HIGH. The disadvantage of such a system is that the supply voltage of the current block to be monitored collapses in the case of an error so that this circuit block can no longer function.

Often such an error in a circuit block announces itself long before in the form of an excessive power consumption, even before this error severely impedes the functioning of the circuit block. It is desirable to detect an evolving error case as early as possible so that the system can react to it even before a severe malfunctioning has occurred. It is, for example, conceivable that the system notifies the user about the necessity of an urgent service, while in the meantime it still remains functioning for a large period of time. In applications in the automobile sector, it is also conceivable that the vehicle can still be driven to the next service station instead of being abandoned immediately at the roadside.

The system outlined above of a current limitation with a collapse of the supply voltage could be extended by connecting a second voltage supply in parallel to the first one for obtaining the emergency feature just mentioned. The second voltage supply would provide smaller output voltages than the first one and would be coupled out from the first one by a diode in normal operation so that there is no short-circuit between the two voltage supplies. If, in the case of an error, the first supply would collapse, the supply voltage would be kept at the level of the second supply. This second level is only slightly below the first one so that the defective circuit block still remains functioning. Then the Schmitt trigger described above does no longer recognize the error case and a more precise comparator must be used. Systems of this kind are, however, relatively extensive and thus expensive regarding area consumption and power consumption and thus not for commerce.

An inventive current watch circuit includes emergency features, can do with fewer transistors and consumes less chip area. In addition, the inventive current relay has a negligible power consumption.

The inventive current watch circuit can be used with special advantage with the CMOS-EEPROM memory circuit described above. The cross current over the pMOS transistor 30 (FIG. 2a) and Qpe (FIG. 4), respectively, and the nMOS transistor 32 (FIG. 2a) and Qne (FIG. 4), respectively, of a CMOS-EEPROM memory cell is microscopically small in the case of an error-free programming of the cell. As has been explained above, a cross current, however, starts to flow when the floating gate of the transistor which has been programmed to be blocking loses charge. In this state of operation, the logic output of the CMOS-EEPROM memory cell is not yet impeded by the charge loss. The current relay can thus recognize the charge loss by detecting the cross current long before it leads to an inconsistent memory contents. This is of special importance in security-relevant applications, such as, for example, intelligent sensors for automotive applications.

The inventive current watch circuit in application for a CMOS-EEPROM memory cell includes a circuit node connected to the first or second terminal of the non-volatile memory cell, the node being charged as soon as a current between the first terminal and the second terminal of the non-volatile memory cell exceeds a predetermined value. In addition, means for limiting the potential to which the circuit node is charged is provided. Finally, the current watch circuit includes means for producing an output signal when the circuit node is charged to the potential.

By means of such a current watch circuit, the power consumption of a current block is monitored in the preferred embodiment of a CMOS-EEPROM memory cell. When it exceeds a critical value, a logic output signal of the monitoring circuit goes to LOW, i.e. logically "0", and indicates this event being referred to as an IDD error case. An important marginal condition is that the supply voltage of the circuit block to be monitored should, even in an error case, remain as unchanged as possible so that the circuit block has emergency features. This is made possible by the potential limiting means.

Figure 10:
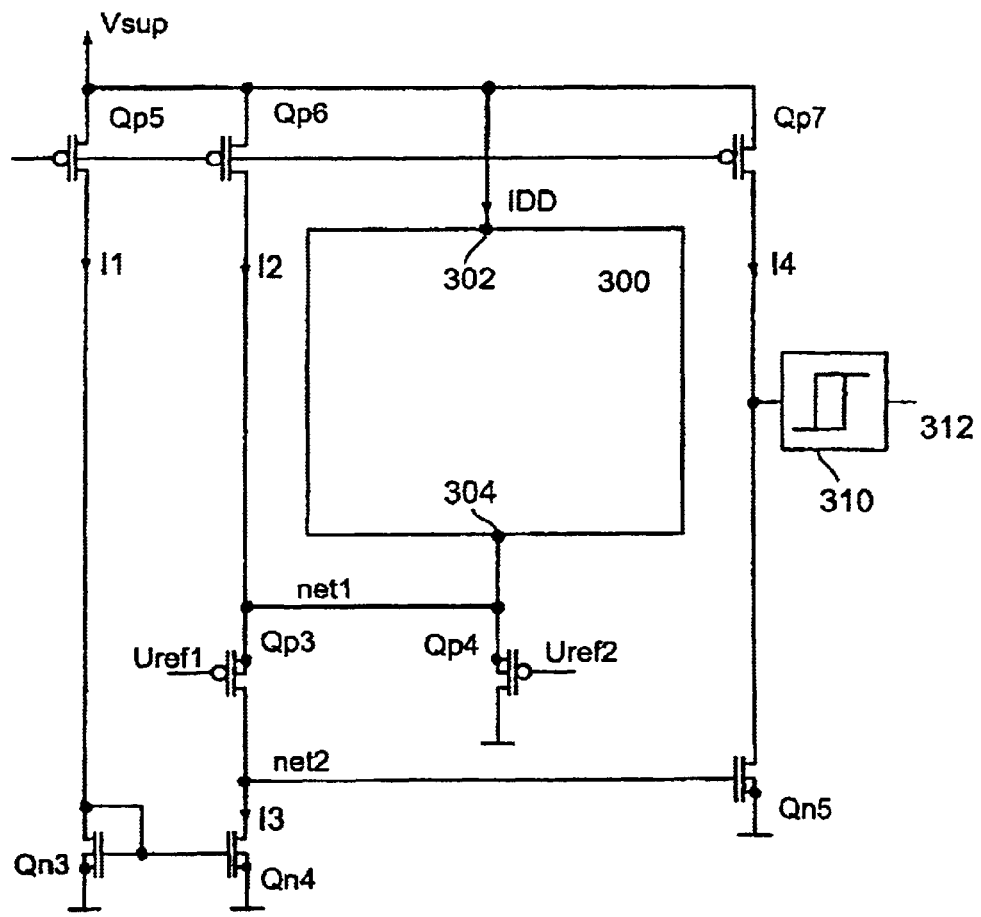
FIG. 10 is a circuit diagram of a first embodiment of an inventive current watch circuit.

A first embodiment of an inventive current watch circuit is shown in FIG. 10.

A circuit block 300 has two supply voltage terminals 302 and 304, one, 302, for a positive supply voltage and one, 304, for a negative supply voltage. At the supply voltage 302, there is the positive supply voltage Vsup.

The embodiment shown in FIG. 10 of a current watch circuit includes five pMOS transistors Qp3, Qp4, Qp5, Qp6 and Qp7. In addition, it includes three nMOS transistors Qn3, Qn4 and Qn5 and a Schmitt trigger 310 outputting an error signal at an output 312 of it.

The terminal 304 of the circuit block 300 is connected to a circuit node net1 which is additionally connected to the source of Qp3 and the source of Qp4. At the gate of Qp3, there is a first reference voltage Uref1 and at the gate of Qp4 there is a second reference voltage Uref2. The drain of Qp4 is connected to ground. The drain of Qp3 is connected to a second network node net2 which is additionally connected to the drain of Qn4 and the source of Qn5. The source of Qn4 is connected to ground, while the gate of Qn4 is connected to the gate of Qn3. The gate of Qn3 is further connected to the drain of Qn3, while the source of Qn3 is connected to ground. Thus the two transistors Qn3 and Qn4 form a current mirror.

The pMOS transistor Qp5 is connected between the drain of Qn3 and the supply voltage Vsup. The pMOS transistor Qp6 is connected between the source of Qp3 and Vsup. The pMOS transistor Qp7 is connected between the drain of Qn5 and Vsup. The transistors Qp5, Qp6 and Qp7 are output transistors of a current mirror, the gate terminals of which are connected to the gate of a further pMOS transistor (not shown), the gate and drain of which are connected together, the source of which is at Vsup and via the channel of which a bias current is provided. The bulks of the transistors Qp5, Qp6 and Qp7 are not illustrated and are generally at Vsup.

The reference voltages Uref1 and Uref2 are preferably close to the negative operation voltage potential, i.e. ground.

The pMOS transistor pair Qp3 and Qp4 is dimensioned such that with an increasing potential at the network node net1 at first Qp3 becomes conductive, wherein only with a further rise of the potential at net1, Qp4 becomes conductive. This can be obtained by selecting the reference voltages Uref1 and Uref2 to be identical and by making the ratio of channel width to channel length of the transistor Qp3 larger than that of the transistor Qp4, i.e.: $(W/L)_{Qp3} > (W/L)_{Qp4}$. Alternatively, this can also be obtained by forming the transistors Qp3 and Qp4 to be identical and by making the reference voltage Uref2 larger than the reference voltage Uref1, i.e. Uref2>Uref1. Mixtures of the two possibilities mentioned above are also conceivable.

A current I1 which is provided through the pMOS transistor Qp5 is fed into the current mirror formed by the transistors Qn3 and Qn4. The output transistor Qn4 of the current mirror thus draws a maximum current I3 from the node net2 towards ground, provided it is not saturated. The following applies: $I3 = I1 \cdot (W/l)_{Qn4}/(W/L)_{Qn3}$.

A current IDD defined by the power consumption of the circuit block 300 flows into the node net1. If the circuit block 300 to be monitored has a very small power consumption in the normal mode of operation, for example considerably less than 1 μA, the transistor Qp6 additionally feeds a small current I2 in the order of magnitude of 1 μA into the node net1. This additional current feeding can, however, be dispensed with, i.e. Qp6 can be omitted, if the circuit block 300 to be monitored, in the normal mode of operation, has a sufficiently large power consumption.

First it is to be explained what is meant, in this context, by "sufficiently large". When the circuit block 300, for example, only contains CMOS logic, its static power consumption only consists of leakage currents of blocked pn junctions and the sub-threshold currents of blocked MOS transistors. When, for example, the node net1 has a parasitic capacitance towards the substrate and a strong EMV pulse charges this capacity to a negative potential, i.e. below ground, it takes a certain time until the small leakage currents charge the parasitic capacitance to positive values again. During this time, an excessive supply voltage is present at the circuit block 300, which may not be allowed. If the CMOS logic in the circuit block 300 has switching processes, considerable positive and negative currents may flow for a short period into the node net1 or from the same. In order to avoid negative potentials at the node net1, I2 is to be selected such that I2+IDD will always remain positive. If it is also ensured by the normal mode of operation that IDD will always remain positive, the power consumption of the circuit block 300 will be sufficiently large.

The above currents are such that, in the normal case of operation, the following applies: I2+IDD<I3. This means that in the normal case of operation IDD is under the limit required for recognizing a malfunctioning. The potential on the network node net1 is Uref1+|Ugs (Qp3)|, Ugs (Qp3) being the gate-source voltage of the pMOS transistor Qp3. The potential on the network node net2 is very close to ground, for Qn4 wants to draw higher a current from Qp3 than is fed into its source. Since this potential is at the gate of Qn5, Qn5 blocks. Qp7 feeds a small current I4, for example in the order of magnitude of 1 μA, into the drain of Qn5 so that its drain shifts to Vsup. The Schmitt trigger provides a high logic level HIGH at the output 312. The reference voltage Uref2 and the pMOS transistor Qp4 are dimensioned such that Qp4, in this state of operation, blocks or at least conducts a current considerably smaller than Qp3, as has been explained above.

No current will flow over Qp4, as long as I2+IDD<I3, when Uref2>V(net1)−|Vth,p|, V(net1) being the potential at the node net1 and Vth,p being the threshold voltage of the pMOS transistor Qp4.

In an error case, the power consumption of the circuit block B and thus the current IDD rises as much that the following is true: I2+IDD>I3. Thus Qp3 feeds higher a current into the network node net2 than Qn4 draws towards ground since, by the current mirror of Qn3 and Qn4, the current I3 is limited to a maximum value. Thus the potential on the network node net2 rises so much that Qp3 is saturated, i.e. its drain-source voltage becomes very small, such as, for example 50 mV. The excessive current I2+IDD−I3 keeps charging the network node net1 to a positive value so that Qp4 finally becomes conductive and diverts it towards ground.

Thus the potential on the network node net1 rises in an IDD error case, wherein this rise in voltage can, however, be kept relatively small, for example 100 mV, since the switching thresholds of Qp3 and Qp4 can be set very precisely. In particular, the potential change in net1 is small compared to the operating voltage of the circuit block 300 so that its functioning is not influenced noticeable due to the slight change in its operating voltage. The rise of the potential on the network node net2 is sufficient in order to switch Qn5 to conduct so that a LOW signal is produced at the output 312 of the Schmitt trigger 310.

Thus the output 312 of the Schmitt trigger is HIGH as long as the power consumption of the circuit block 300 does not exceed a certain threshold, i.e. IDD<I3−I2, and is LOW for the error case, i.e. IDD>I3−I2. At the same time, a nearly identical supply voltage of Vsup−Uref1−|Ugs(Qp3)| and Vsup−Uref2−|Ugs(Qp4)|, respectively, remains in both operating states so that the circuit block 300, even in the case of an increased power consumption, is supplied with a sufficient voltage in order to keep its functionality.

Figure 11:
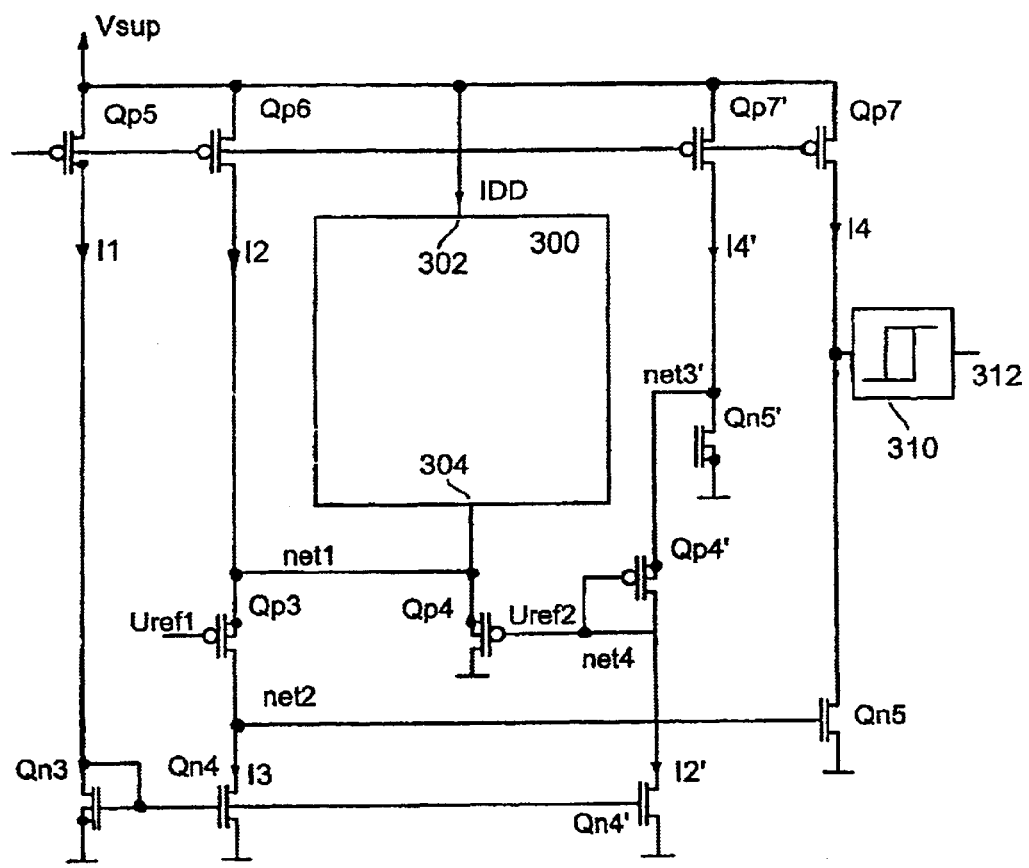
FIG. 11 is a circuit diagram of a second embodiment of an inventive current watch circuit.

The circuit shown in FIG. 10 can be realized especially easily for the following case: Uref1=Uref2=0 V and $(W/L)_{Qp3} > (W/L)_{Qp4}$. In this case no circuit parts for producing the reference voltage Uref1 and Uref2 are required. In the IDD error case, the potential at the node net2 only rises to a voltage of about Ugs(Qp4). Qn5 is only conductive when it is ensured that the threshold voltage of the nMOS transistor Qn5 is smaller than the absolute value of the threshold voltage of the pMOS transistor Qp4. In some CMOS/ BiCMOS technologies, this can be realized easily, which is not true in others. If the condition mentioned above cannot be realized easily, it is preferred to set Uref1 to 0 V and Uref2 as follows: Uref2=Ugs(Qn5)−|Ugs(Qp4)|, Ugs representing the gate-source voltage of the respective transistor. A circuit for realizing this is shown in FIG. 11. The circuit includes 2 more pMOS transistors Qp4' and Qp7'. In addition, the circuit includes two further nMOS transistors Qn4' and Qn5'.

The nMOS transistor Qn5' is connected as a diode, the drain of which being connected to the supply voltage Vsup via the pMOS transistor Qp7'. The pMOS transistor Qp7' is connected in analogy to the transistors Qp5, Qp6 and Qp7. The source of Qn5' is connected to ground, while drain and gate of it are connected to each other and to the source of the pMOS transistor Qp4'. The pMOS transistor Qp4' in turn is connected as a diode, wherein gate and drain of it are connected to the gate of Qp4 and the drain of Qn4'. The gate of Qn4' is connected to that of Qn4. The source of Qn4' is connected to ground.

Since Qn5' is connected as a diode, the potential Ugs (Qn5') is present at the node net3'. Since Qp4' is also connected as a diode, the following also applies: Uref2= Ugs,n(Qn5')−|Ugs(Qp4')|. In the circuitry shown the current I2' through Qn4' must be smaller than I4'. At the network node net1, the following potential appears: Ugs(Qn5')−|Ugs (Qp4')|+|Ugs(Qp4)|=Ugs(Qn5'). In the IDD error case, the potential at the circuit node net2 rises to about net1=Ugs (Qn5') so that it is ensured that Qn5 is switched on. In the case Uth,n<|Uth,p|, Uth,n being the threshold voltage of the nMOS transistor Qn5, while Uth,p is the threshold voltage of the pMOS transistor Qp4, the potential at net4 goes to about 0 V, net2 to about |Ugs(Qp3)|, which is sufficient to switch on Qn5.

Figure 12:
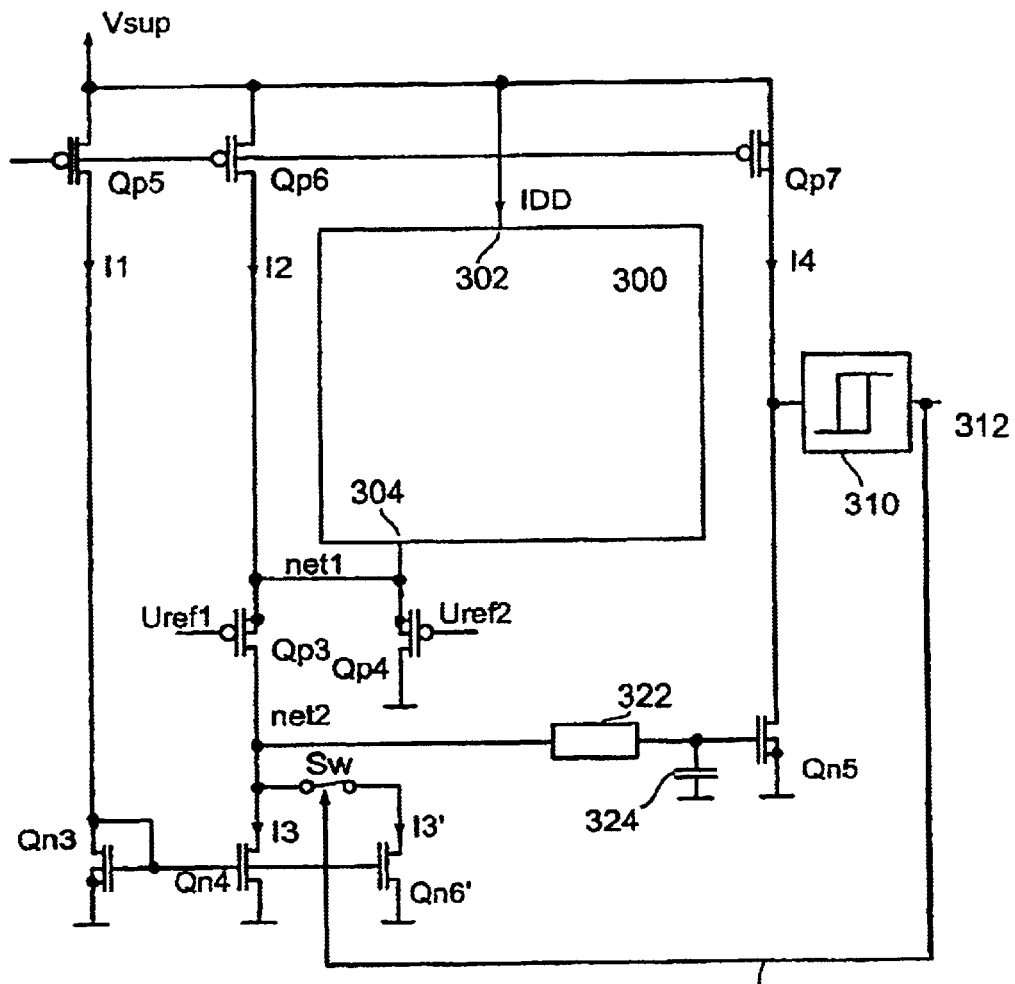
FIG. 12 is a circuit diagram of a third embodiment of an inventive current watch circuit.

If dynamic switching processes take place in the circuit block 300, its power consumption is super-imposed by large current impulses. In this case the error signal at the output 312 of the Schmitt trigger 310 should not switch at each such current impulse. A circuit for producing a hysteresis in order to avoid a bouncing of the signal at the output 312, especially when IDD comprises high frequency ripples or transient switching pulses, is shown in FIG. 12.

This circuit includes an additional nMOS transistor Qn6' connected between a switch Sw and ground, the gate of Qn6' being connected to that of Qn4. When the switch Sw is closed, the nMOS transistor Qn6 draws a current I3'. As long as a high logic level is present at the output 312, i.e. no IDD error case has occurred, the current IDD must be greater than I3+I3'−I2 in order to toggle the output signal at the output 312 to a low logic level LOW. As soon as the level at the output 312 is LOW, the switch is opened as is schematically shown by a control line 320 in FIG. 12. The current IDD must now become smaller than I3−I2 in order to effect a transition to a high logic level HIGH at the output 312. Thus smaller ripples of the current IDD are faded out provided they have amplitudes under I3'. The parasitic influence of high frequency transients in the current IDD is, in the circuit of FIG. 12, reduced by a filter having a resistance 322 and a capacitor 324 and being connected between the circuit node net2 and the gate of the nMOS transistor Qn5.

In the embodiments described above, the body of the transistors Qp3 and Qp4 is placed at the sources of them. This can be recommended particularly because the gate-source voltage of Qp3 and Qp4 then remain as small as possible and thus the supply voltage of the circuit block 300 differs only slightly from Vsup. If, however, the body potential of pMOS transistors cannot be selected freely, because, for example, only a single-well technology is available in which the pMOS transistor is directly in the n-substrate, the body can also be placed at Vsup. In this case, the gate-source voltage of the transistors Qp3 and Qp4 increases, wherein the supply voltage of the circuit block 300 decreases to the same degree.

In some applications it can be of disadvantage that the circuit block 300 is not at ground but at the circuit node net1. It is possible in such a case to "turn" the current watch circuit, for example, described referring to FIG. 10 "upside down" by placing the negative supply voltage terminal 304 of the circuit block 300 at ground and the positive supply voltage terminal 302 at a node equivalent to net1, at which the sources of two nMOS transistors are which take over the function of the two pMOS transistors Qp3 and Qp4 of FIG. 10.

Figure 13:
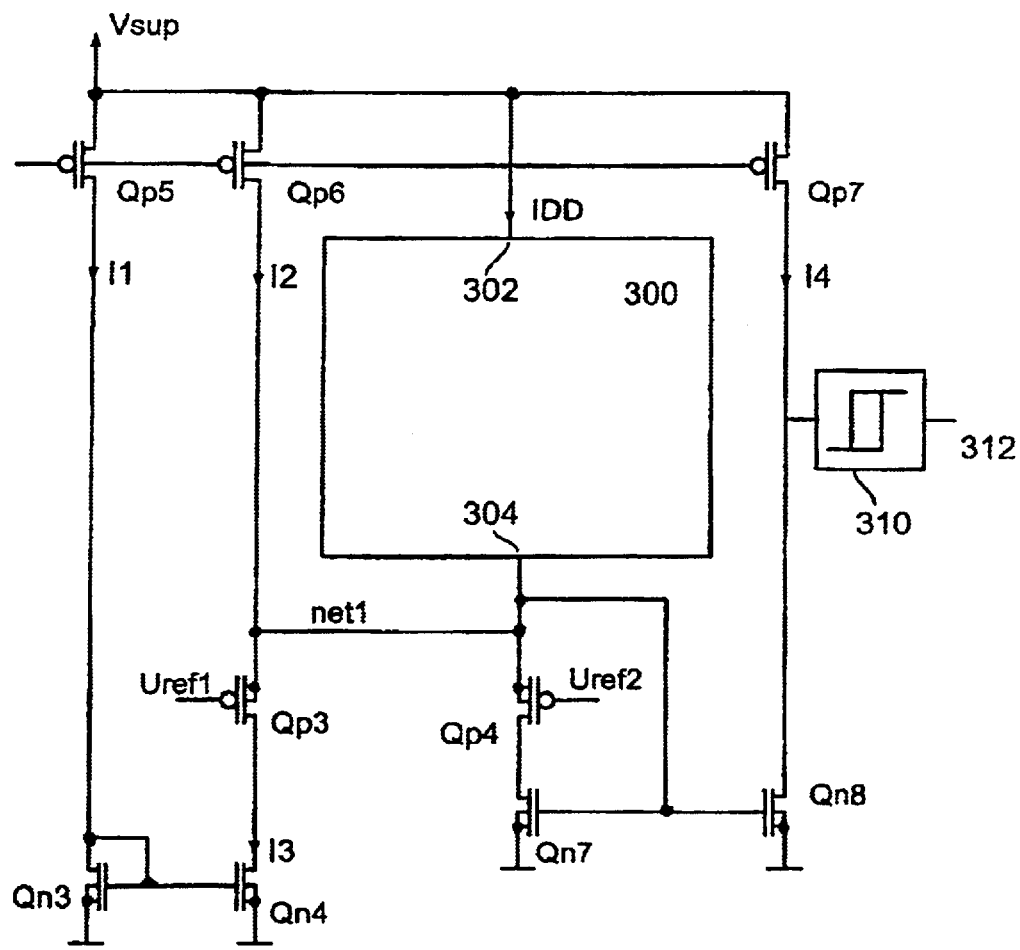
FIG. 13 is a circuit diagram of a fourth embodiment of an inventive current watch circuit.

In the embodiments described above, the output signal has been obtained by switching on or switching off the transistor Qn5 depending on the potential at the circuit node net2. Alternatively, it is possible to measure the current flow through Qp4 and to obtain an output signal from it. A corresponding circuit is shown in FIG. 13 and includes two nMOS transistors Qn7 and Qn8. The drain of Qn7 is connected to the drain of Qp4, the source of Qn7 is at ground and the gate of Qn7 is connected to the gate of Qn8 and also to the circuit node net1. The source of the transistor Qn8 is at ground, while the drain of it is connected to Vsup via Qp7. In addition, the source of Qn8 is connected to the input of the Schmitt trigger 310.

In the detection circuit of FIG. 13, when IDD is larger than I3−I2, the difference current IDD−I3+I2 flows through Qp4 and is coupled out by means of the current mirror formed by Qn7 and Qn8. The gate of Qn7 is thus placed at the circuit node net1, wherein such a wiring is known in literature under the name low voltage current mirror. The gate of Qn7 may alternatively also be connected to the drain of Qn7. In the IDD error case, thus a current (IDD−I3+I2) ·(W/L)$_{Qn8}$/(W/L)$_{Qn7}$ flows via Qn8 towards ground. If this current is larger than I4, the output at 312 of the Schmitt trigger 310 switches to a low level LOW. In the normal case, no current flows through Qp4 and Qn7 so that the drain of Qn8 goes to Vsup and the output 312 of the Schmitt trigger 310 is at a high logic level.

Figure 14:
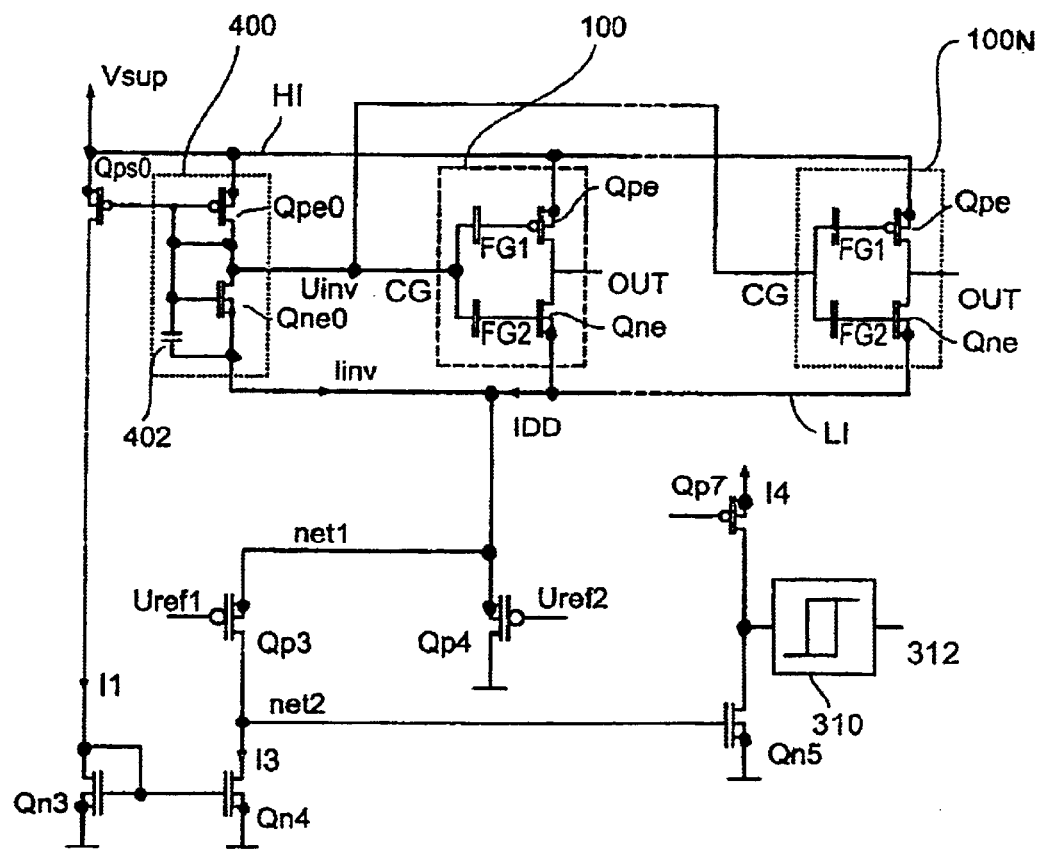
FIG. 14 is a circuit diagram of an inventive current watch circuit when used for a plurality of memory cells.

FIG. 14 shows an application of the inventive current watch circuit for a CMOS-EEPROM.

As an example of a plurality of memory cells, two memory cells 100 and 100N are shown in FIG. 14. Each of the CMOS-EEPROM memory cells 100, 100N has the set-up described above. The first terminals of the CMOS-EEPROM memory cells are connected to the line HI. The second terminals of each memory cell are connected to the line LI. Via the line HI, the supply voltage potential Vsup can be applied to the first terminals of the memory cells. The line LI is connected to the circuit node net1. In addition, in FIG. 14, an EEPROM-BIAS cell 400 comprising a pMOS transistor Qpe0 and an nMOS transistor Qne0 and a capacitor 402 is connected to the circuit node net1. More precisely, the source of Qne0 is connected to the circuit node net1, while the source of Qpe0 is connected to the line HI. The gate of Qpe0 is connected to the gate of a pMOS transistor Qps0, the source of which is connected to Vsup and the drain of which provides the current I1 for the inventive current watch circuit.

Preferably, the size of the transistors (W/L) Qne0 and Qpe0 is identical to the size of the transistors Qpe and Qne. Thus, the transistors Qpe0 and Qne0 connected as diodes can be regarded as an EEPROM cell which has not been programmed and in which the input and the output are short-circuited. Thus, the transistors Qne0 and Qpe0 provide the optimum read voltage for the EEPROM cell 100.

The transistors Qpe0 and Qne0 form a CMOS inverter the input of which is short-circuited to its output. Thus a center potential Uinv forms since the output of the inverter of Qpe0 and Qne0 cannot decide between HIGH and LOW. The output of the inverter being at the potential Uinv is connected to the control gate GC of the memory cells. In order to suppress oscillating tendencies of the feedback structure in the EEPROM-BIAS cell 400, the sufficiently large capacity 402 is connected between gate and source of Qne0 and thus between the circuit node net1 and the control gates of the memory cells. Alternatively, a corresponding capacitor can be connected between the output at which there is the potential Uinv and ground.

In the above structure, a cross current Iinv flows to the circuit node net1 via Qpe0 and Qne0. A part of it is coupled out by the pMOS transistor Qps0 and fed to the current mirror formed of the transistors Qn3 and Qn4. The mirror ratios are thus selected such that the current I3 is only slightly larger than the current Iinv. Thus, in the normal case, the circuit node net2 is at 0 V, the transistor Qn5 blocks and the output 312 of the Schmitt trigger 310 is at a high logic level.

In case a floating gate FG1 or FG2 of one or several originally blocking CMOS memory transistors Qpn and Qpe loses charge, an additional current IDD flows from Vsup to the circuit node net1 via the cell or cells concerned. As soon as Iinv+IDD becomes larger than I3, the circuit node net2 goes to about |Ugs(Qp3)|+Uref1 and thus switches Qn5 on so that the output 312 of the Schmitt trigger 310 goes to a low logic level. Thus the circuit recognizes the loss in charge in the EEPROM memory, but still supplies the EEPROM cells with an almost unchanged supply voltage so that the logic level at the outputs OUT of the individual memory cells is kept error-free. The reason for this is that the originally blocking transistor loses charge and thus becomes conductive, but the originally conductive transistor still conducts much better so that the output potential on the lines OUT remains unchanged.

In case a charge is only lost at the floating gates which are associated to originally conducting CMOS transistors, this charge loss is not detected since it does not result in a cross current from Vsup to the circuit node net1. This charge loss, however, is not critical since it is does not impede the logic level at the output OUT of the memory cells.

Since the voltage Uinv described above represents the switching point of an uncharged CMOS-EEPROM memory cell, this voltage represents the reading voltage described referring to FIG. 2b. The cross current Iinv has an order of magnitude of about 10 μA.

Figure 15:
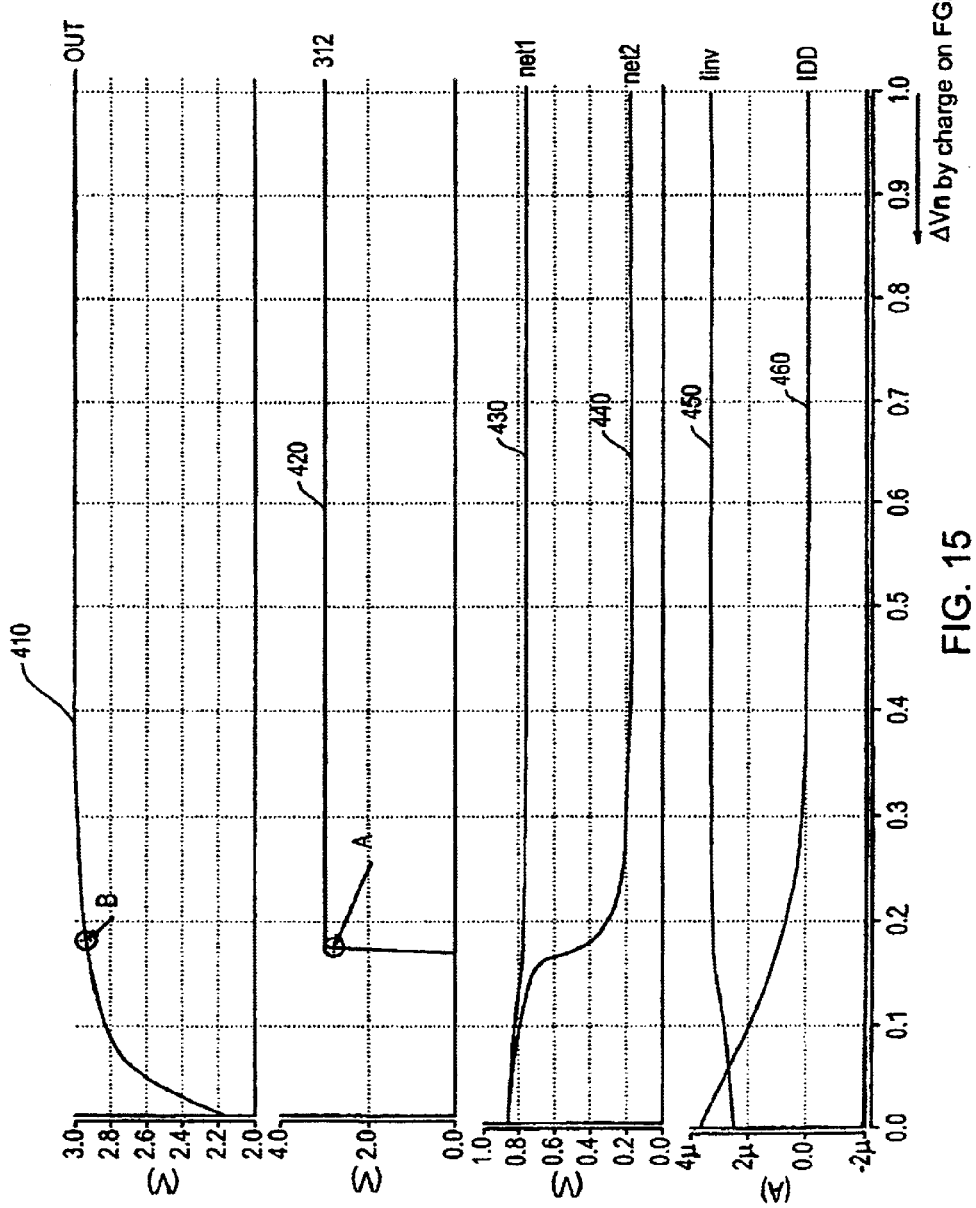
FIGS. 15 and 16 are diagrams showing waveforms occurring in an inventive current watch circuit.
Figure 16:
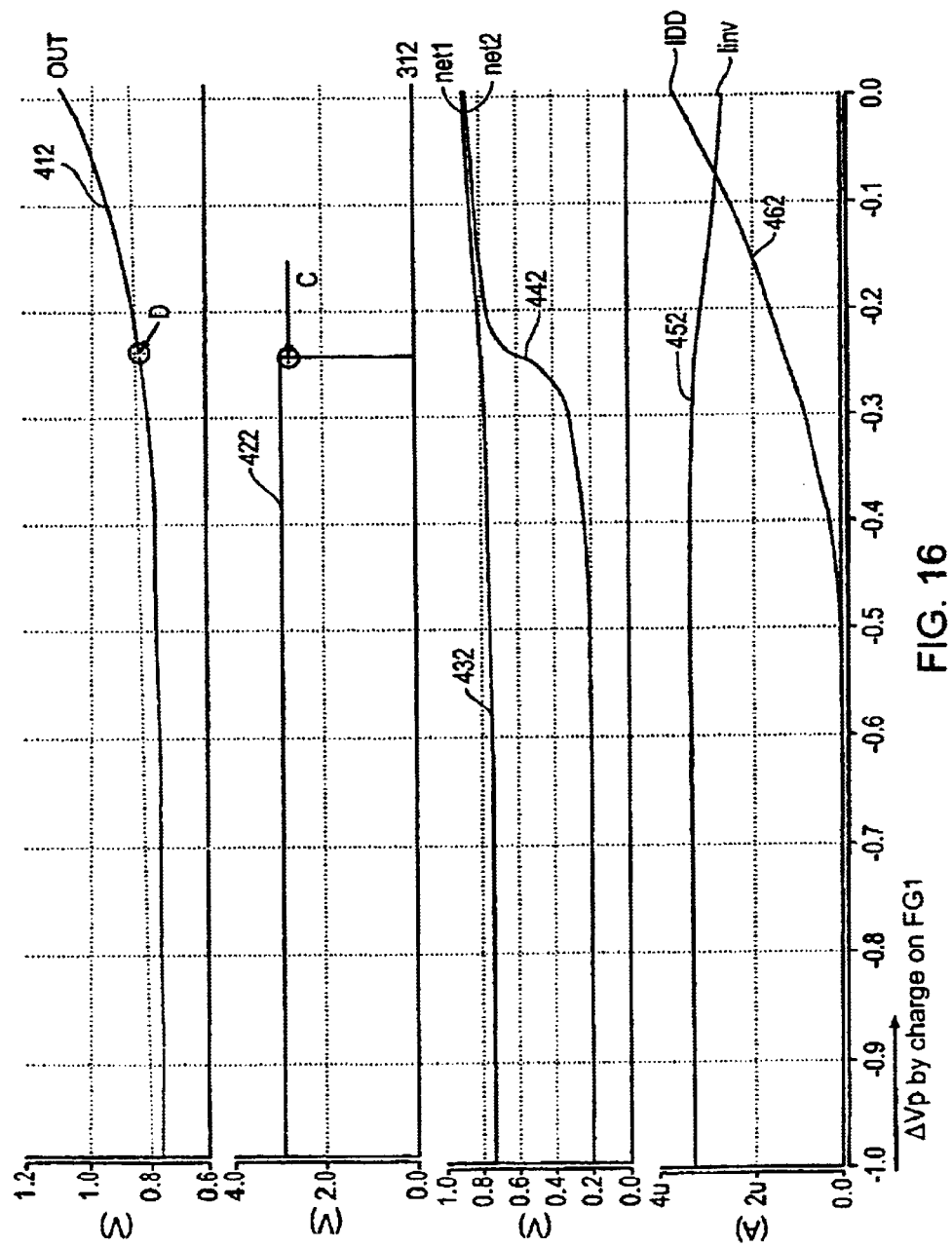

Referring to FIGS. 15 and 16 simulation results will be discussed subsequently, which are obtained using a circuit as is shown in FIG. 14 but with only one EEPROM memory cell. These simulation results show that an IDD error is indicated at the output 312 of the Schmitt trigger 13 long before the bit of the CMOS-EEPROM cell toggles erroneously. In addition, the following cases can be differentiated.

On the floating gates FG1 and FG2 a negative charge has been stored so that when Uinv is applied to the control gate the nMOS transistor Qne blocks and the pMOS transistor Qpe conducts. When a storage charge is lost at FG1, the pMOS transistor Qpe conducts less, but still conducts even when the entire storage charge at FG1 has disappeared. Since at the same time the nMOS transistor Qne blocks, neither the power consumption of the EEPROM cell nor the logic level at the output OUT changes.

The considerably more critical case arises when a storage charge is lost at the floating gate FG2 of the at first blocking nMOS transistor Qne since it finally starts to conduct. Since the pMOS transistor Qpe also conducts, a cross current starts to flow.

FIG. 15 illustrates simulation results for this case. The curve 410 illustrates the potential at the output OUT, the curve 420 represents the potential at the output 312 of the Schmitt trigger 310, the curve 430 represents the potential at the circuit node net1, the curve 440 the potential at the circuit node net2, the curve 450 the current Iinv and the curve 460 the current IDD. The curves represent the respective waveforms versus a decreasing voltage offset ΔVn effected by decreasing charges on the floating gate FG2 of the nMOS memory transistor. Thus ΔVn has been swept from 1.0 V to 0.0 V. In addition, a state has been taken as the basis for the simulation, in which on the floating gate FG1 of the pMOS memory transistor only a small charge has been stored so that the voltage offset ΔVp effected by this is 50 mV.

As can be seen from curve 450, the current IDD increases with a decreasing ΔVn, until finally at a point A (curve 420) the signal at the output 312 of the Schmitt trigger 310 switches to a low logic level. This takes place at a ΔVn of about 160 mV. The output OUT, with this ΔVn, is still at a level of about 2.9 V, as is shown by the point B on the curve 410. The current watch circuit detects the charge loss on FG2 already at a ΔVn of 160 mV, while the logic level of the output OUT of the EEPROM memory cell only toggles when the floating gate FG2 of the nMOS memory transistor has discharged completely, wherein it is assumed that a voltage of 2.1 V at the output of the CMOS-EEPROM cell 100 can no longer be detected as HIGH, with a supply voltage Vsup of 3 V in this example. The inventive current watch circuit thus detects the IDD error long before the memory cell toggles to the wrong logic value.

Now the second case is to be considered, in which a positive charge has been stored on the floating gates so that when the voltage Uinv is applied to the control gate CG the nMOS transistor conducts while the pMOS transistor blocks. When a storage charge from the floating gate FG2 is lost, the nMOS transistor conducts less but is still conductive even when the entire storage charge on FG2 has disappeared. Since the pMOS transistor Qpe blocks at the same time, neither the power consumption of the EEPROM cell nor its logic level at the output OUT changes. The considerably more critical case arises when a storage charge at the floating gate FG1 of the first blocking pMOS transistor Qpe is lost because it finally starts to conduct. Since the nMOS transistor Qne also conducts, a cross current starts to flow.

The simulation of this more critical case is shown in FIG. 16, wherein the curve 412 shows the potential at OUT, the curve 420 shows the potential at the output 312 of the Schmitt trigger 310, the curve 432 shows the potential at the circuit node net1, the curve 442 shows the potential at the circuit node net2, the curve 452 shows the current Iinv and the curve 462 shows the current IDD. The curves show the respective signals at a decreasing voltage offset ΔVp caused by charges on the floating gate FG1, wherein ΔVp has been swept from −1.0 V to 0.0 V. In addition, a state has been the basis for the simulations, in which at the floating gate FG2 of the nMOS transistor only a small charge was stored so that ΔVn was 50 mV.

As is shown in FIG. 16, the Schmitt trigger switches at a ΔVp of about −250 mV. This is shown by the point C of the curve 422 in FIG. 16. At this point, there is still a voltage level of about 0.8 V at the output OUT of the CMOS-EEPROM memory cell, see point D on the curve 412. The logic level at the output OUT of the EEPROM cell does not even toggle at a completely discharged FG1, i.e. ΔVp=0.0 V, since even in this case the voltage at the output OUT is only 1.1 V. Thus it is assumed that a voltage below 1.5 V at the output OUT of the CMOS-EEPROM cell can be detected as a low logic level. Even in this case, the inventive current watch circuit thus detects an IDD error long before the memory cell actually outputs a wrong value.

After having described embodiments of inventive current watch circuits, a modified non-volatile memory cell will be discussed subsequently, which can, for example, be realized using the inventive CMOS-EEPROM cell described in the beginning. The memory cell described subsequently can, however, also be realized using conventional nMOS-EEPROM memory cells.

The modified non-volatile memory cell, as will be described subsequently, is to meet the following requirements: the memory cell should have some redundancy, wherein the evaluation of the redundancy is to take place in the cell so that no change of the data stored can be seen from outside when one of the redundant elements is affected. It should also be possible to read out the cell without requiring complex sense amplifiers so that it can especially be applied in applications in which a large part of the data must be available in parallel. In addition, it should be possible to read out the memory cell without control signals serving to set a working point for the operation of the memory cell, wherein a high reading speed should also be obtainable. In normal operation the memory cell should not consume a static power, wherein the memory cell should additionally offer the possibility of a diagnosis of charge losses, which allows a safe error diagnosis function long before the memory contents is lost.

In the CMOS-EEPROM memory cells described above, the production of the reading voltage to be applied to the control gate required a static current which, in the source for the reading voltage, leads to a static power loss. In addition, the reading voltage to be applied must be available for each individual memory cell, which is no problem in a memory matrix. If, however, smaller EEPROM blocks are to be used on a chip at several different locations in order to file calibration coefficients for a sensor system or to configure circuit functions in a programmable way, the reading voltage must either be distributed over the entire chip with the help of a suitable driver or a reading voltage source must be associated to each EEPROM block. In both cases the power loss when providing the reading voltage increases further.

Although no reading out amplifier is required in the CMOS-EEPROM memory cell described above, since, in the programmed state, the cell, equal to a CMOS inverter, provides a logic HIGH or LOW level, a non-digital level is always required for evaluating, which in this case corresponds to have the operating voltage. Even in this cell there remains the problem of the static power consumption of the control circuit. In addition, the maximum allowed noise or parasitic voltage which is allowed to be applied to the control gate of such an EEPROM cell corresponds to maximally the larger of the threshold voltage shifts by the charges stored on the floating gates of the two EEPROM transistors involved. This allowed parasitic voltage thus decreases towards 0 with an increasing discharge caused by age. Thus the probability of a disturbance-induced error of the memory cell increases significantly with an increasing operating life and limits the maximum safe operating life of the EEPROM to a value smaller than the charge conservation time. In addition, the disturbance sensitivity of the potential at the control gate of the EEPROM increases, the higher the interior resistance of the reading voltage source is, which in turn represents a limit when minimizing the power consumption of this source.

The problems mentioned above of the CMOS-EEPROM memory cell can be solved by coupling the output of it to the input of a CMOS inverter, the output of the CMOS inverter in turn being coupled to the input terminal of the memory cell.

Figure 17A:
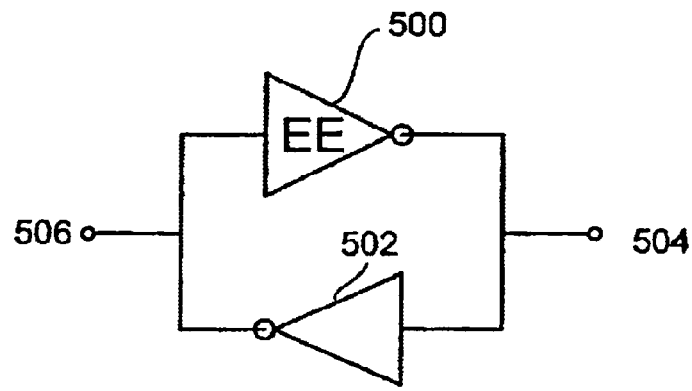
FIGS. 17a to 17c are embodiments of a modified embodiment of an inventive memory cell.

Such an arrangement is shown in FIG. 17a, where the output of an EEPROM memory cell 500 is connected to the input of a CMOS inverter 502, the output of which is in turn connected to the input of the memory cell 500. The entire memory cell formed in this way has a memory cell output 504 connected to the output of the EEPROM cell 500 and to the input of the inverter 502 and a memory cell input 506 connected to the input of the EEPROM cell 500 and to the output of the inverter 502.

The cell shown in FIG. 17a consists of two nMOS transistors and two pMOS transistors of which at least one transistor as an EEPROM transistor is provided with a floating gate. This at least one transistor can be set up in one of the ways described above referring to FIGS. 20a and 20b. One nMOS transistor and one pMOS transistor each are connected to form a CMOS inverter. As has been described, the input of the one inverter is connected to the output of the respective other one so that a positive feedback arises as is used in a latch or a static RAM memory cell. Such positive-feedback memory cells have two stable working points at which one output and thus also the opposite input each are at a logic HIGH level, while the other one is at a logic LOW level.

With this inventive cell, the stable working point adjusts itself, depending on the programming of the floating gate, corresponding to the positive or negative charges stored thereon. Even small charges on the floating gate are thus sufficient in order to bring the positive-feedback inverter to a stable working point. Depending on the charge stored on the floating gate of the EEPROM transistor, there is thus a defined logic level at the output 504 of the cell, which can be read out without applying a reading voltage to the input 506 of the cell. Put differently, in the positive-feedback memory cell described, which is shown in FIG. 17a, a state automatically arises, in which the control gate of the floating gate transistors involved is provided with a control voltage amplifying the effect of the switching state of the floating gate transistor caused by the charge stored on the at least one floating gate.

Figure 17B:
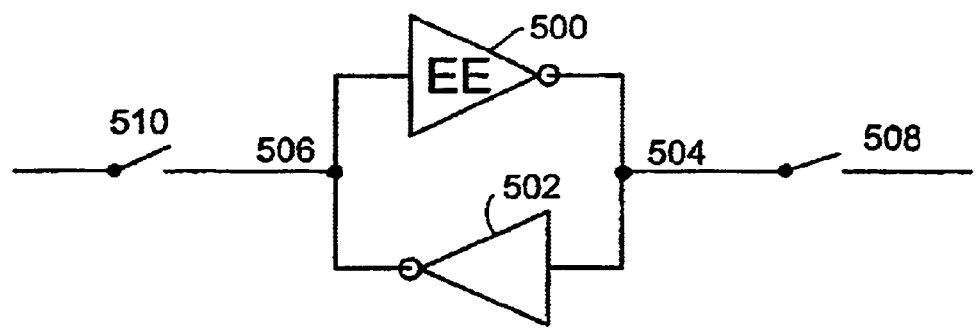
Figure 17C:
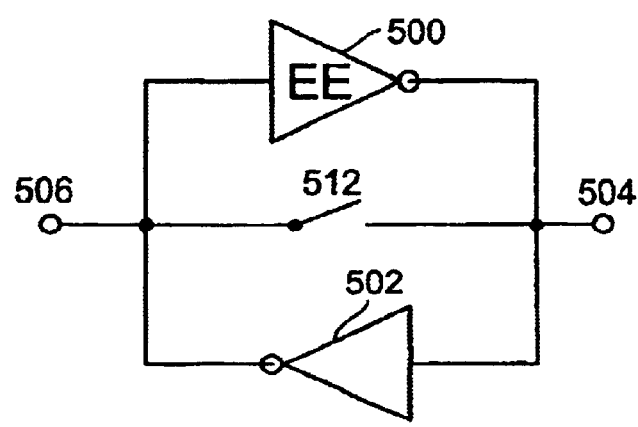

In FIG. 17b, a positive-feedback memory cell according to FIG. 17a is shown, in which at the output 504 an addressing switch 508 is provided, and in which an addressing switch 510 is provided at the input 506. In addition, in FIG. 17c an embodiment of an inventive positive-feedback memory cell having a reset switch 512 is shown, by which the output 504 of the positive-feedback cell can be connected to the input 506 of it. Thus a power-on-reset can be performed by closing the switch 512.

Figure 18:
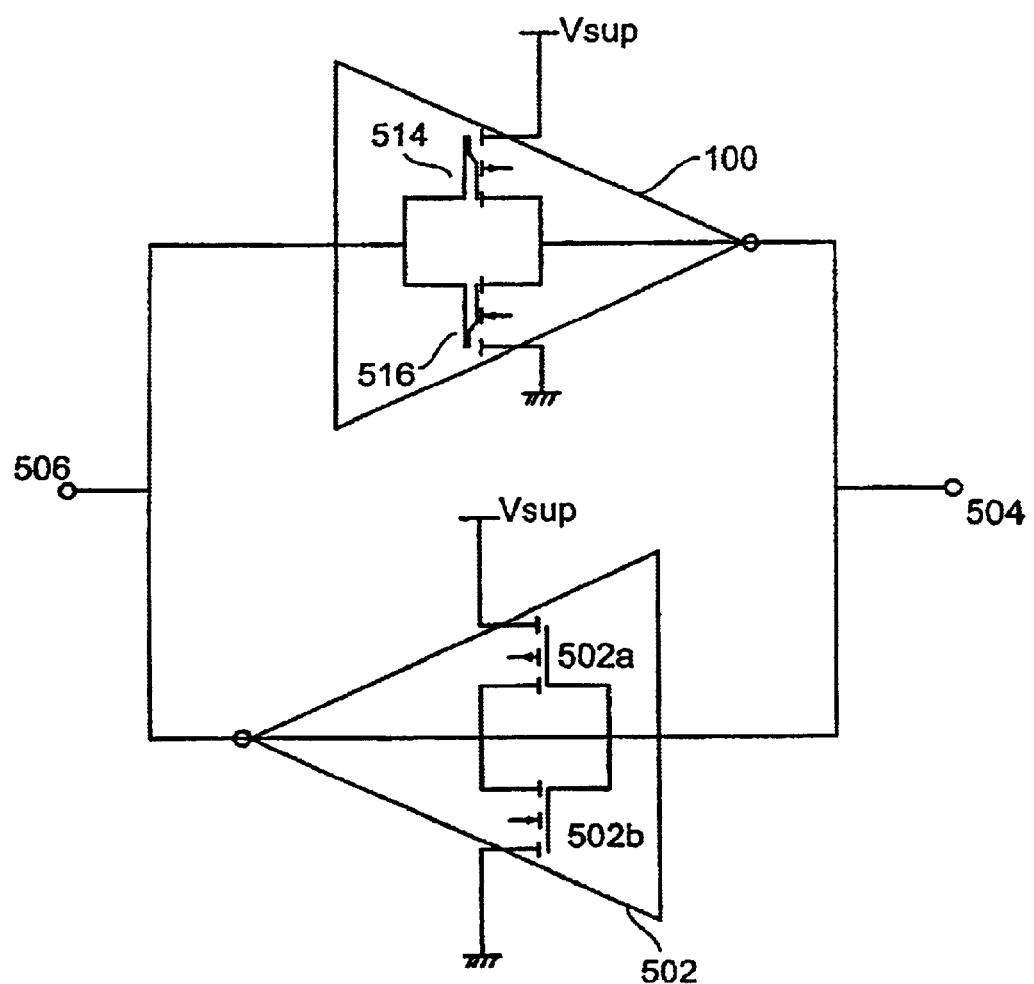

In FIG. 18, an embodiment of an inventive positive-feedback memory cell using a CMOS-EEPROM cell 100 described above and a conventional CMOS inverter 502 is shown. The inverter 502, in a conventional way, comprises a pMOS transistor 502a and an nMOS transistor 502b. As has been described above referring to FIGS. 20a and 20b, both conventional floating gate transistors 514 and 516, as are shown in FIG. 18, as well as those having a separated capacitor, as are, for example, shown in FIG. 4 or 14, can be used according to the invention.

Figure 19:
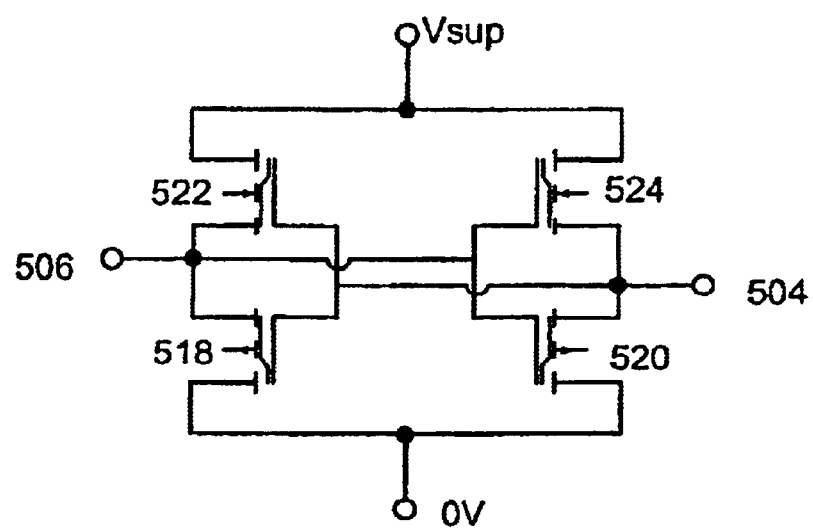
FIG. 19 is a circuit diagram of a further embodiment of an inventive memory cell.

In FIG. 19, an embodiment of a positive-feedback EEPROM memory cell is shown, in which both inverter structures are realized by floating gate transistors. This structure includes two pMOS floating gate transistors 518 and 520 and two nMOS floating gate transistors 522 and 524. The transistors 518 and 522 form a first inverter and the transistors 520 and 524 form a second inverter. The input of the first inverter is connected to the memory cell input 506 and to the output of the second inverter. The output of the first inverter is connected to the input of the second inverter and to the output of the memory cell 504.

In the inventive positive-feedback memory cell it is sufficient that one of the transistors used is a floating gate transistor. Alternatively, two, three or four of the transistors used can be floating gate transistors which are connected in the way described. By a corresponding programming or erasing, respectively, in the connection shown, respective charges are applied to the floating gate or the floating gate of the memory cells, by which the control gate of the floating gate transistors involved is provided with a control voltage amplifying the effect of the switching states of the floating gate transistors effected by charges stored. Lines or arrays of positive-feedback EEPROM memory cells can be formed by a corresponding connecting in parallel of a plurality of such cells.

The positive-feedback EEPROM memory cell described has a number of advantages. No control voltage for reading out the memory cell is required, which is why the source required for producing the voltage is omitted and the memory formed of such cells no longer has a systematic-static power consumption. Such a memory is thus predestined for being used in low voltage circuits which are, for example, intended for a battery operation. The parasitic voltage allowed at the control gates is increased compared to standard EEPROM architectures by the operating voltage of the EEPROM and no longer decreases towards 0 in an increasing discharge of the floating gates, but towards the operating voltage. The output resistance of the EEPROM cell is determined by the switched-on floating gate transistor, the gate-source voltage of which is additively made up of the control voltage and the interior gate-source voltage caused by a charge stored on the floating gate, wherein both voltages have the same sign. Thus the gate-source voltage at the switched-on transistor is higher by the absolute value of the interior gate-source voltage of the floating gate transistor than is the case in a CMOS inverter. This means that with the same transistor size, the output resistance of the memory cell is smaller than that of an inverter.

The positive-feedback cell can be formed of two completely identical CMOS-EEPROM inverters, as is shown in FIG. 19, and is thus symmetrical and can be read out differentially.

Disturbances which may lead to an erroneous reading out of the memory cell are less likely than disturbances in a standard CMOS logic. The inventive positive-feedback cell can additionally be read out with at least the speed of a normal CMOS logic. In addition, the positive-feedback cell is directly compatible with a standard CMOS logic since its output provides full CMOS levels so that no reading out amplifiers or level shifters are required. The cell can be used in a decentralized way in small memory units of a few bits, since it only requires additional hardware for programming and not for reading out. In addition, the cell can be made up of up to four independent floating gate transistors and thus allows the integration of a maximum fourfold redundancy which is evaluated by the circuit without requiring an additional evaluation hardware for the redundant information.

The memory circuit described above and those embodiments, which will be described in the following, may be used for integrated circuits (ICs). A number of ICs in security relevant applications require programming. It is for example necessary to provide such high quality integrated circuits (airbag triggering Ics, for example) with a unique identification code so that, in case of an error, back tracing can be guaranteed. If a module fails due to bad production quality it will be possible to find out at least any other modules of the same production lot so that candidates of potential risk can be returned. In integrated sensors in the automotive field it is desired to calibrate the sensors after same have been mounted (in the module), so that manufacturing tolerances of the mounting can be accommodated. In operation, such sensors are subjected, at least in part, to substantial temperatures of up to 200° C. The programmed calibration data have to withstand such operating conditions.

In operation, some Ics are at inaccessible locations so that same have to communicate with a central unit in a wireless manner. One example for such ICs is a tyre pressure sensor, which is along with its battery mounted in the interior of the tyre. Data indicating the tyre pressure are transmitted in a wireless manner from the rotating tyre to a receiving unit mounted to the chassis of the vehicle. The receiving unit has to associate the data to the proper transmitter in case two vehicles are adjacent to each other in front of a traffic light, for example. In order to avoid confusions in such a case, the data have to be transmitted always along with an identification code (ID code).

In all of the above cases, it is important that the data storage/programming is as secure as possible. The error probability has to be as low as possible. The error probability is the probability that, during operation within the guaranteed lifetime and within the guaranteed operating conditions, a bit is interpreted (read out) in a wrong manner. The guaranteed operating conditions include a temperature region, operating voltages, media compatibility, moisture, mechanical stress, vibrations, EMV, ESD, etc. Sometimes, error probabilities of Pe(memory)=0.1 ppm are required for the whole memory of a module. This means that during the operation only one bit of 10 million modules may fail. Since the memory of security relevant modules includes commonly about 100 Bits, it follows for the error probability of one bit: Pe(bit)=Pe(memory)/number of bits=1 ppb=$10^{-9}$.

For storing data in an IC, there are a number of possibilities. The present invention relates to a storage making use of non-volatile memory cells, so-called EEPROMs. When programming EEPROMs, charge is stored at the floating gate of the EEPROM. If this charge is lost the programming will be lost. Loss of charges can be caused by damages of those dielectric layers insulating the floating gate from its environment. These damages occur in a statistical manner at low probability. In order to make the storage more secure, it is possible to incorporate redundancy.

One possibility of incorporating redundancy is to encode the information to be stored to more bits than necessary for the information content. This technique is known as error coding. The principle of forward error codings (FEC) permits not only to discover faulty bits but also to correct them. A simple example is a memory the bits of which are arranged logically in a matrix form and wherein the columns and rows are supplemented with parity bits. If a bit in the matrix toggles, the parity bits of this row and column indicate the position of the bit. By inverting the indicated bit, the value can be corrected to the original programming value. These methods are, however, disadvantageous in that additional memory cells are necessary in order to store the parity bits, or the redundant bits in general. Thus, more than the minimum chip area is necessary, whereby the manufacturing costs are increased.

As a second possibility of redundancy, the memory cell can be provided with more than one floating gate. Thus, by a smart design, the cells can be implemented having an unchanged output state even if the storage charge at one floating gate is lost. Such a design is possible since more than one floating gate is used. Compared to error coding such an approach requires a reduced area since the EEPROM elementary cell has a low required area only when compared to the associated control circuitry (including high voltage MOS transistors). Thus, it is advantageous to obtain redundancy by additional small floating gates whereas the control circuitry can be upheld unchanged.

In the following, the term "EEPROM elementary cell" will be used, which refers to a non-volatile memory cell without the control circuitry thereof. Parts of the EEPROM elementary cell are the control gate, the respective floating gates and the associated MOS transistors. In the following, the term EEPROM cell is intended to designate an EEPROM elementary cell plus the control circuitry associated to each individual cell. Thus, the circuitry shown in FIG. 2a represents an EEPROM elementary cell, whereas the circuitry shown in FIG. 4 represents an EEPROM cell.

Figure 21:
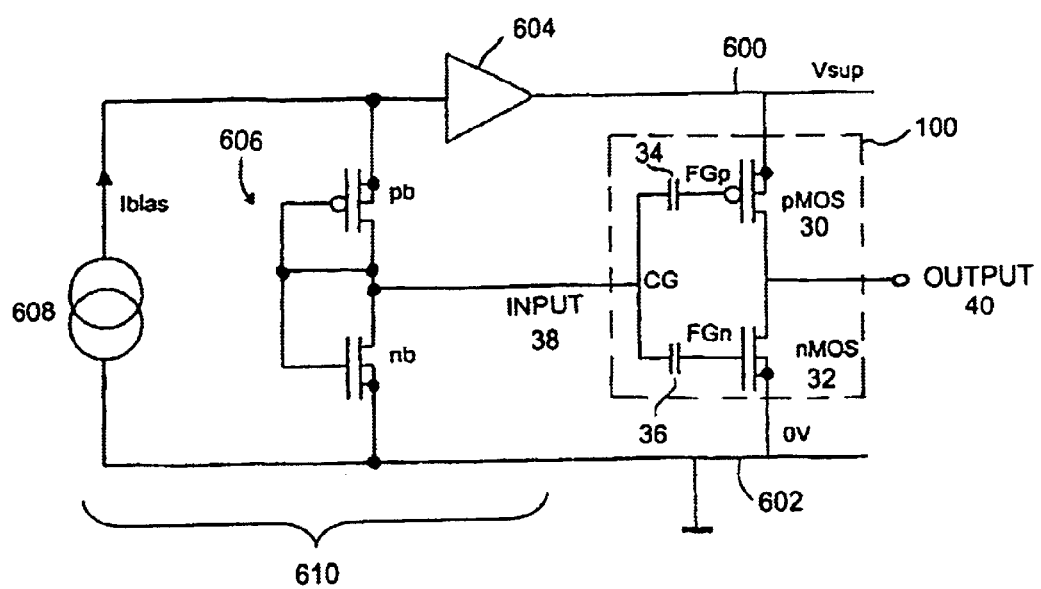
FIG. 21 is a circuit diagram for illustrating an embodiment of providing a read voltage.

The non-volatile memory cell shown in FIG. 2a is redundant with respect to some charge loss mechanisms, it is not redundant with respect to all error cases, which can be thought of. An embodiment of such an EEPROM elementary cell 100 is, once again, shown in FIG. 21 along with a control circuitry for generating a supply voltage between supply lines 600 and 602 and a read voltage at the input 38. The control circuitry includes an impedance converter, buffer 604, two transistors connected as two stacked diodes 606 and a current source 608, which are connected as shown in FIG. 21. The stacked diodes 606 and the current source 608 form the circuitry 610 for generating the supply voltages and the read voltage. The stacked diodes 606 include a pMOS transistor pb and an nMOS transistor nb. The pMOS transistor pb and the nMOS transistor nb are preferable identical to the pMOS transistor 30 and the nMOS transistor 32 with respect to the W/L ratio thereof.

During the read mode, a supply voltage Vsup corresponding to the sum of the gate-source-voltages of pb and nb is applied. The gate-source-voltage of the nMOS transistor nb is applied to the input 38 as a read voltage. In case the memory cell 100 is discharged, i.e. if the potentials at FGn and FGp are identical to the potential at CG, the current flowing through the transistors 30 and 32 will be identical to the current flowing through the transistors pb and nb. In the programmed or erased state, the potentials at FGp and FGn are higher or lower than the potential at CG so that always one of both transistors 30 and 32 will block and, thus, a cross current will not flow between the supply lines 600 and 602 through the transistors 30 and 32.

If the floating gate of the blocking one of the transistors 30 and 32 discharges via the capacitance 34 or 36, respectively, that transistor starts to conduct as soon as the voltage via its electrodes (between CG and FGn or between CG and FGp, respectively) has been fallen below a threshold of approximately some hundred mV, for example. As long as the floating gate of the other transistor has sufficient programming charge, the other transistor will conduct substantially better so that the output signal will still be correct. Nevertheless, the system can detect this critical state since a cross current is already flowing between the supply lines 600 and 602 through the transistors 30 and 32.

If the floating gate of the conducting one of the transistors 30 and 32 discharges via the capacitance 34 or 36 respectively, to the input potential at CG, this transistor will still be a little bit conductive in case the potential at CG is appropriately chosen. The output signal is correct as long as the other transistor remains sufficiently in the OFF state.

If, however, the floating gate of the transistor, which should be conductive in the correctly programmed state, discharges via the gate oxide (GOX) of this transistor to the bulk potential thereof (Vsup for the transistor 30, 0V for the transistor 32), then this transistor will block since the absolute value of its gate-source-voltage will be less than the threshold voltage, which is required for the transistor to conduct. As long as the other transistor (which shall block when working correctly) has enough programming charge stored thereon to block, the potential at the output 40 is undefined: it can be drawn to a HIGH level or to a LOW level by leakage currents though the drains of both transistors 30 or 32 or by EMV disturbances. Thus, the memory cell shown in FIG. 21 is not redundant with respect to this error despite of the double floating gate.

Figure 22:
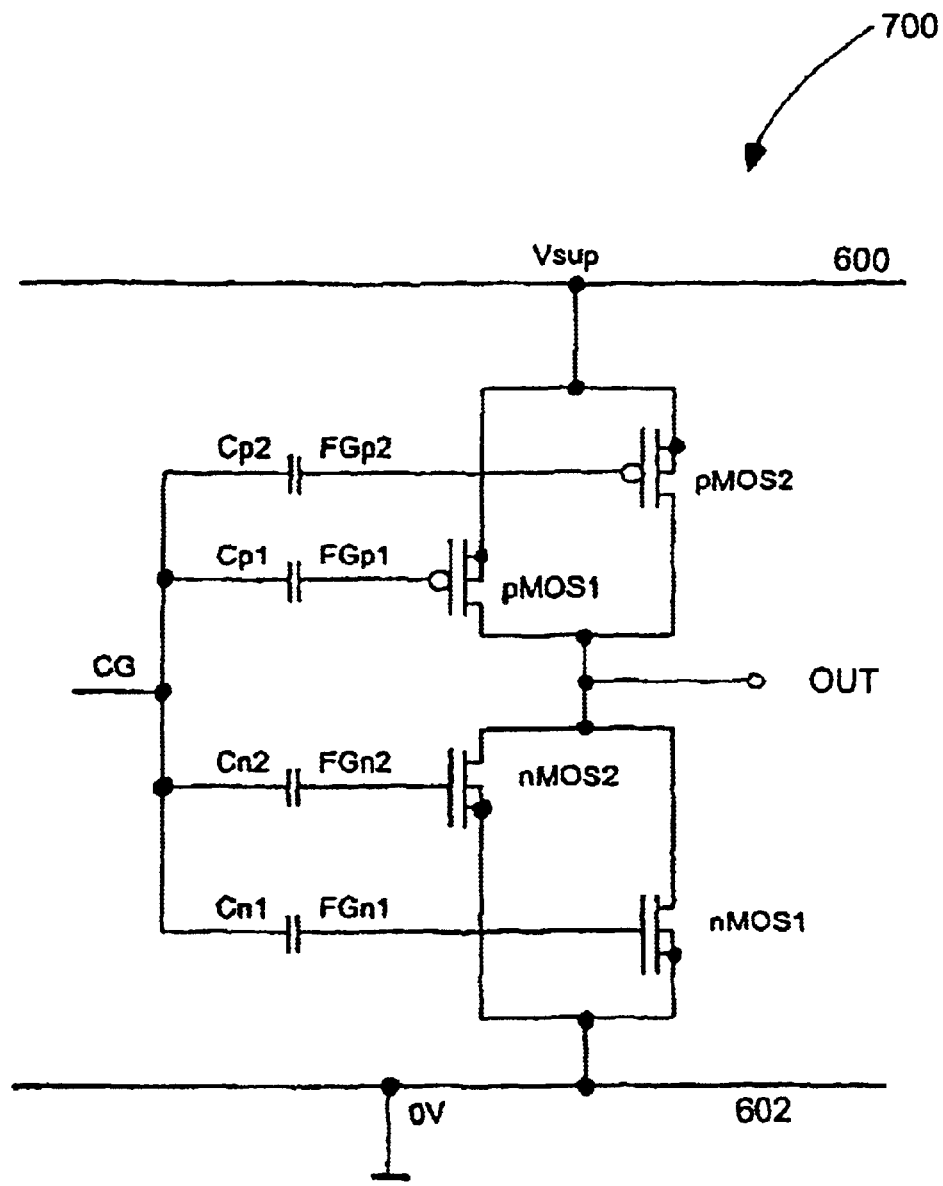
FIG. 22 is a circuit diagram of an embodiment of an inventive memory circuit having further redundancy.

An EEPROM elementary cell, which is redundant with respect to an error case in which discharging via the GOX takes place, is shown in FIG. 22. The circuit shown in FIG. 22 develops from the elementary cell 100 shown in FIG. 21 by connecting two simple EEPROM elementary cells 100 according to FIG. 21 in parallel to obtain a double EEPROM elementary cell 700. The cell 700 comprises a first pMOS transistor pMOS1 and a second pMOS transistor pMOS2. The cell 700 further comprises a first nMOS transistor nMOS1 and a second nMOS transistor nMOS2. Each of the four transistors has a floating gate, FGp1, FGp2, FGn1 and FGn2, respectively. Each of the floating gates is capacitively coupled to a control gate CG via a respective coupling capacitor Cp1, Cp2, Cn1 and Cn2.

The sources of the pMOS transistors pMOS1 and pMOS2 are connected to each other and to a supply line 600. The sources of the nMOS transistors nMOS1 and nMOS2 are connected to each other and to a supply line 602. The drains of the pMOS transistors pMOS1 and pMOS2 are connected to each other and to the output OUT. The drains of the nMOS transistors nMOS1 and nMOS2 are connected to each other, to the drains of the pMOS transistors pMOS1 and pMOS2 and to the output OUT.

According to FIG. 22, two elementary cells according to FIG. 21 are connected in parallel to each other. Alternatively, more than two such elementary cells could be connected in parallel to each other so that the reliability could be further increased.

According to FIG. 22, two elementary cells having floating gates, which are insulated from each other, are connected in parallel to obtain a redundant EEPROM elementary cell. However, in the same manner, the inventive approach can also be applied to other elementary cells, those shown in FIGS. 1a and 1b, for example. Moreover, one could apply this approach to a CMOS EEPROM elementary cell in which the pMOS transistor and the nMOS transistor have a common floating gate, which is connected to a control gate via a coupling capacitance.

The elementary cell 700 shown in FIG. 22 is tolerant with respect to an error condition in which a leakage current path is formed via the GOX of an originally conductive transistor. In case of such a leakage current path, the associated transistor will become OFF. In parallel to this unintentionally blocking (OFF) transistor a second conductive transistor is connected which is sufficient to hold the logic state at the output OUT of the cell as long as the charge state of this second transistor is good enough so that the conductivity thereof is better than the conductivity of both blocking complementary MOS transistors. A detailed explanation of the advantages of the elementary cell shown in FIG. 22 with respect to error tolerance and in comparison to the elementary cell will be given later herein making reference to FIGS. 23 to 26.

The error mechanisms, which can be tolerated by the EEPROM elementary cell 100, are shown in FIGS. 23a to 23d. As indicated by the flashes 800, these are the cases in which a leakage current path is formed via the dielectric of the respective coupling capacitor so that the floating gate concerned takes a potential, which is identical to the potential at the control gate CG. It is preferred to adjust the potential at CG so that both transistors are weak conductive in this error condition. The second transistor in the simple CMOS EEPROM elementary cell operates correctly and is, therefore, either strong conductive or strong blocking, dependent on the programming state. Thus, the logic state at the output OUT does not change due to the weak conductive faulty partner transistor. As a result, the logic state of the output is correct even if one of the coupling capacitors has a short circuit between the electrodes thereof. A suitable read voltage at the control gate can be obtained by the circuitry 610 shown in FIG. 28, for example.

According to FIG. 23a, the cell, i.e. the bit, is programmed to "0" (case 0Cn). A charge loss takes place from the floating gate of the nMOS transistor 32 via the capacitor 36. The output OUT remains stable on LOW as long as an appropriate read voltage is applied to CG.

According to FIG. 23b the cell is programmed to "0" (case 0Cp) and a charge loss takes place at the floating gate of the pMOS transistor 30 via the capacitor 34. In FIG. 23c, the cell is programmed to "1" and a charge loss takes place from the floating gate of the nMOS transistor 32 via the capacitor 36. In FIG. 23d, the cell is programmed to "1" and a charge loss takes place from the floating gate of the pMOS transistor 30 via the capacitor 34. In all cases shown in FIGS. 23a to 23d, the logic state at the output OUT remains stable as long as the read voltage is designed as indicated above.

A possible value for a possibility Pc that a leakage current path is formed in the dielectric of one of the capacitors 34 or 36 shall be assumed to be Pc=0.001, i.e. one of thousand capacitors has such a deficiency during its lifetime. A wrong logic state at the output is obtained when both coupling capacitances 34 and 36 have a leakage current path, which are events statistically independent of each other. Thus, the probability that leakage current paths through both capacitors are formed is Pe1=Pc·Pc=0.000001=1 ppm.

As can be seen in FIGS. 24a to 24d, the simple elementary cell 100 is not redundant with respect to a leakage current path through the gate oxide of one of the transistors thereof. Such leakage current paths are shown by flashes 810 in FIGS. 24a to 24d.

According to FIG. 24a, the cell is programmed to "0" and the GOX of the nMOS transistor 32 is faulty. According to FIG. 24b, the cell is programmed to "0" and the GOX of the pMOS transistor 30 is faulty. According to FIG. 24c, the cell is programmed to "1" and the GOX of the nMOS transistor 32 is faulty. According to FIG. 24d, the cell is programmed to "1" and the GOX of the pMOS transistor 30 is faulty.

In case of a leakage current path in the GOX of one of the transistors, the floating gate of the associated transistor discharges to the potential applied to the source of the associated transistor. As a rule, for the nMOS transistor 32, this will be 0 V, whereas, for the pMOS transistor, this will be Vsup. In either case, the gate source voltage of the transistor concerned will drop to zero volts so that the respective transistor will be blocking (OFF) relatively strong. In two cases (cases 0 Mn and 1 Mp) an undefined logic state can occur at the output OUT and, therefore, the simple CMOS EEPROM elementary cell is not redundant with respect to this error condition.

To be more specific, with respect to those error mechanisms in which the dielectric of a MOS transistor forms a leakage current path, the simple cMOS EEPROM elementary cell is insensitive only when the transistor having such a faulty GOX has been blocking (OFF) in the correct case already. An undefined or incorrect logic level at the output OUT will defined or incorrect logic level at the output OUT will be obtained if the transistor should be conductive due to the programming of the cell. This will be true for half of all cases if ones and zeros occur with the same probability. For a probability Pm that the dielectric of a MOS transistor forms a leakage current path of Pm=0.001, the probability for a wrong bit at the output OUT will be: Pe2=Pm·0.5= 0.0005=500 ppm. In this case, the error probability is not multiplied by a second error probability which is independent from the other one, so that Pe2 is greater than Pe1 above.

As can be seen from FIGS. 25 and 26, the double CMOS EEPROM elementary cell 700 is tolerant with respect to both leakage current paths through the coupling capacitors and leakage current paths through the GOX of one of the transistors.

Figure 25A:
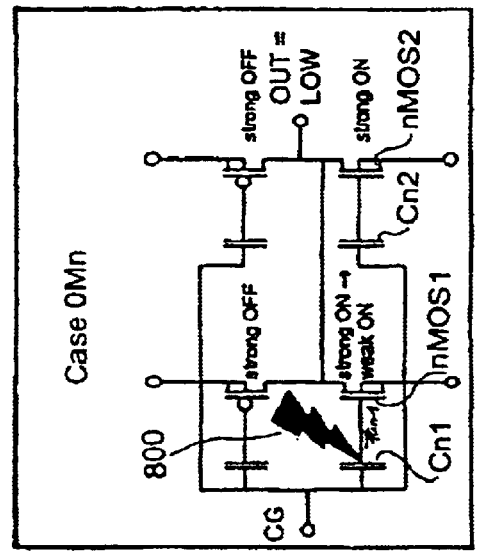

In FIG. 25a, the bit is programmed to "0" and a charge loss at FGn1 takes place through the capacitance Cn1 as indicated by the flash 800. The output OUT does not toggle because nMOS1 does not change from ON to OFF (from conductive to blocking) and parallel nMOS2 stays ON.

Figure 25B:
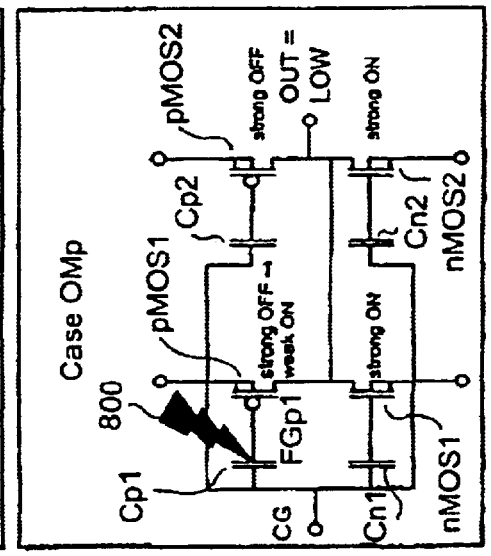

In FIG. 25b, the cell is programmed to "1" and a charge loss takes place from FGp1 through Cp1 as indicated by the flash 800. pMOS1 changes from strong OFF to weak ON. pMOS2 remains strong OFF. Thus, the output OUT does not toggle because nMOS1 and nMOS2 override pMOS1.

Figure 25C:
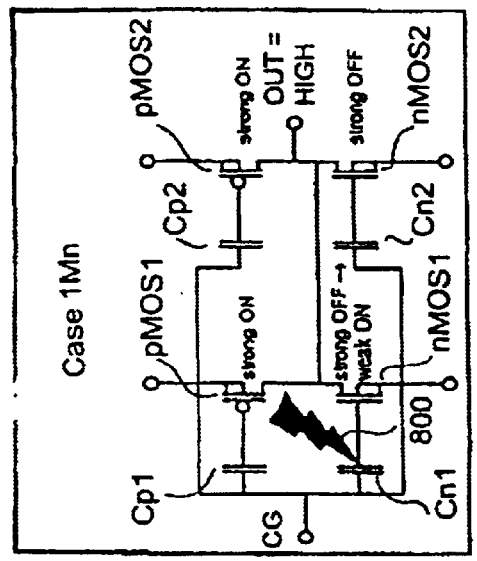

In FIG. 25c, the cell is programmed to "1" and a charge loss takes place from FGn1 through Cn1. nMOS1 changes from strong OFF to weak ON. However, the output OUT does not toggle since pMOS1 and pMOS2 override nMOS1.

Figure 25D:
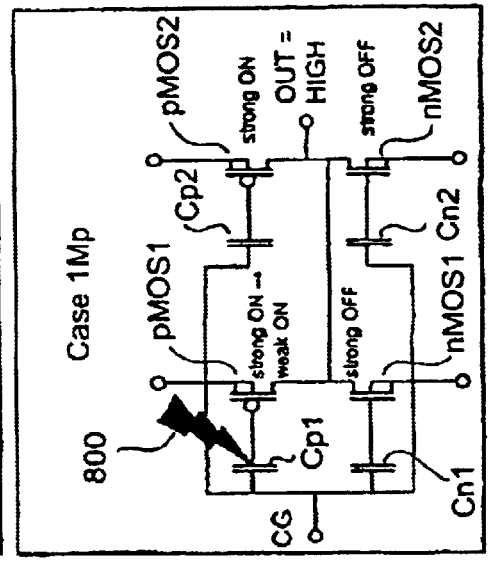

In FIG. 25d, the cell is programmed to "1" and a charge loss takes place from FGp1 through Cp1. This is, again, indicated by a flash 800. pMOS1 does not change from ON to OFF and pMOS2 does not change its conductivity so that the output OUT does not toggle.

Thus, the double CMOS EEPROM elementary cell 700 shows a redundancy of 100% with respect to leakage current paths in the dielectric of the coupling capacitors. Thus, this cell is insensitive with respect to these error mechanisms. A faulty bit can develop by defects in the dielectric of the coupling capacitors only if all four MOS transistors loose their charges and become weak conductive (weak ON). Under the assumption of Pc=0.001, Pe3 will be Pc·Pc·Pc·Pc=$10^{-12}$, which is neglectable.

Making reference to FIGS. 26a to 26d, those error mechanisms will be explained in which a leakage current path is formed in the dielectric of one of the MOS transistors, i.e. in the GOX thereof.

In FIG. 26a, the cell is programmed to "0" and a charge loss takes place at FGn1 through the GOX of nMOS1 as indicated by the flash 810. Although nMOS1 changes from strong ON to strong OFF, the output OUT does not toggle, because nMOS2 overrides pMOS1 and pMOS2.

In FIG. 26b, the cell is programmed to "0" and a charge loss takes place from FGp1 through the GOX of pMOS1. pMOS1 does not change its conductivity so that the output OUT does not toggle.

In FIG. 26c, the cell is programmed to "1" and a charge loss takes place from FGn1 through the GOX of nMOS1. nMOS1 does not change its conductivity so that the output OUT remains stable ON HIGH.

Finally, in FIG. 26d, the cell is programmed to "1" and a charge loss takes place from the floating gate FGp1 through the GOX of pMOS1. pMOS1 changes from strong ON to strong OFF. Nevertheless, the output OUT does not toggle since pMOS2 overrides nMOS1 and nMOS2.

As can be derived from FIGS. 26a to 26d, a faulty bit at the output can occur only in case both transistors which shall be ON (in the correct case) unintentionally change to OFF. In the cases 1 Mn and 0 Mp the conductivity of the originally blocking transistor does not change: it remains blocking. In the other cases (0 Mn and 1 Mp) the defective transistor changes its conductivity due to GOX defects. However, there is a further conductive transistor in parallel to the faulty transistor so that the output is kept at the correct logical level. Only in case this parallel transistor would also have a GOX defect, the logic level at the output would be undefined. Thus, the double EEPROM elementary cell 700 has a double redundancy against GOX defects. Under the assumption of Pm=0.001, it follows: Pe4=Pm·Pm·0.5= 0.0000005=0.5 ppm. The factor 0.5 is the result of the fact that the error takes place in two of four cases only.

It is clear from the above that the double EEPROM elementary cell has a greatly improved tolerance with respect to GOX defects. Moreover, the additional area required is moderate since no additional driving circuitry is required when compared to the simple CMOS EEPROM elementary cell. Moreover, the logic output level HIGH or LOW appears at the output without power dissipation in the static case.

At the end, the following error condition shall be discussed. If the integrated circuit (IC) is without voltage supply for a longer time, in case of GOX defects, the floating gate (FGp1, FGp2) of the pMOS transistors does not discharge towards Vsup, but towards 0 V. If the IC is powered up, FGp1 or FGp2, respectively, is approximately at a potential of CG so that the associated transistor is conductive more or less depending on the magnitude of the voltage at the source of the respective transistor. Thus, a case takes place in which a GOX defect does not result in an OFF state of a transistor, but in an ON state. Has the pMOS transistor been conductive due to the programming ("1") of the cell, this situation does not disturb. However, in case of a programmed "0", in which case the transistor was originally blocking, the bit can be read in a wrong manner if the conductivity of the transistor having the GOX defect is better than that of both nMOS transistors, which were originally conductive. This is true for great supply voltages Vsup. Thus, in preferred embodiments of the present invention, Vsup should be chosen to be as small as possible. When choosing Vsup less than the absolute value of a pMOS threshold voltage, the above problem can be avoided. To be more specific, it can be avoided that a pMOS having a GOX defect becomes ON upon switching on the voltage supply if: Vsup<|Vth,p|+V(CG), wherein V(CG) is the voltage at the control gate in the read mode.

In addition to the strongly improved redundancy, a multiple CMOS EEPROM elementary cell is advantageous due to the reduced area demand. It can be recognized from FIGS. 4 to 9, for example, that respectively three high voltage transistors are necessary in addition to the EEPROM elementary cell. These transistors are necessary in order to apply the high programming and erasing voltages respectively to the EEPROM elementary cell. In the practice, HV pMOS transistors and HV nMOS transistors have approximately the same size and have, additionally, approximately the same size as a simple CMOS EEPROM elementary cell 100 shown in FIG. 4, for example. When defining the area demand for a simple CMOS EEPROM elementary cell as one unit, a CMOS EEPROM cell plus HV transistors requires four units. A double CMOS EEPROM elementary cell (such as cell 700 shown in FIG. 22) requires two units area. A CMOS EEPROM cell plus HV transistors having a double elementary cell, therefore, requires five units area. Thus, that cell requires only 25% more area than the simple cell, but presents a substantially improved reliability. A three-fold cell requires accordingly only 50% more area than the simple cell, but has an extremely small error probability due to its redundancy.

List of Reference Numerals

10 nMOS memory transistor
12 memory cell input
14 memory cell output
16 pMOS transistor
18 nMOS transistor
20 capacitor
30 pMOS transistor
32 nMOS transistor
34 capacitor
36 capacitor
38 memory cell input
40 memory cell output
50 standard nMOS transistor
52 coupling-in capacitor
54 nMOS transistor with floating gate
56 arrow
60 standard pMOS transistor
62 coupling-in capacitor
64 pMOS transistor with floating gate
66 arrow
70 transfer characteristic curve
72 input voltage output voltage-line
74 shifted transfer characteristic curve
80 feedback inverter
82 feedback inverter
80a, 82a pMOS transistors
80b, 82b nMOS transistors
100, 100N CMOS-EEPROM cell
102 nMOS-EEPROM cell
200, 202 control circuit
210 NAND gate
220 inverter
240, 240' CMOS-EEPROM cell with control circuit
250 nMOS-EEPROM cell with control circuit
300 circuit block
302, 304 supply voltage terminals
310 Schmitt trigger
312 Schmitt trigger output
320 control line
322 resistance
324 capacitor
400 EEPROM-BIAS cell
402 capacitor
410, 412 potential at OUT 420, 422 potential at the output 312
430, 432 potential at net1
440, 442 potential at net2
450, 452 Iinv
460, 462 IDD
500 EEPROM memory cell
502 CMOS inverter
502a, 502b MOS transistors
504 memory cell output
506 memory cell input
508, 510 addressing switch
512 reset switch
515, 516 floating gate transistors
518, 520 pMOS floating gate transistors
522, 524 nMOS floating gate transistors
FG floating gate
CG control gate
FG1 floating gate
FG2 floating gate
Qpe pMOS transistor
Qne nMOS transistor
Qp reading transistor
Qp0 second HV-pMOS transistor
Qp1 first HV-pMOS transistor
Qn1 HV-nMOS transistor
Qp2 third HV-pMOS transistor
Qn2 standard nMOS transistor
HI, LO, LR, LN, LP, LW, LI, readQ lines
bit_in data input line
bit_out data output line
Qp3, Qp4, Qp5, Qp6, Qp7 pMOS transistors
Qp4', Qp7' pMOS transistors
Qn3, Qn4, Qn5, Qn7, Qn8 nMOS transistors
Qn4', Qn5', Qn6' nMOS transistors
net1 fist circuit node
net2 second circuit node
Uref1 reference voltage
Uref2 reference voltage
Vsup voltage supply potential
net3' circuit node
IDD cross current
I1, I2, I3, I4, I2', I3', I4', Ib1 currents
Sw switch
Qps0 pMOS transistor
Qpe0 pMOS transistor
Qne0 nMOS transistor
Uinv reading voltage
OUT memory cell output
600, 602 supply lines
604 impedance converter, buffer
606 stacked diodes
608 current source
610 voltage generating circuitry
pb pMOS transistor
pn nMOS transistor
700 double EEPROM elementary cell
pMOS1 first pMOS transistor
pMOS2 second pMOS transistor
nMOS1 first nMOS transistor
nMOS2 second nMOS transistor
FGp1, FGp2, FGn1, FGn2 floating gates
Cp1, Cp2, Cn1, Cn2 coupling capacitances
800, 810 charge losses

What is claimed is:

1. A memory circuit having at least one non-volatile memory cell, the non-volatile memory cell comprising:
an enhancement pMOS transistor having a floating gate;
an enhancement nMOS transistor having a floating gate insulated from the floating gate of the pMOS transistor;
a control input capacitively coupled to the floating gate of the pMOS transistor and to the floating gate of the nMOS transistor,
the pMOS transistor and the nMOS transistor being connected by a connection point and the connection point being connected to an output of the memory cell,
the pMOS transistor being additionally connected to a first terminal of the memory cell and the nMOS transistor being additionally connected to a second terminal of the memory cell, a supply voltage being appliable to the memory cell via the first and second terminals.

2. The memory circuit according to claim 1, wherein the pMOS transistor and the nMOS transistor are formed in CMOS technology, wherein the drains of the pMOS transistor and the nMOS transistor are connected by the connection point, the source of the pMOS transistor is connected to the first terminal and the source of the nMOS transistor is connected to the second terminal.

3. The memory circuit according to claim 1, further comprising control means configured to effect, in a programming mode, a voltage difference of a first polarity between a channel of the pMOS transistor and the floating gate of it and between a channel of the nMOS transistor and the floating gate of it in order to apply charges of a second polarity to the floating gates, and to effect, in an erase mode, a voltage difference of a second polarity between the channel of the pMOS transistor and the floating gate of it and between the channel of the nMOS transistor and the floating gate of it in order to apply charges of the first polarity to the floating gates, and to apply, in a reading mode, a reading voltage Uinv to the control input.

4. The memory circuit according to claim 3, wherein the control means is further configured to detect a current between the first terminal and the second terminal of the memory cell.

5. The memory circuit according to claim 3, comprising a plurality of non-volatile memory cells, the first terminals of which are connected to the supply line and the second terminals of which are connected to a reference potential line, the control means being further configured to detect a current between the supply line and the reference potential line.

6. The memory circuit according to claim 3, wherein the ratios of channel length to channel width of the pMOS transistor and the nMOS transistor are adjusted such that the reading voltage is essentially half as large as a supply voltage between the first and second terminals.

7. The memory circuit according to claim 3, wherein the control means is further configured to apply, in a first test mode, a lower voltage than the reading voltage and, in a second test mode, a higher voltage than the reading voltage to the control input and to judge, based on the signals at the output of the memory cell in the reading mode, in the first test mode and in the second test mode, the charge state of the floating gates.

8. The memory circuit according to claim 7, wherein the reading voltage corresponds to half the supply voltage, wherein the voltage in the first test mode corresponds to 0 V, and wherein the voltage in the second test mode corresponds to the supply voltage.

9. The memory circuit according to claim 3, wherein the control means is configured for a non-pulsed applying of the reading voltage to the control input.

10. The memory circuit according to claim 1, further comprising:

an MOS transistor circuit for applying charges to the floating gates of the non-volatile memory cell, which is connected to the non-volatile memory cell in such a way that the voltage required for applying charges of a first and second polarity to the floating gates does not drop at any of the transistors of the MOS transistor arrangement between source and gate.

11. The memory circuit according to claim 10, wherein the MOS transistor arrangement comprises:
a MOS switching transistor connected between the control input of the memory cell and a reference potential, the gate of which is connected to a data input;
a voltage source for providing the control input with a voltage for applying charges to the floating gates; and
current limiting means for limiting a current through the MOS switching transistor when it is switched through by a data signal applying at the data input.

12. The memory circuit according to claim 11, wherein the current limiting means comprises a current mirror, via which the control input is provided with the voltage for applying charges and which has a current mirror output transistor, the drain of which is connected to the control input.

13. The memory circuit according to claim 10, wherein the MOS transistor arrangement further comprises an MOS output transistor, the gate of which is connected to the output of the memory cell, the source of which can be provided with the same voltage as the first terminal of the memory cell and the drain of which is connected to a reading out circuit.

14. The memory circuit according to claim 13, comprising a first line via which a voltage is appliable to the control input, a second line over which the reference potential is appliable to the drain of the MOS switching transistor, a third line via which a voltage is appliable to the first terminal of the memory cell and the source of the output transistor, a fourth line connected to the second terminal of the memory cell, a fifth line for applying a data signal to the gate of the switching transistor and a sixth line for outputting a data signal.

15. The memory circuit according to claim 14, comprising a plurality of memory cells having associated MOS transistor arrangements connected in parallel in that the first, second, third and fourth lines are connected to the respective terminals of each of the memory cells having an associated MOS transistor arrangement.

16. The memory circuit according to claim 14, further comprising control means for applying a high voltage to the first line and for holding the second, third and fourth lines at a low potential in a write mode in order to apply charges of a first polarity to the floating gates when the data signal switches the MOS switching transistor to a blocked state.

17. The memory circuit according to claim 16, wherein the control means is further configured to apply, in an erase mode, a high voltage to the first, third and fourth lines and to hold the second line at a low potential to apply charges of a second polarity to the floating gates when the data signal switches the MOS switching transistor to a conducting state.

18. The memory circuit according to claim 17, wherein the control means is further configured to apply, in a reading mode, a voltage to the first and/or second line to produce a reading potential at the control input of the memory cell, and which is operable to apply, in the reading mode, a reading voltage difference between the third and fourth lines to read out the memory cell via the reading out circuit.

19. The memory circuit according to claim 18, wherein the control means is configured to execute an erase mode only after a write mode has been executed.

20. The memory circuit according to claim 19, wherein the control means is configured to apply at first, in a write mode, charges of the first polarity to the floating gates of all of a plurality of memory cells and subsequently to selectively apply, in an erase mode, charges of the second polarity to the floating gates of individual ones of the memory cells.

21. The memory circuit according to claim 13, wherein the MOS switching transistor, the output transistor of the current mirror and the output transistor have a gate oxide corresponding, as far as the thickness is concerned, to the gate oxide of standard MOS transistors of the technology used.

22. The memory circuit according to claim 1, further comprising a current watch circuit for monitoring a current between the first and second terminals of the non-volatile memory cell when a supply voltage is applied between the first and second terminals, producing an output signal when the current between the first and second terminals exceeds a predetermined value, wherein a drop of a sufficient supply voltage between the first terminal and the second terminal is maintained.

23. The memory circuit according to claim 22, wherein the current watch circuit comprises:
a circuit node connected to the first or second terminal of the non-volatile memory cell, the node being charged as soon as a current between the first terminal and the second terminal of the non-volatile memory cell exceeds the predetermined value;
means for limiting the potential to which the circuit node is charged; and
means for producing an output signal when the circuit node is charged to the potential.

24. The memory circuit according to claim 23, wherein the circuit node is connected to a current mirror via a first transistor having a first cutoff voltage, the current mirror defining a maximum current which can be drawn via the first transistor from the circuit node, and wherein the circuit node is further connected to a reference potential via a second transistor having a second cutoff voltage, wherein the second cutoff voltage, as far as the absolute value is concerned, is larger than the first cutoff voltage.

25. The memory circuit according to claim 24, wherein the first and second cutoff voltages are effected by at least one of different ratios of channel width to channel length of the first and second transistors and by different control voltages of them.

26. The memory circuit according to claim 24, further comprising means for providing a current to the circuit node, which is, as far as the absolute value is concerned, smaller than or equal to the maximum current (I3) which can be drawn via the first transistor from the circuit node.

27. The memory circuit according to claim 24, wherein the circuit node is connected to the first or the second terminal of a plurality of non-volatile memory cells connected in parallel.

28. The memory circuit according to claim 24, wherein the means for producing an output signal has a transistor switched on by the potential at the circuit node.

29. The memory circuit according to claim 28, wherein a low pass filter is connected between the circuit node and the control input of the transistor switched on by a potential at the circuit node.

30. The memory circuit according to claim 24, wherein the means for producing an output signal produces the output signal based on a current through the second transistor having the second cutoff voltage.

31. The memory circuit according to claim 24, wherein the current watch circuit further comprises switching means for producing a hysteresis causing the output signal produced when the current between the first terminal and the second exceeds the predetermined value only to be switched off when the current between the first terminal and the second terminal falls under a value which is smaller than the predetermined value.

32. The memory circuit according to claim 1, wherein the non-volatile memory cell further comprises:
   a CMOS inverter, the input of which is coupled to the output of the memory cell and the output of which is coupled to the input terminal of the memory cell.

33. The memory circuit according to claim 32, wherein a pMOS transistor and/or an nMOS transistor of the CMOS inverter have a floating gate.

34. The memory circuit according to claim 32, wherein the floating gate of one or several of the transistors is formed by connecting the gate terminal of an MOS transistor to a capacitor.

35. The memory circuit according to claim 32, wherein the input terminal of the memory cell is connected to a first addressing switch, and wherein the output of the memory cell is connected to a second addressing switch.

36. The memory circuit according to claim 32, further comprising a switch-on reset switch by which the input terminal of the memory cell is electrically and conductively connected to the output of it.

37. The memory circuit according to claim 32, having a plurality of non-volatile memory cells arranged in a row or an array.

38. The memory circuit according to claim 1, wherein the enhancement pMOS transistor is a first enhancement pMOS transistor and the enhancement nMOS transistor is a first enhancement nMOS transistor, the non-volatile memory cell further comprising:
   a second enhancement pMOS transistor having a floating gate and being connected in parallel to the first enhancement pMOS transistor; and
   a second enhancement nMOS transistor having a floating gate and being connected in parallel to the first enhancement nMOS transistor.

39. The memory circuit according to claim 38, comprising means for applying a supply voltage Vsup to the first terminal of the memory cell, wherein, in the read mode, the supply voltage Vsup is smaller than the sum of the absolute value of the threshold voltage of the pMOS transistor and the voltage at the control gate.

* * * * *